(12) United States Patent
Saito et al.

(10) Patent No.: US 12,707,959 B2
(45) Date of Patent: Aug. 11, 2026

(54) THREE-DIMENSIONAL MEMORY DEVICE CONTAINING DUMMY VIA CAVITIES AND METHOD FOR MAKING SAME

(71) Applicant: WESTERN DIGITAL TECHNOLOGIES, INC., San Jose, CA (US)

(72) Inventors: Daichi Saito, Yokkaichi (JP); Masaaki Shinohara, Yokkaichi (JP); Ryo Yoshimoto, Yokkaichi (JP); Koichi Ito, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 341 days.

(21) Appl. No.: 18/495,534

(22) Filed: Oct. 26, 2023

(65) Prior Publication Data

US 2025/0140688 A1 May 1, 2025

(51) Int. Cl.
*H10W 20/41* (2026.01)
*G11C 16/04* (2006.01)
(Continued)

(52) U.S. Cl.
CPC ....... *H10W 20/435* (2026.01); *G11C 16/0483* (2013.01); *H10B 41/10* (2023.02);
(Continued)

(58) Field of Classification Search
None
See application file for complete search history.

(56) References Cited

U.S. PATENT DOCUMENTS 9,601,502 B2 3/2017 Sano et al.
9,960,181 B1 * 5/2018 Cui ........................ H10B 43/27
(Continued)

FOREIGN PATENT DOCUMENTS

WO WO2018038785 A1 3/2018
WO WO2018194751 A1 10/2018

OTHER PUBLICATIONS

ISR-WO—Notification of Transmittal of the International Search Report and Written Opinion of the International Searching Authority for International Patent Application No. PCT/US2024/034633, mailed Oct. 10, 2024,8 pages.
(Continued)

*Primary Examiner* — Khaja Ahmad
(74) *Attorney, Agent, or Firm* — THE MARBURY LAW GROUP PLLC

(57) ABSTRACT

A semiconductor structure includes a first-tier alternating stack of first-tier insulating layers and first-tier electrically conductive layers, a second-tier alternating stack of second-tier insulating layers and second-tier electrically conductive layers that overlies the first-tier alternating stack, a memory opening vertically extending through the first-tier alternating stack and the second-tier alternating stack, a memory opening fill structure located in the memory opening and including a memory film and a vertical semiconductor channel, a first contact via structure contacting one of the first-tier electrically conductive layers, a first-tier tubular dielectric spacer including a first inner sidewall contacting the first contact via structure and contacting each first-tier electrically conductive layer that overlies said one of the first-tier electrically conductive layers, and a first-tier pillar structure vertically extending through each first-tier electrically conductive layer and having a top surface that is coplanar with a topmost surface of the first-tier alternating stack.

14 Claims, 48 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10W 20/42*** | (2026.01) |

(52) U.S. Cl.

CPC ............. *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10W 20/42* (2026.01)

(56) References Cited

U.S. PATENT DOCUMENTS

| | | | | |
|---|---|---|---|---|
| 11,450,679 | B2 | 9/2022 | Tanaka et al. | |
| 11,488,975 | B2 | 11/2022 | Totoki et al. | |
| 11,495,612 | B2 | 11/2022 | Tanaka et al. | |
| 2017/0263642 | A1* | 9/2017 | Nishikawa ............ | H10B 43/27 |
| 2017/0352678 | A1* | 12/2017 | Lu ......................... | H10B 43/10 |
| 2021/0343741 | A1 | 11/2021 | Lee | |
| 2022/0005818 | A1 | 1/2022 | Tanaka et al. | |
| 2022/0005824 | A1 | 1/2022 | Tanaka et al. | |
| 2022/0130852 | A1 | 4/2022 | Totoki et al. | |
| 2022/0139837 | A1 | 5/2022 | Sun et al. | |
| 2022/0189872 | A1 | 6/2022 | Sano et al. | |
| 2022/0302146 | A1 | 9/2022 | Shimomura et al. | |
| 2022/0302153 | A1 | 9/2022 | Tanaka et al. | |
| 2022/0328413 | A1 | 10/2022 | Kubo et al. | |
| 2022/0406379 | A1 | 12/2022 | Takeguchi et al. | |
| 2022/0406793 | A1 | 12/2022 | Takeguchi et al. | |
| 2023/0038557 | A1 | 2/2023 | Ogawa et al. | |
| 2023/0041950 | A1 | 2/2023 | Chibvongodze et al. | |
| 2023/0044232 | A1 | 2/2023 | Kai et al. | |
| 2023/0045001 | A1 | 2/2023 | Ogawa et al. | |
| 2023/0223356 | A1* | 7/2023 | Sakiyama .......... | H10W 42/121 |

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 17/663,951, filed May 18, 2022, SanDisk Technologies LLC.

U.S. Appl. No. 17/804,184, filed May 26, 2022, SanDisk Technologies LLC.

U.S. Appl. No. 17/936,012, filed Sep. 28, 2022, SanDisk Technologies LLC.

U.S. Appl. No. 18/062,807, filed Dec. 7, 2022, SanDisk Technologies LLC.

U.S. Appl. No. 18/221,689, filed Jul. 13, 2023, SanDisk Technologies LLC.

U.S. Appl. No. 18/221,711, filed Jul. 13, 2023, SanDisk Technologies LLC.

U.S. Appl. No. 18/233,697, filed Aug. 14, 2023, Western Digital Technologies, Inc.

U.S. Appl. No. 18/233,759, filed Aug. 14, 2023, SanDisk Technologies LLC.

U.S. Appl. No. 18/349,578, filed Jul. 10, 2023, SanDisk Technologies LLC.

U.S. Appl. No. 18/352,726, filed Jul. 14, 2023, SanDisk Technologies LLC.

U.S. Appl. No. 18/352,752, filed Jul. 14, 2023, SanDisk Technologies LLC.

U.S. Appl. No. 18/353,577, filed Jul. 17, 2023, SanDisk Technologies LLC.

U.S. Appl. No. 18/354,246, filed Jul. 18, 2023, SanDisk Technologies LLC.

U.S. Appl. No. 18/354,269, filed Jul. 18, 2023, SanDisk Technologies LLC.

U.S. Appl. No. 18/354,283, filed Jul. 18, 2023, SanDisk Technologies LLC.

U.S. Appl. No. 18/354,325, filed Jul. 18, 2023, SanDisk Technologies LLC.

U.S. Appl. No. 18/356,825, filed Jul. 21, 2023, SanDisk Technologies LLC.

U.S. Appl. No. 18/357,676, filed Jul. 24, 2023, SanDisk Technologies LLC.

U.S. Appl. No. 18/358,702, filed Jul. 25, 2023, SanDisk Technologies LLC.

U.S. Appl. No. 18/358,727, filed Jul. 25, 2023, SanDisk Technologies LLC.

U.S. Appl. No. 18/360,461, filed Jul. 27, 2023, SanDisk Technologies LLC.

U.S. Appl. No. 18/457,883, filed Aug. 29, 2023, Western Digital Technologies, Inc.

U.S. Appl. No. 18/493,020, filed Oct. 24, 2023, SanDisk Technologies LLC.

IPRP-WO—Notification Concerning Transmittal of Copy of International Preliminary Report on Patentability and Written Opinion of the International Searching Authority for International Patent Application No. PCT/US2024/034633, mailed May 7, 2026, 5 pages.

* cited by examiner hd2
hd1
A'
A
58
58
833C(833)
823C(823)
833B(833)
823B(823)
833A(833)
823A(823)
332
20
20

A'
hd2
hd1
58
74
76
823/833
80
20
A

THREE-DIMENSIONAL MEMORY DEVICE CONTAINING DUMMY VIA CAVITIES AND METHOD FOR MAKING SAME

FIELD

The present disclosure relates generally to the field of semiconductor devices, and particularly to a three-dimensional memory device including dummy via cavities and methods for manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: a first-tier alternating stack of first-tier insulating layers and first-tier electrically conductive layers; a second-tier alternating stack of second-tier insulating layers and second-tier electrically conductive layers that overlies the first-tier alternating stack; a memory opening vertically extending through the first-tier alternating stack and the second-tier alternating stack; a memory opening fill structure located in the memory opening and comprising a memory film and a vertical semiconductor channel; a first contact via structure contacting one of the first-tier electrically conductive layers; a first-tier tubular dielectric spacer comprising a first inner sidewall contacting a first cylindrical surface segment of the first contact via structure and comprising a first outer sidewall contacting each first-tier electrically conductive layer that overlies said one of the first-tier electrically conductive layers; a second-tier tubular dielectric spacer comprising a second inner sidewall contacting a second cylindrical surface segment of the first contact via structure and comprising a second outer sidewall contacting each of the second-tier electrically conductive layers; a first-tier pillar structure vertically extending through each first-tier electrically conductive layer in the first-tier alternating stack and having a top surface that is coplanar with a topmost surface of the first-tier alternating stack; and an additional first-tier tubular dielectric spacer that laterally surrounds the first-tier pillar structure and having a same material composition and a same lateral thickness as the first-tier tubular dielectric spacer.

According to another aspect of the present disclosure, a method of forming a semiconductor structure is provided. The method comprises: forming a first-tier alternating stack of first-tier insulating layers and first-tier sacrificial material layers over a substrate; forming a first-tier sacrificial memory opening fill structure extending through the first-tier alternating stack; forming first-tier pillar structures in the first-tier alternating stack, wherein the first-tier pillar structures comprise a first-type first-tier pillar structure that does not extend through a bottommost first-tier sacrificial material layer within the first-tier alternating stack, and a second-type first-tier pillar structure that extends through each first-tier sacrificial material layer within the first-tier alternating stack; forming a second-tier alternating stack of second-tier insulating layers and second-tier sacrificial material layers over the first-tier alternating stack; forming a second-tier sacrificial memory opening fill structure extending through the second-tier alternating stack; forming second-tier pillar structures in the second-tier alternating stack, wherein the second-tier pillar structures comprise a first-type second-tier pillar structure that is formed on a top surface of the first-type first-tier pillar structure, and a second-type second-tier pillar structure that does not extend through a bottommost second-tier sacrificial material layer within the second-tier alternating stack; replacing the second-tier sacrificial memory opening fill structure and the second-tier sacrificial memory opening fill structure with a memory opening fill structure that includes a vertical semiconductor channel and a memory film; replacing the first-tier sacrificial material layers and the second-tier sacrificial material layers with first-tier electrically conductive layers and second-tier electrically conductive layers, respectively; replacing the first-type second-tier pillar structure and the first-type first-tier pillar structure with a first contact via structure that contacts a top surface of one of the first-tier electrically conductive layers; and replacing the second-type second-tier pillar structure with a second contact via structure.

DETAILED DESCRIPTION

Figure 1:
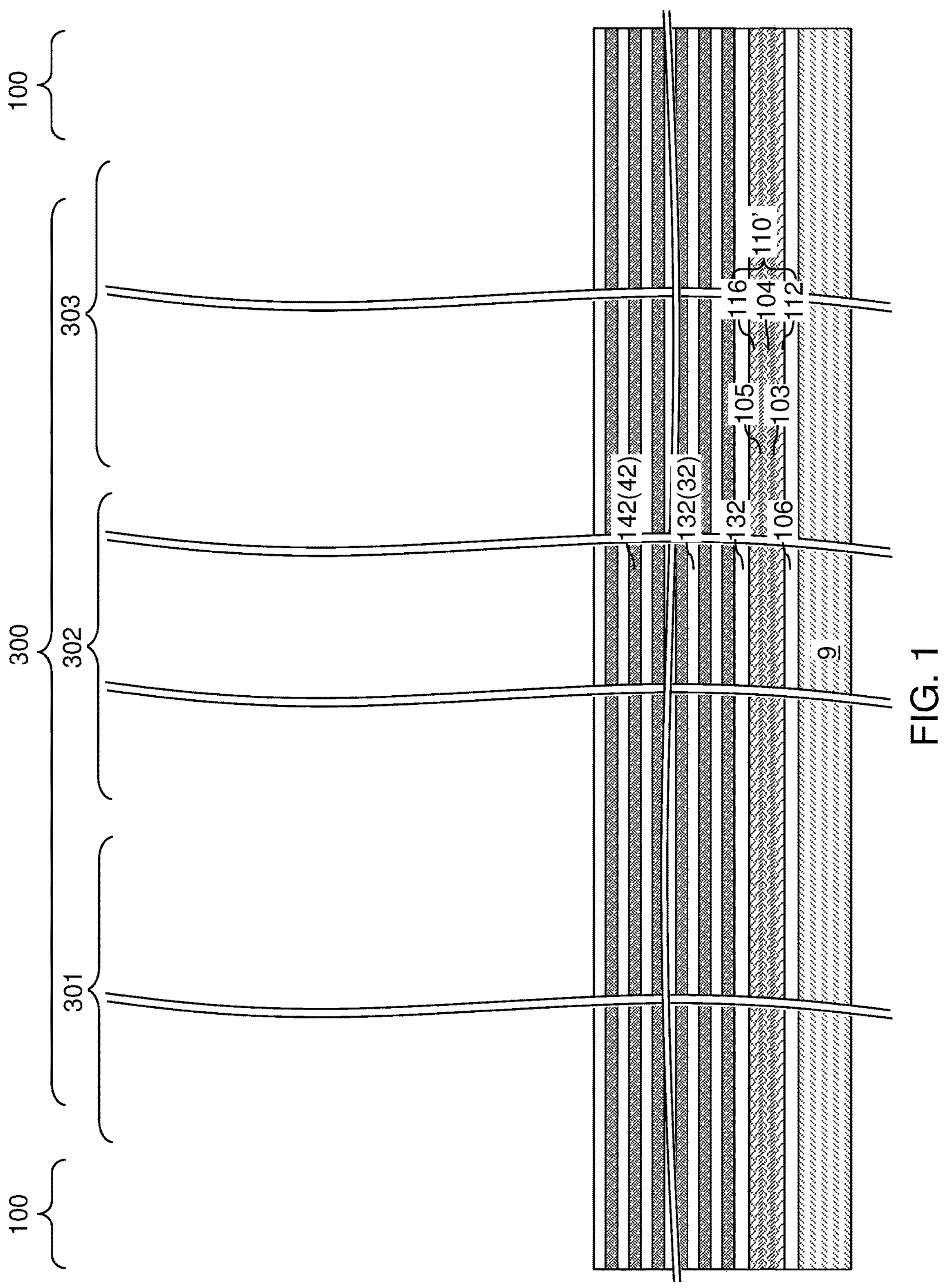
FIG. 1 is a schematic vertical cross-sectional view of an exemplary structure for forming a memory die after formation of a stopper-tier insulating layer, in-process source-level material layers, and a first-tier alternating stack of first-tier insulating layers and first-tier sacrificial material layers over a carrier substrate according to an embodiment of the present disclosure.

Embodiments of the present disclosure are directed to a three-dimensional memory device including dummy via cavities for providing uniform etch pattern factor during manufacture, and methods for manufacturing the same, of which various aspects are now described in detail. Embodiments of the disclosure can be employed to form semiconductor devices, such as three-dimensional memory devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated. The exemplary structure comprises a carrier substrate 9, which may be a semiconductor substrate. For example, the carrier substrate 9 may comprise a commercially available silicon wafer. Alternatively, the carrier substrate 9 may comprise any material that may be removed selective the materials of overlying materials which are subsequently formed. Alternatively, the substrate 9 may comprise a silicon wafer which is retained in the final memory device. In this case, peripheral circuits (e.g., driver circuits) may be formed on the surface of the substrate 9, and bonding of a separate logic die containing a peripheral circuit described below with respect to FIG. 31 may be omitted.

An optional insulating material layer can be formed on a top surface of the carrier substrate 9 or over the peripheral circuits (if present). The insulating material layer can be subsequently employed as a stopping material layer for an optional process that removes the carrier substrate 9, and is herein referred to as a stopper-tier insulating layer 106. In one embodiment, the stopper-tier insulating layer 106 comprises a dielectric material such as undoped silicate glass (i.e., silicon oxide), a doped silicate glass, or silicon nitride. The thickness of the stopper-tier insulating layer 106 may be in a range from 50 nm to 600 nm, such as from 100 nm to 300 nm, although lesser and greater thicknesses may also be employed.

Optional in-process source-level material layers 110' can be formed over the stopper-tier insulating layer 106. The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner 103, a source-level sacrificial layer 104, an optional upper sacrificial liner 105, and an upper source-level semiconductor layer 116. Alternatively, the source-level material layers 110' may be omitted, and a top source contact layer may be formed after removal of the carrier substrate 9 shown in FIG. 32. Alternatively, if the substrate 9 comprises a silicon wafer, then a source region may be formed in the substrate 9 if the source-level material layers 110' are omitted.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 (or selective to the lower source-level semiconductor layer 112) and the upper sacrificial liner 105 (or selective to the upper source-level semiconductor layer 116). In one embodiment, the source-level sacrificial layer 104 may include a semiconductor material such as undoped amorphous silicon or silicon-germanium with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 (if present) and the upper sacrificial liner 105 (if present) include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

A first-tier alternating stack of first-tier insulating layers 132 and first spacer material layers can be formed over the in-process source-level material layer 110'. In one embodiment, the first spacer material layers may comprise first-tier sacrificial material layers 142. In this case, a first-tier alternating stack (132, 142) of first-tier insulating layers 132 and first-tier sacrificial material layers 142 can be formed over the in-process source-level material layer 110'. The first-tier insulating layers 132 are a first subset of insulating layers 32, and the first-tier sacrificial material layers 142 are a first subset of sacrificial material layers 42. The first-tier insulating layers 132 comprise an insulating material, such as undoped silicate glass (i.e., silicon oxide) or a doped silicate glass, and the first-tier sacrificial material layers 142 comprise a sacrificial material, such as silicon nitride or silicon-germanium. In one embodiment, the first-tier insulating layers 132 may comprise silicon oxide layers, and the first-tier sacrificial material layers 142 may comprise silicon nitride layers. The first-tier alternating stack (132, 142) may comprise multiple repetitions of a unit layer stack including a first-tier insulating layer 132 and a first-tier sacrificial material layer 142. The total number of repetitions of the unit layer stack within the first-tier alternating stack (132, 142) may be, for example, in a range from 8 to 1,024, such as from 32 to 256, although lesser and greater number of repetitions may also be employed.

Each of the first-tier insulating layers 132 may have a thickness in a range from 20 nm to 100 nm, such as from 30 nm to 60 nm, although lesser and greater thicknesses may also be employed. Each of the first-tier sacrificial material layers 142 may have a thickness in a range from 20 nm to 100 nm, such as from 30 nm to 60 nm, although lesser and greater thicknesses may also be employed.

The exemplary structure comprises at least one memory array region 100 and at least one contact region area 300. While two memory array regions 100 are shown, it should be understood that there may be only one memory array region 100 per memory plane located between two contact region areas 300. Alternatively, there may be more than two memory array regions 100 per memory plane. A memory array region 100 is a region in which three-dimensional arrays of memory elements are to be subsequently formed. A contact region area 300 is a region in which layer contact via structures contacting word lines and select gate electrodes are to be subsequently formed. According to an aspect of the present disclosure, the three-dimensional memory arrays are formed employing a multi-tier structure that includes multiple tier structures that are vertically stacked. The multiple tier structures may comprise at least a first-tier structure and a second-tier structure, and may optionally include a third-tier structure and additional upper-tier structures. The contact region area 300 may comprise two or more contact regions, such as a first contact region 301 in which first contact via structures providing electrical connections to first-tier electrically conductive layers in the first-tier structure, second contact region 302 in which second contact via structures providing electrical connections to second-tier electrically conductive layers in the second-tier structure, and third contact region 303 in which third contact via structures providing electrical connections to third-tier electrically conductive layers in the third-tier structure, etc. While three contact regions (301, 302, 303) are illustrated in the contact region area 300, there may be two or four or more contact regions in each contact region area 300.

While an embodiment is described in which the first spacer material layers are formed as first-tier sacrificial material layers 142, the first spacer material layers may be formed as first-tier electrically conductive layers in an alternative embodiment. Generally, the spacer material layers formed in any alternating stack of insulating layers and spacer material layers of the present disclosure may be formed as or may be subsequently replaced at least partly with electrically conductive layers.

Figure 2A:
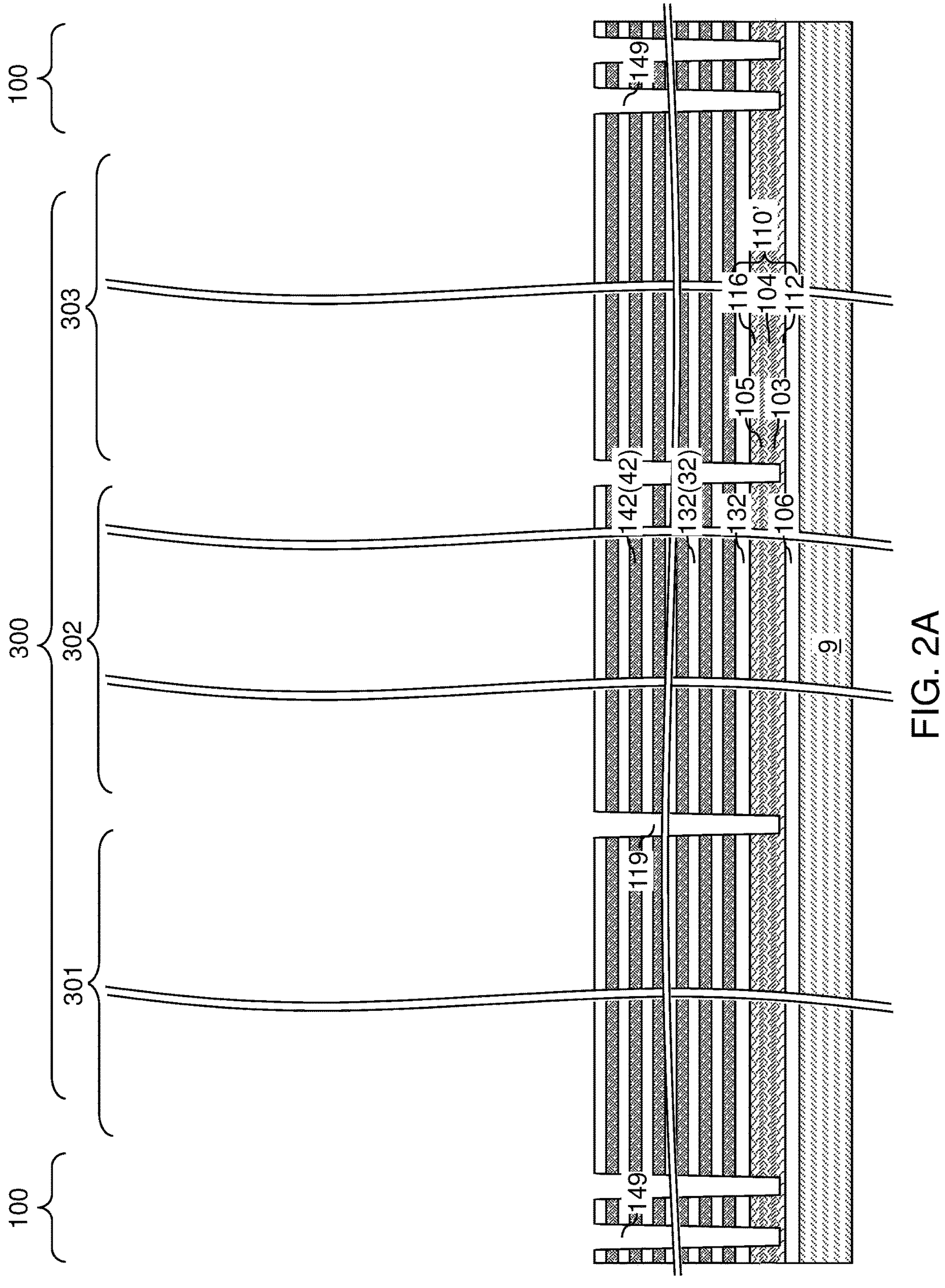
FIG. 2A is a schematic vertical cross-sectional view of the exemplary structure after formation of first-tier memory openings and first-tier support openings according to an embodiment of the present disclosure.
Figure 2B:
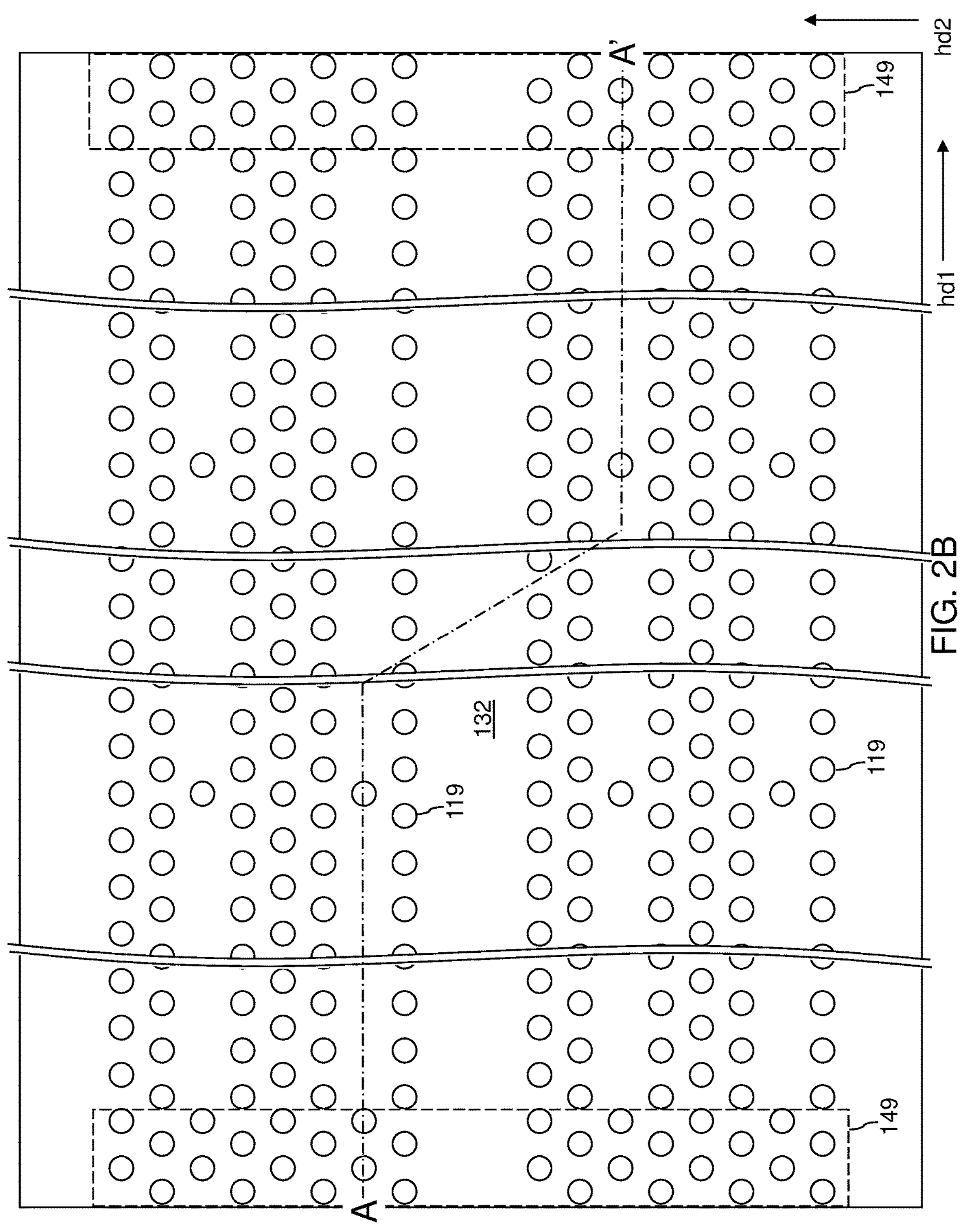
FIG. 2B is a top-down view of the exemplary structure of FIG. 2A. The vertical plane A-A' is the cut plane of the vertical cross-sectional view of FIG. 2A.

Referring to FIGS. 2A and 2B, a first etch mask layer (not shown) can be formed over the first-tier alternating stack (132, 142), and can be lithographically patterned to form various openings therein. A first anisotropic etch process can be performed to transfer the pattern of the openings in the first etch mask layer through the first-tier alternating stack (132, 142). Various openings can be formed through the first-tier alternating stack (132, 142). The various openings may comprise first-tier memory openings 149 that are formed in the memory array regions 100 and first-tier support openings 119 that are formed in the contact region area 300. Each of the first-tier memory openings 149 and the first-tier support openings 119 can vertically extend through the first-tier alternating stack (132, 142) and into the in-process source-level material layers 110'. In one embodiment, bottom surfaces of the first-tier memory openings 149 and the first-tier support openings 119 may be formed within the lower source-level semiconductor layer 112 or at an interface between the lower source-level semiconductor layer and the stopper-tier insulating layer 106.

The first-tier memory openings 149 may have a maximum diameter in a range from 50 nm to 400 nm, such as from 70 nm to 300 nm, although lesser and greater maximum diameters may be employed. The first-tier support openings 119 may have a maximum diameter in a range from 50 nm to 400 nm, such as from 70 nm to 300 nm, although lesser and greater maximum diameters may be employed. Each of the first-tier memory openings 149 and the first-tier support openings 119 may have a tapered sidewall having a taper angle in a range from 0.01 degree to 3 degrees, such as from 0.1 degree to 1.5 degrees, although lesser and greater taper angles may also be employed. Thus, each of the first-tier memory openings 149 and the first-tier support openings 119 may have a greater lateral extent (such as a diameter) at a top portion than at a bottom portion. Each of the first-tier memory openings 149 and the first-tier support openings 119 may have a vertical cross-sectional profile including a first tapered surface that extends through the first-tier alternating stack (132, 142).

In one embodiment, the at least one memory array region 100 may be laterally spaced apart from the contact region area 300 along a first horizontal direction hd1. The first-tier memory openings 149 may comprise rows of first-tier memory openings 149 that are arranged along the first horizontal direction hd1 and laterally spaced apart along a second horizontal direction hd2 that is perpendicular to the first horizontal direction hd2. Multiple clusters of first-tier memory openings 149, each containing a respective two-dimensional periodic array of first-tier memory openings 149, may be formed in the memory array regions 100. The clusters of first-tier memory openings 149 may be laterally spaced apart along the second horizontal direction hd2.

Figure 3A:
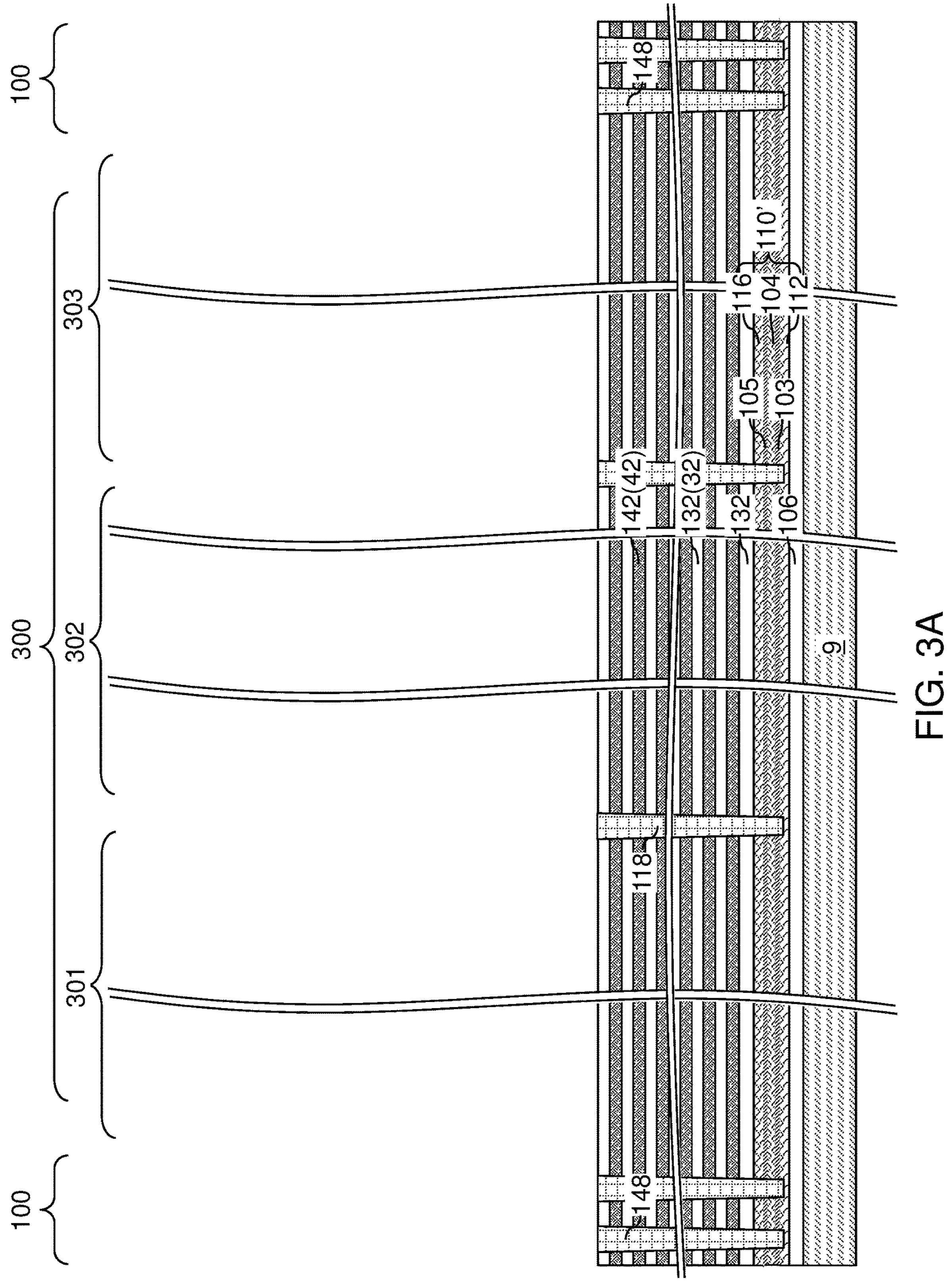
FIG. 3A is a schematic vertical cross-sectional view of the exemplary structure after formation of first-tier sacrificial opening fill structures according to an embodiment of the present disclosure.
Figure 3B:
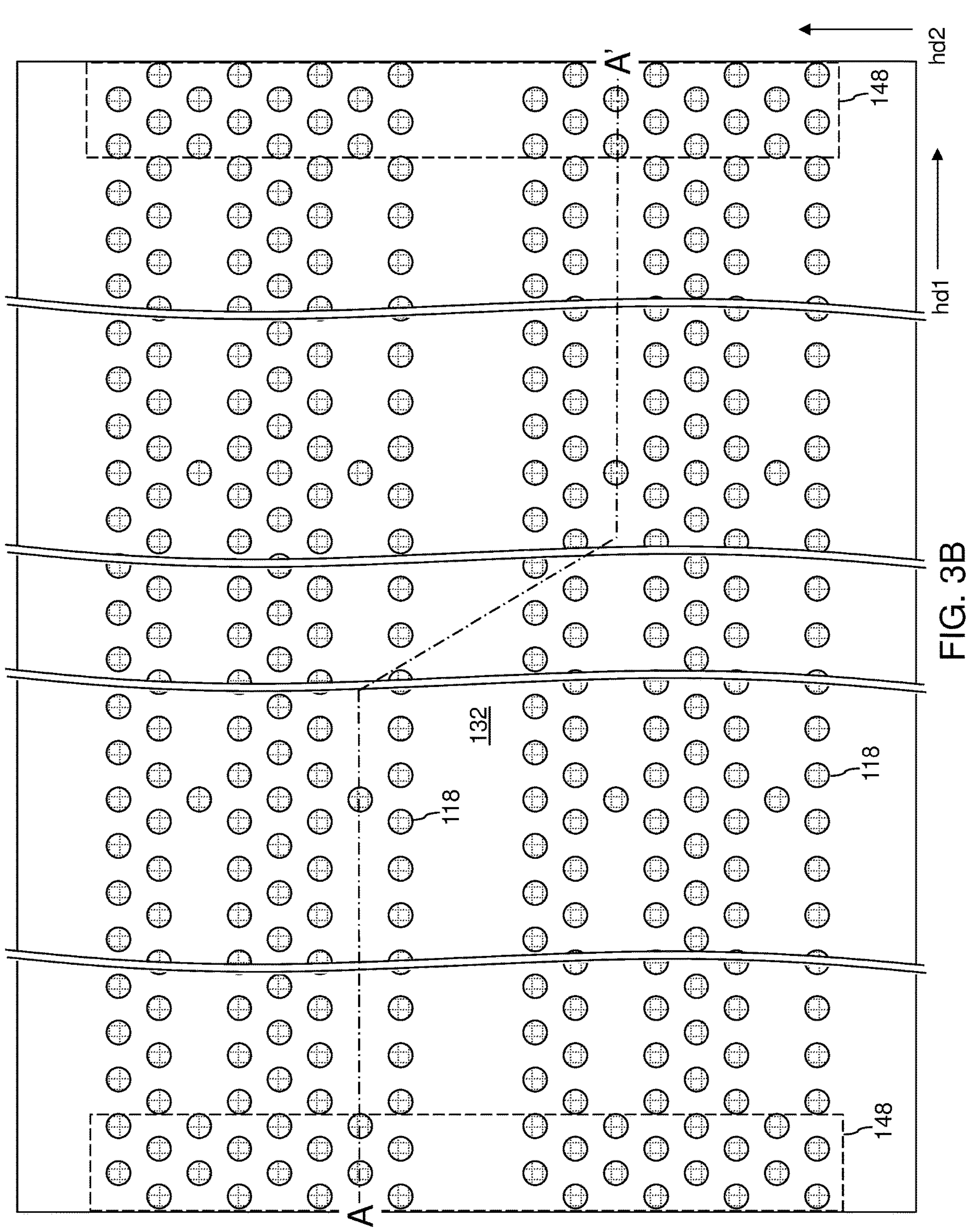
FIG. 3B is a top-down view of the exemplary structure of FIG. 3A. The vertical plane A-A' is the cut plane of the vertical cross-sectional view of FIG. 3A.

Referring to FIGS. 3A and 3B, a first sacrificial fill material can be deposited in the first-tier memory openings 149 and the first-tier support openings 119. The first sacrificial fill material may comprise a semiconductor material (such as amorphous silicon, polysilicon, silicon-germanium, etc.), a carbon-based material including carbon atoms at an atomic percentage greater than 80% (such as amorphous carbon or diamond-like carbon), or a polymer material.

A planarization process can be performed to remove portions of the first sacrificial fill material from above the horizontal plane including the top surface of the first-tier alternating stack (132, 142). The planarization process can be stopped such that each remaining portion of the first sacrificial fill material has a top surface at or about a horizontal plane including the top surface of the first-tier alternating stack (132, 142). The planarization process may comprise a recess etch process and/or a chemical mechanical polishing process. Remaining portions of the first sacrificial fill material that fill the first-tier memory openings 149 and the first-tier support openings 119 constitute first-tier sacrificial opening fill structures (148, 118). The first-tier sacrificial opening fill structures (148, 118) comprise first-tier sacrificial memory opening fill structures 148 that are formed in the first-tier memory openings 149, and first-tier sacrificial support opening fill structures 118 that are formed in the first-tier support openings 119.

Figure 4A:
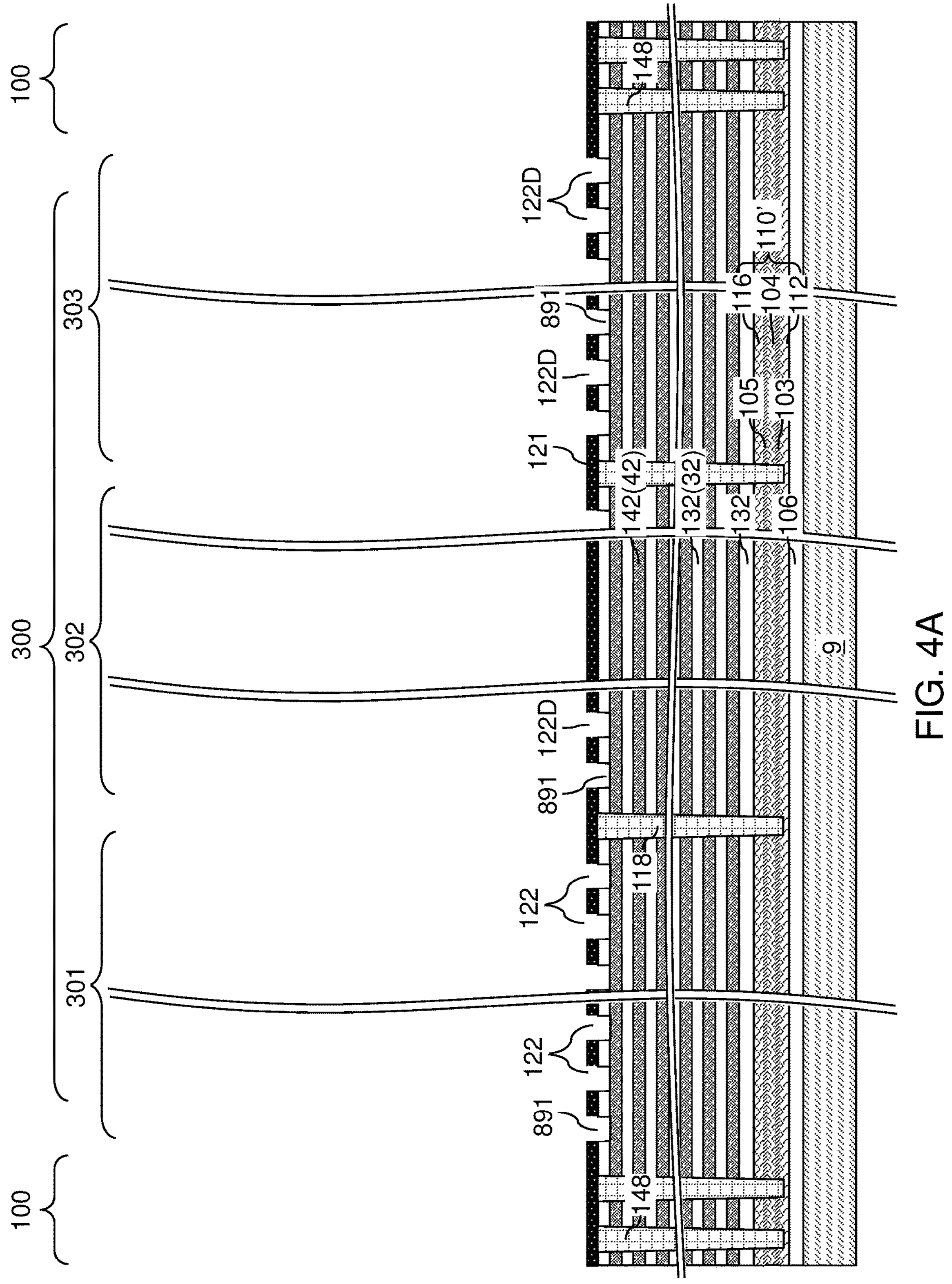
FIG. 4A is a schematic vertical cross-sectional view of the exemplary structure after formation of a patterned hard mask layer and after performing an initial anisotropic etch process according to an embodiment of the present disclosure.
Figure 4B:
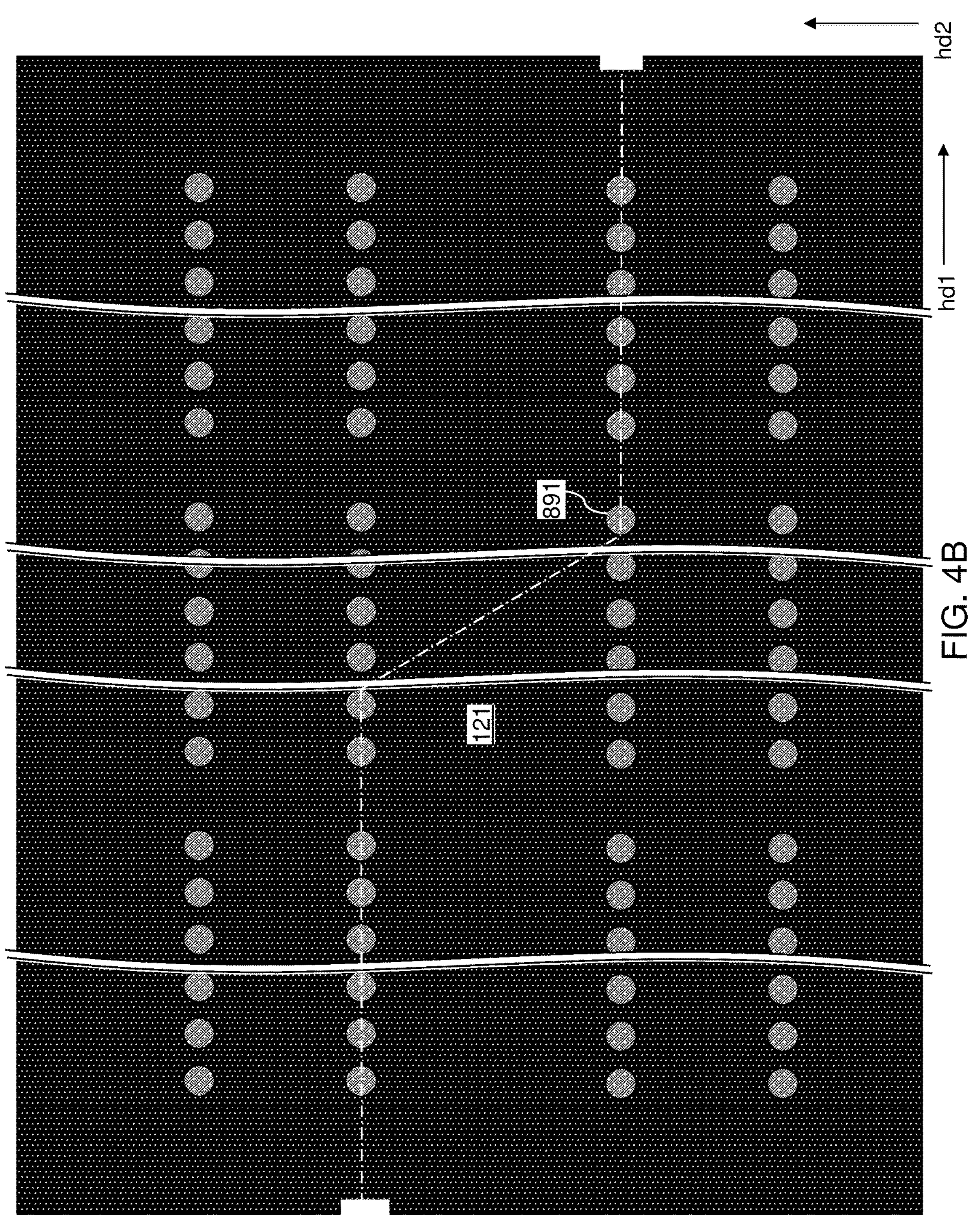
FIG. 4B is a top-down view of the exemplary structure of FIG. 4A. The vertical plane A-A' is the cut plane of the vertical cross-sectional view of FIG. 4A.

Referring to FIGS. 4A and 4B, a patterned hard mask layer 121 may be formed over the first-tier alternating stack (132, 142). The patterned hard mask layer 121 may comprise any etch mask material that can withstand ashing processes that are subsequently employed to remove patterned photoresist material layers. The patterned hard mask layer 121 may comprise a dielectric metal oxide material, a metallic material (such as a metallic nitride material), or a semiconductor material (such as amorphous silicon in case the first-tier sacrificial opening fill structures (148, 118) comprise a carbon-based material or a polymer material). The patterned hard mask layer 121 may be formed by depositing a blanket (unpatterned) hard mask material layer, by forming a photoresist material layer (not illustrated) over the blanket hard mask material layer, by lithographically patterning the photoresist material layer to form openings in areas in which via cavities are to be subsequently formed, and by transferring the pattern in the patterned photoresist layer through the blanket hard mask material layer by performing an anisotropic etch process. An array of openings (122, 122D) is formed through the patterned hard mask layer 121. The photoresist material can be subsequently removed.

The openings (122, 122D) in the patterned hard mask layer 121 can be formed with the same or similar pattern factor across each of the contact regions (301, 302, 303). As used herein, a "pattern factor" refers to the ratio of an area to be etched (such as the area of the openings through the patterned hard mask layer 121) to the total area (which includes the areas of the openings and the areas of the patterned hard mask layer 121) as calculated locally. As used herein, "calculated locally" refers to an area having a radius of about 10 times the lateral dimension of relevant geometrical features (such as the diameter of each opening in the patterned hard mask layer 121). In one embodiment, first contact via structures contacting first electrically conductive layers may be subsequently formed only in the first contact region 301. Therefore, openings 122 are formed in the patterned hard mask layer 121 in locations where first contact via structures will be subsequently formed. However, additional dummy openings 122D are formed in the patterned hard mask layer 121 in the second contact region 302 and in the third contact region 303. In one embodiment, the dummy openings 122D have patterns of second contact via structures to be employed to contact second electrically conductive layers in a second-tier structure and patterns of third contact via structures to be employed to contact third electrically conductive layers in a third-tier structure. Generally, the number of electrically conductive layers to be formed per tier-structure may be about the same, and each area of a contact region (301, 302, 303) may be about the same. In this case, the pattern factor for the openings (122, 122D) in the patterned hard mask layer 121 may be about the same across all contact regions (301, 302, 303).

An anisotropic etch process (which is also referred to as an initial anisotropic etch process) can be performed to etch through the topmost first-tier insulating layer 132 underneath the openings (122, 122D) in the patterned hard mask layer 121. First-tier via cavities 891 and first tier dummy cavities 891D can be formed through the topmost first-tier insulating layer 132.

Figure 5:
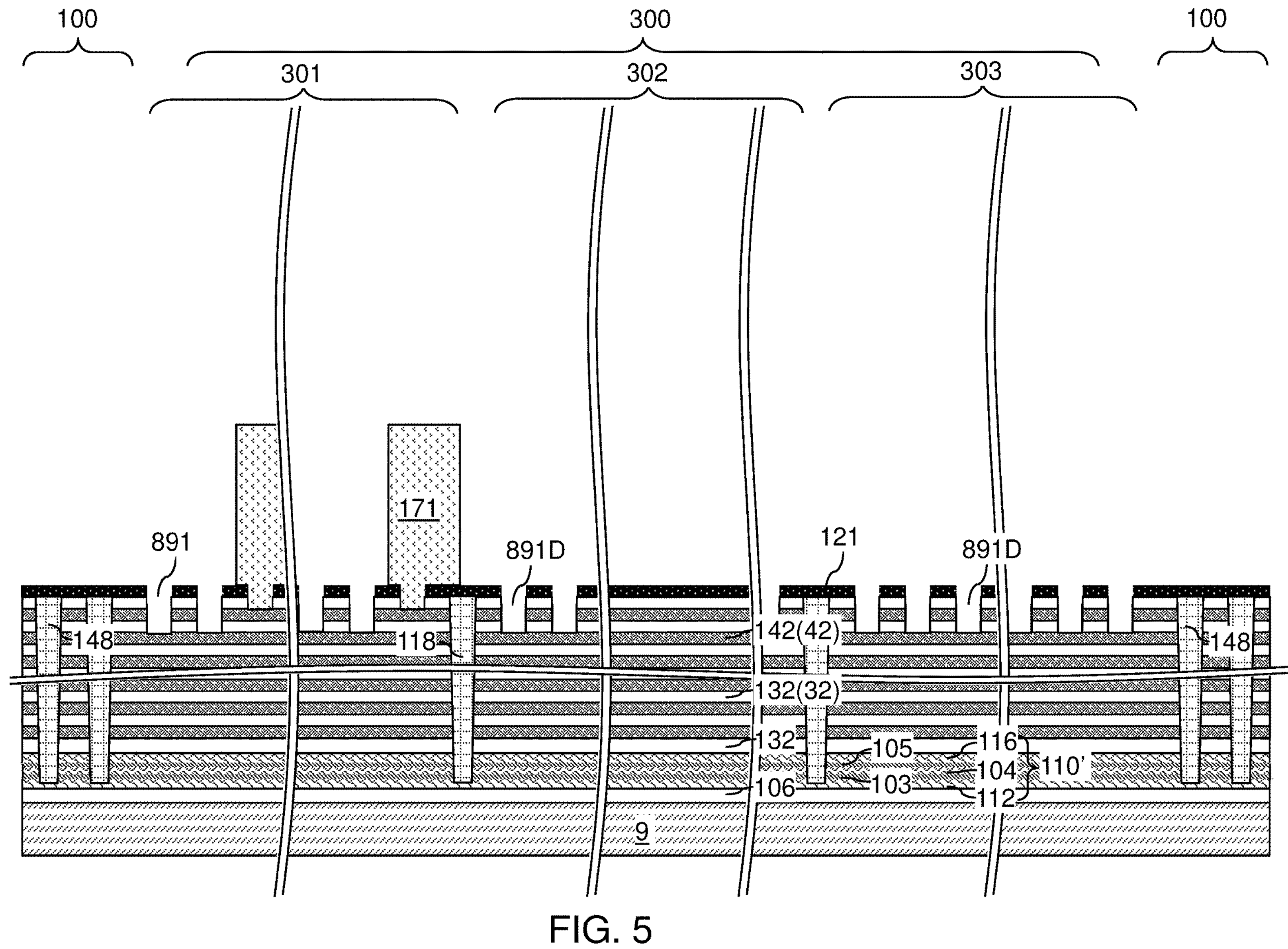
FIG. 5 is a schematic vertical cross-sectional view of the exemplary structure after application and patterning of a first photoresist layer and performing a first anisotropic etch process according to an embodiment of the present disclosure.
Figure 6:
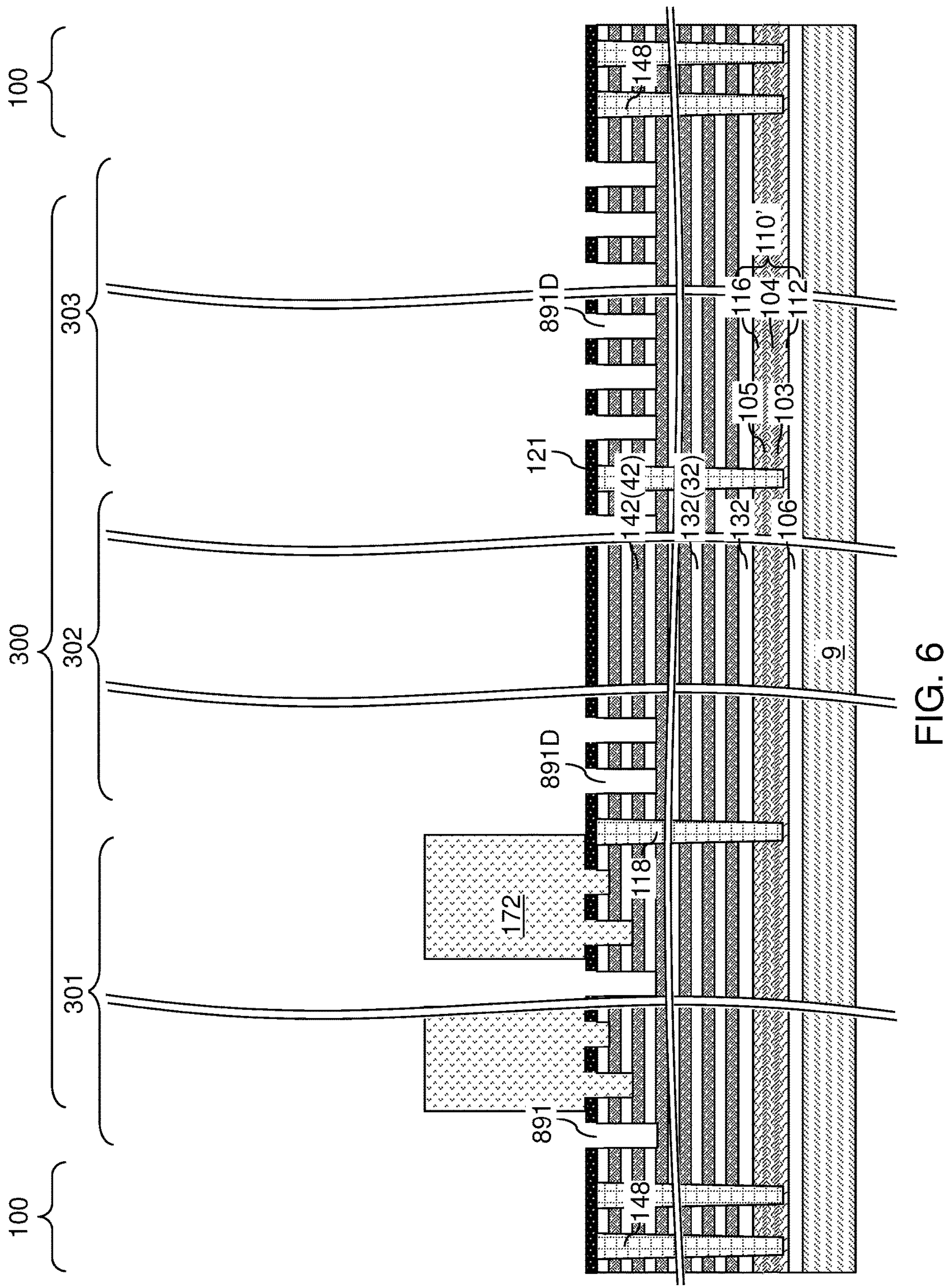
FIG. 6 is a schematic vertical cross-sectional view of the exemplary structure after application and patterning of a second photoresist layer and performing a second anisotropic etch process according to an embodiment of the present disclosure.
Figure 7:
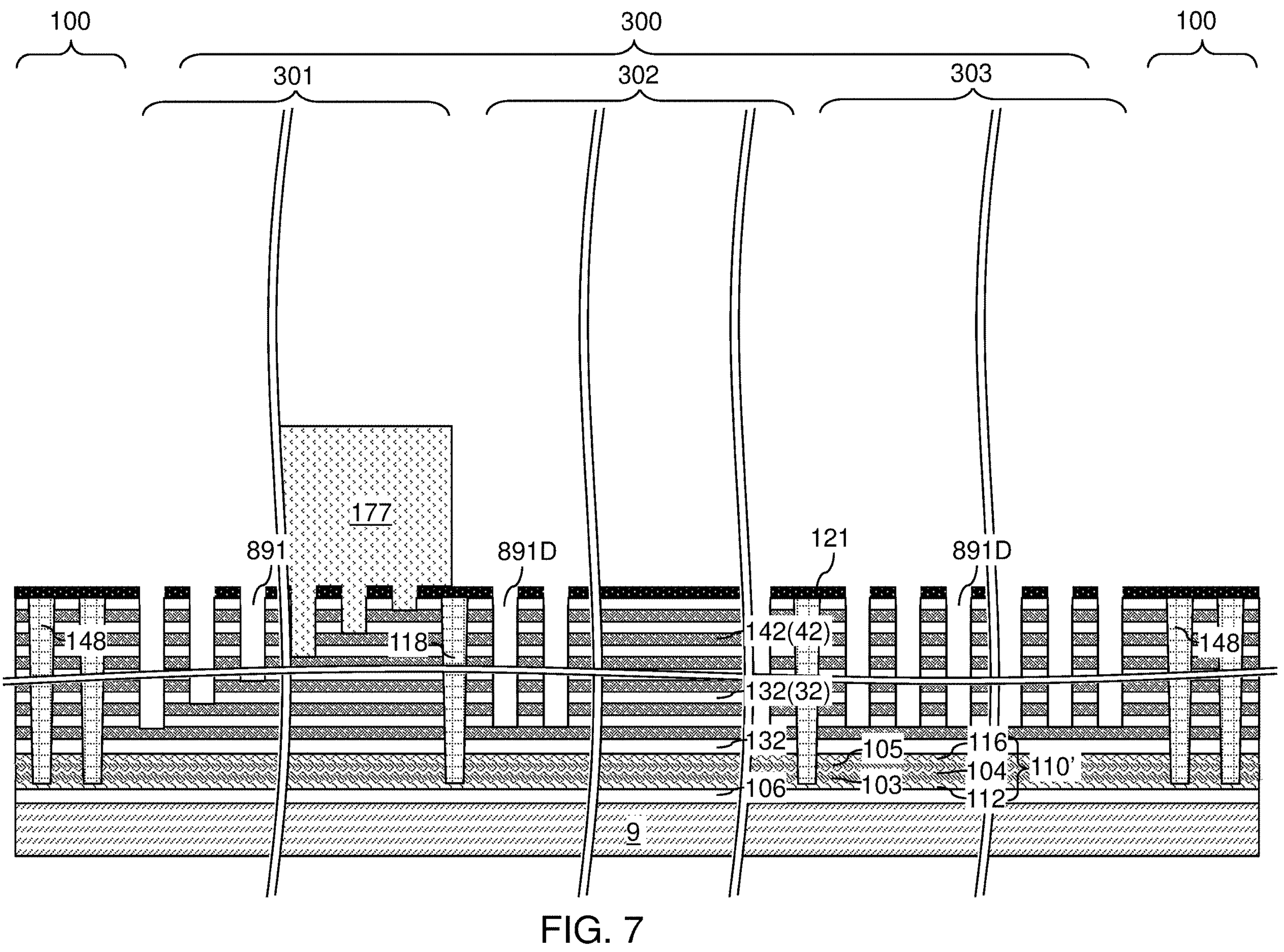
FIG. 7 is a schematic vertical cross-sectional view of the exemplary structure after application and patterning of an N-th photoresist layer and performing an N-th anisotropic etch process according to an embodiment of the present disclosure.

Referring to FIGS. 5, 6, and 7, a series of block-level photoresist layers (171, 172, 177) in combination with a series of anisotropic etch processes can be subsequently employed to sequentially cover a respective subset of the openings in the patterned hard mask layer 121 in the first contact region 301 without covering the second contact region 302 or the third contact region 303, and to extend the pattern of the openings (122, 122D) in the patterned hard mask layer 121 through a respective number of pairs of a first-tier insulating layer 132 and a first-tier sacrificial material layer 142.

For example, about one half of all of the openings 122 through the patterned hard mask layer 121 in the first contact region 301 can be covered by a first block-level photoresist layer 171, and one first-tier insulating layer 132 and one first-tier sacrificial material layer 142 can be etched underneath unmasked openings (122, 122D) in the patterned hard mask layer 121 by performing a first anisotropic etch process as illustrated in FIG. 5.

The entire set of openings (122, 122D) in the patterned hard mask layer 121 that are not covered by the first block-level photoresist layer 171 includes about 50% of the openings 122 in the patterned hard mask layer 121 in the first contact region 301, 100% of the openings 122D in the patterned hard mask layer 121 in the second contact region 302, and 100% of the openings 122D in the patterned hard mask layer 121 in the third contact region 303. Thus, the total etched area includes the areas of about 5/6 of all openings (122, 122D) in the patterned hard mask layer 121, and the first anisotropic etch process is performed with a high pattern factor corresponding to such an etched area. A first subset of the first-tier via cavities 891 is extended by a depth that equals the sum of the thickness of a first-tier insulating layer 132 and the thickness of a first-tier sacrificial material layer 142, while a second subset of the first-tier via cavities 891 is not extended in depth. Each dummy first-tier via cavity 891D that is located in the second contact region 302 and in the third contact region 303 can be vertically extended during the first anisotropic etch process. The subset of the dummy first-tier via cavities 891D that are formed in the second contact region 302 and the third contact region 303 is employed as dummy via cavities that increase the pattern factor during the first anisotropic etch process. By increasing the pattern factor, the end point detection of the first anisotropic etch process is increased because an area of the sacrificial material layers 142 that are exposed in the combination of the first-tier via cavities 891 and the dummy first-tier via cavities 891D is higher compared to an area of the sacrificial material layers 142 that are exposed in only the first-tier via cavities 891. The first block-level photoresist layer 171 can be subsequently removed after the processing steps illustrated in FIG. 5.

Subsequently, about one half of all of the openings 122 through the patterned hard mask layer 121 in the first contact region 301 can be covered by a second block-level photoresist layer 172, and two first-tier insulating layers 132 and two first-tier sacrificial material layers 142 can be etched underneath unmasked openings in the patterned hard mask layer 121 by performing a second anisotropic etch process as illustrated in FIG. 6. A first subset of the openings 122 that are covered with the first block-level photoresist layer 171 at the processing steps of FIG. 5 is masked by the second block-level photoresist layer 172 at the processing steps of FIG. 6, and a second subset of the openings 122 that are covered with the first block-level photoresist layer 171 at the processing steps of FIG. 5 is not masked by the second block-level photoresist layer 172 at the processing steps of FIG. 6. Further, a first subset of the openings 122 that are not covered with the first block-level photoresist layer 171 at the processing steps of FIG. 5 is masked by the second block-level photoresist layer 172 at the processing steps of FIG. 6, and a second subset of the openings 122 that are not covered with the first block-level photoresist layer 171 at the processing steps of FIG. 5 is not masked by the second block-level photoresist layer 172 at the processing steps of FIG. 6.

The entire set of openings (122, 122D) in the patterned hard mask layer 121 that are not covered by the second block-level photoresist layer 172 includes about 50% of the openings 122 in the patterned hard mask layer 121 in the first contact region 301, 100% of the openings 122D in the patterned hard mask layer 121 in the second contact region 302, and 100% of the openings 122D in the patterned hard mask layer 121 in the third contact region 303. Thus, the total etched area includes the areas of about 5/6 of all openings in the patterned hard mask layer 121, and the second anisotropic etch process is performed with higher pattern factor corresponding to such an etched area. According to an aspect of the present disclosure, the pattern factor for the second anisotropic etch process can be the same as the pattern factor for the first anisotropic etch process. This feature improves the end point detection of the second anisotropic etch process.

A subset of the first-tier via cavities (891, 891D) is extended by a depth that equals twice the sum of the thickness of a first-tier insulating layer 132 and the thickness of a first-tier sacrificial material layer 142, while another subset of the first-tier via cavities 891 is not extended in depth. Thus, various combinations of coverage and noncoverage by the various block-level photoresist layers (171, 172) provides four different depths for the first-tier via cavities (891, 891D) after the processing steps of FIG. 6. Each dummy first-tier via cavity 891D that is located in the second contact region 302 and in the third contact region 303 can be vertically extended during the second anisotropic etch process. The subset of the dummy first-tier via cavities 891D that are formed in the second contact region 302 and the third contact region 303 is used as dummy via cavities that increase the pattern factor during the first anisotropic etch process to improve end point detection of the etching process. The second block-level photoresist layer 172 can be subsequently removed after the processing steps illustrated in FIG. 6.

The above scheme described with reference to FIGS. 5 and 6 can be repeated up to N-th block-level photoresist layer and an N-th anisotropic etch process. N may be an integer in a range from 2 to 10, although a greater integer may also be employed for N. For each arbitrary integer i selected between, and including, 2 and N (in other words, for an i-th iteration of the combination of a block-level photoresist layer patterning step and a subsequent anisotropic etch process step), about one half of all of the openings 122 through the patterned hard mask layer 121 in the first contact region 301 can be covered by an i-th block-level photoresist layer, and $2^{(i-1)}$ first-tier insulating layers 132 and $2^{(i-1)}$ first-tier sacrificial material layers 142 can be etched underneath unmasked openings (122, 122D) in the patterned hard mask layer 121 by performing an i-th anisotropic etch process. A subset of the first-tier via cavities (891, 891D) is extended by a depth that equals $2^i$ times the sum of the thickness of a first-tier insulating layer 132 and the thickness of a first-tier sacrificial material layer 142 during the i-th anisotropic etch process, while another subset of the first-tier via cavities 891 is not extended in depth. The masking patterns of the block-level photoresist layers can be combined to provide up to $2^i$ different depths for the first-tier via cavities 891 after the i-th anisotropic etch process. Thus, the first-tier via cavities 891 in the first contact region 301 may have up to $2^N$ different depths for the first-tier via cavities 891 after the N-th anisotropic etch process.

For each i-th anisotropic etch process, the entire set of openings in the patterned hard mask layer 121 that are not covered by each block-level photoresist layer includes about 50% of the openings 122 in the patterned hard mask layer 121 in the first contact region 301, 100% of the openings 122D in the patterned hard mask layer 121 in the second contact region 302, and 100% of the openings 122D in the patterned hard mask layer 121 in the third contact region 303. Thus, the total etched area includes the areas of about ⅚ of all openings (122, 122D) in the patterned hard mask layer 121, and each i-th anisotropic etch process is performed with a higher pattern factor corresponding to such an etched area. According to an aspect of the present disclosure, the pattern factor for each i-th anisotropic etch process can be the same irrespective of the integer i in a range from 1 to N. This feature improves the end point detection for each anisotropic etch process used to deepen the first-tier via cavities 891. Each dummy first-tier via cavity 891D that is located in the second contact region 302 and in the third contact region 303 can be vertically extended during each i-th anisotropic etch process. The subset of the dummy first-tier via cavities 891D that are formed in the second contact region 302 and the third contact region 303 is used as dummy via cavities that increase the pattern factor during each i-th anisotropic etch process to improve end point detection of the etch process. Each block-level photoresist layer can be subsequently removed after performing a respective anisotropic etch process.

While an embodiment is described in which the etch depth of an i-th anisotropic etch process equals $2^i$ times the sum of the thickness of a first-tier insulating layer 132 and the thickness of a first-tier sacrificial material layer 142, the etch depth of any anisotropic etch process may be arbitrarily selected from a set of N depths in any order. The N depths are integer multiples of a unit dimension that is a sum of the thickness of a first-tier insulating layer 132 and the thickness of a first-tier sacrificial material layer 142. The integer multiples may or may not consist of non-negative integer powers of 2, although use of non-negative integer powers of 2 is preferred in generating different depths for the first-tier via cavities 891.

Referring to FIG. 7, the exemplary structure is illustrated after performing the N-th anisotropic etch process employing the N-th block-level photoresist layer 177. The integer N can be selected such that each of the first-tier sacrificial material layer 142 can be physically exposed to a respective one of the first-tier via cavities 891 in the first contact region 301. Further, the dummy openings 122D in the patterned hard mask layer 121 in the second contact region 302 and in the third contact region 303 are not masked by any of the block-level photoresist layers (171, 172, . . . , 177). A top surface of a bottommost first-tier sacrificial material layer 142 may be physically exposed underneath each dummy first-tier via cavity 891D that are formed in the second contact region 302 and in the third contact region 303. The N-th block-level photoresist layer 177 can be subsequently removed, for example, by ashing.

Figure 8:
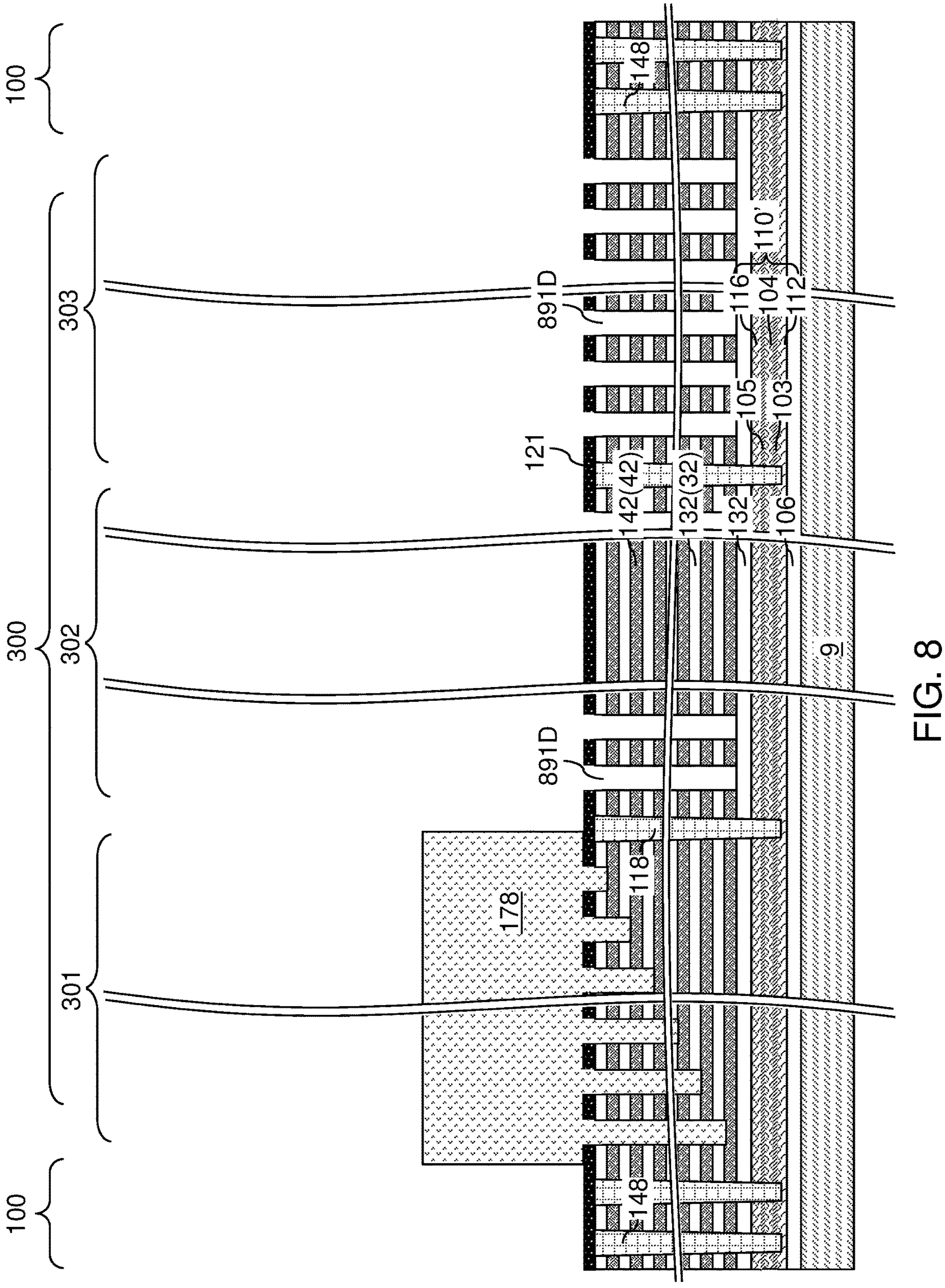
FIG. 8 is a schematic vertical cross-sectional view of the exemplary structure after application and patterning of a terminal photoresist layer and performing a terminal anisotropic etch process according to an embodiment of the present disclosure.

Referring to FIG. 8, a terminal block-level dielectric layer 178 can be applied over the exemplary structure, and can be lithographically patterned to cover the entire area of the first contact region 301 without covering the second contact region 302 or the third contact region 303. A terminal anisotropic etch process can be performed to vertically extent each dummy first-tier via cavity 891D in the second contact region 302 and in the third contact region 303 through the bottommost first-tier sacrificial material layer 142. A bottommost first-tier insulating layer 132 may be physically exposed underneath each dummy first-tier via cavity 891D that are formed in the second contact region 302 and in the third contact region 303.

Figure 9:
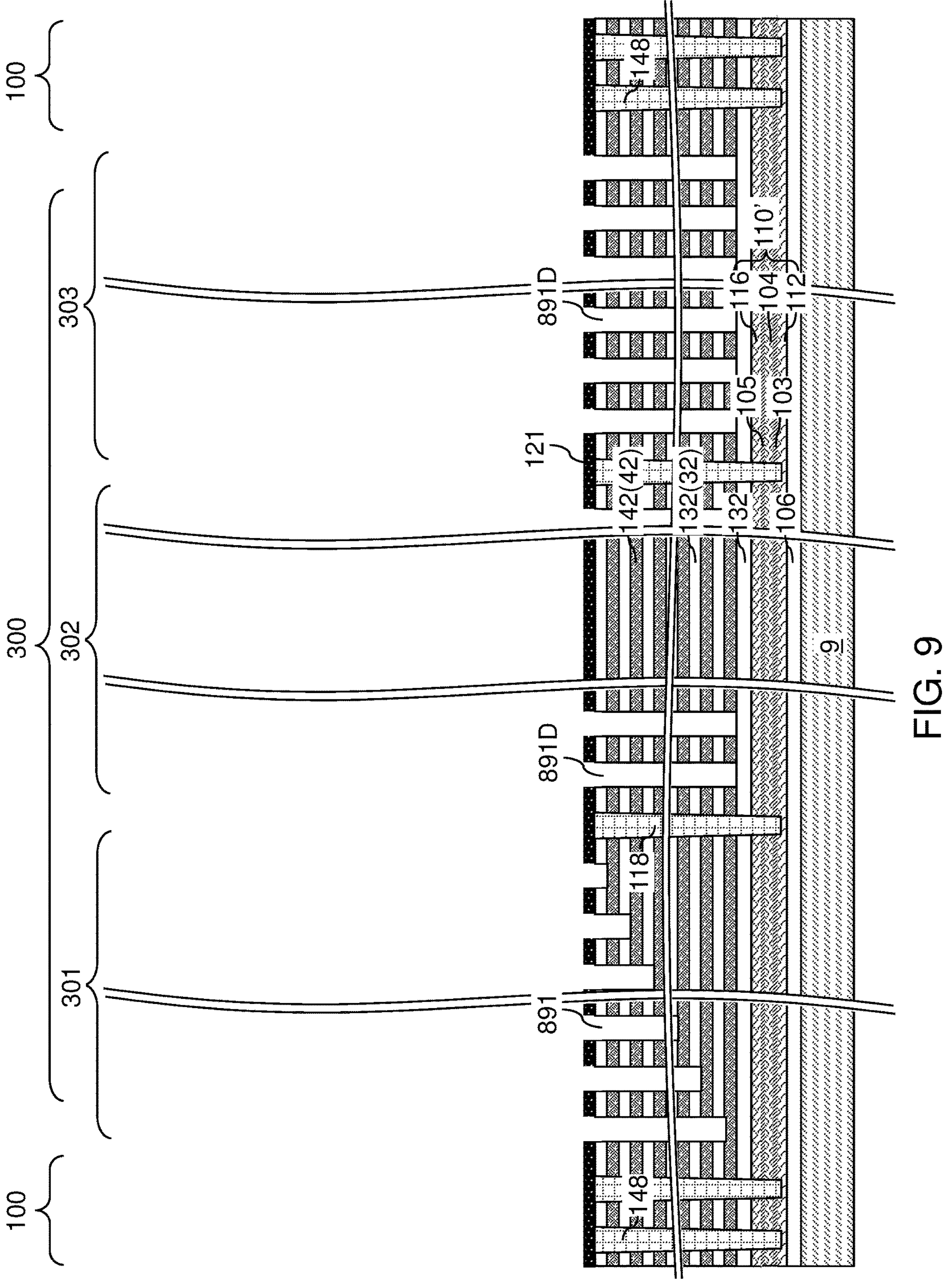
FIG. 9 is a schematic vertical cross-sectional view of the exemplary structure after removal of the final photoresist layer according to an embodiment of the present disclosure.

Referring to FIG. 9, the terminal block-level dielectric layer 178 can be subsequently removed, for example, by ashing.

Figure 10:
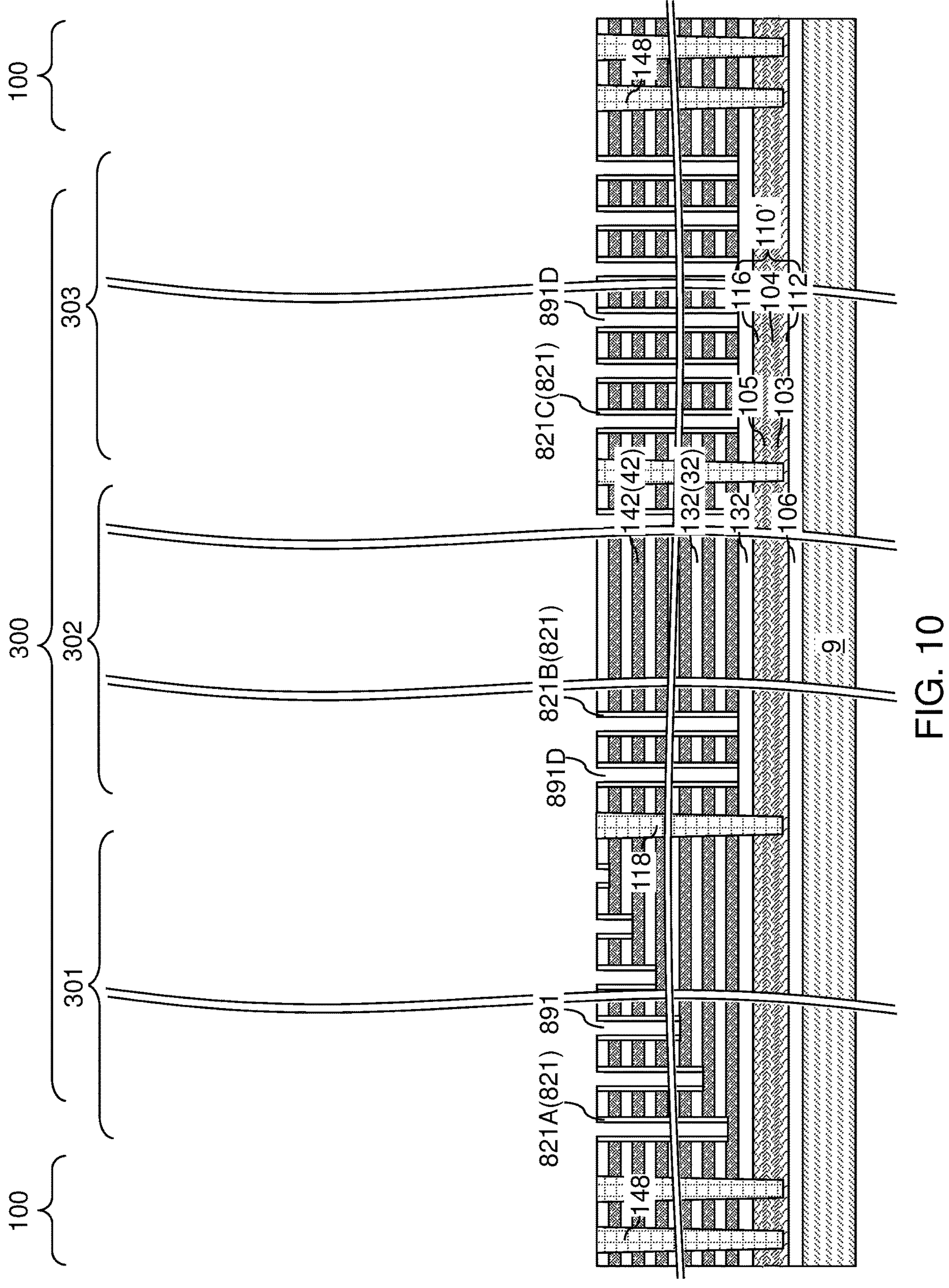
FIG. 10 is a schematic vertical cross-sectional view of the exemplary structure after formation of first-tier tubular dielectric spacers according to an embodiment of the present disclosure.

Referring to FIG. 10, a first dielectric spacer material layer can be conformally deposited in the peripheral regions of the first-tier via cavities (891, 891D). The first dielectric spacer material layer comprises a dielectric material that is different from the material of the first-tier sacrificial material layers 142. For example, the first dielectric spacer material layer comprises a dielectric material, such as silicon oxide. The first dielectric spacer material layer has a thickness that is less than one half of the lateral dimension of each of the first-tier via cavities (891, 891D). For example, the thickness of the first dielectric spacer material layer may be in a range from 2% to 25% of the lateral dimension of each of the first-tier via cavities. In one embodiment, the thickness of the first dielectric spacer material layer may be in a range from 10 nm to 60 nm, although lesser and greater thicknesses may also be employed.

An anisotropic etch process can be performed to remove horizontally-extending portions of the first dielectric spacer material layer. The anisotropic etch process may be continued with a change in the etch chemistry to remove the patterned hard mask layer 121 selective to the material of the first-tier insulating layers 132. Each remaining portion of the first dielectric spacer material layer in a respective first-tier via cavity (891, 891D) constitutes a first-tier tubular dielectric spacer 821. The first-tier tubular dielectric spacers 821 comprise first-type first-tier tubular dielectric spacers 821A that are formed in the first contact region 301 and having different heights; second-type first-tier tubular dielectric spacers 821B that are formed in the second contact region 302 and having a same height; and third-type first-tier tubular dielectric spacers 821C that are formed in the third contact region 303 and having the same height. The second-type first-tier tubular dielectric spacers 821B and the third-type first-tier tubular dielectric spacers 821C comprise dummy spacers which can have a greater vertical dimension (i.e., a height) than each of the first-type first-tier tubular dielectric spacers 821A.

Figure 11A:
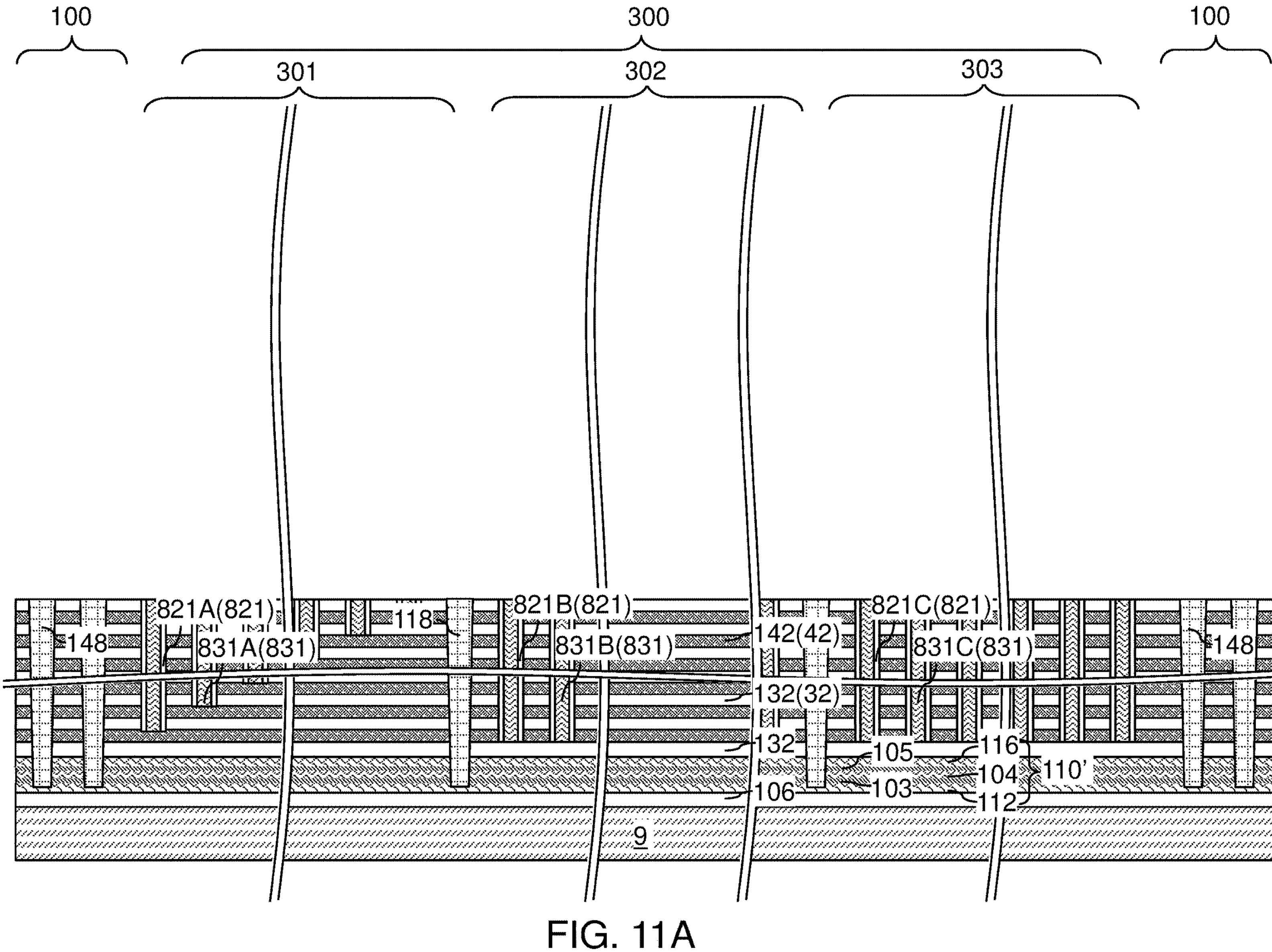
FIG. 11A is a schematic vertical cross-sectional view of the exemplary structure after formation of first-tier pillar structures according to an embodiment of the present disclosure.
Figure 11B:
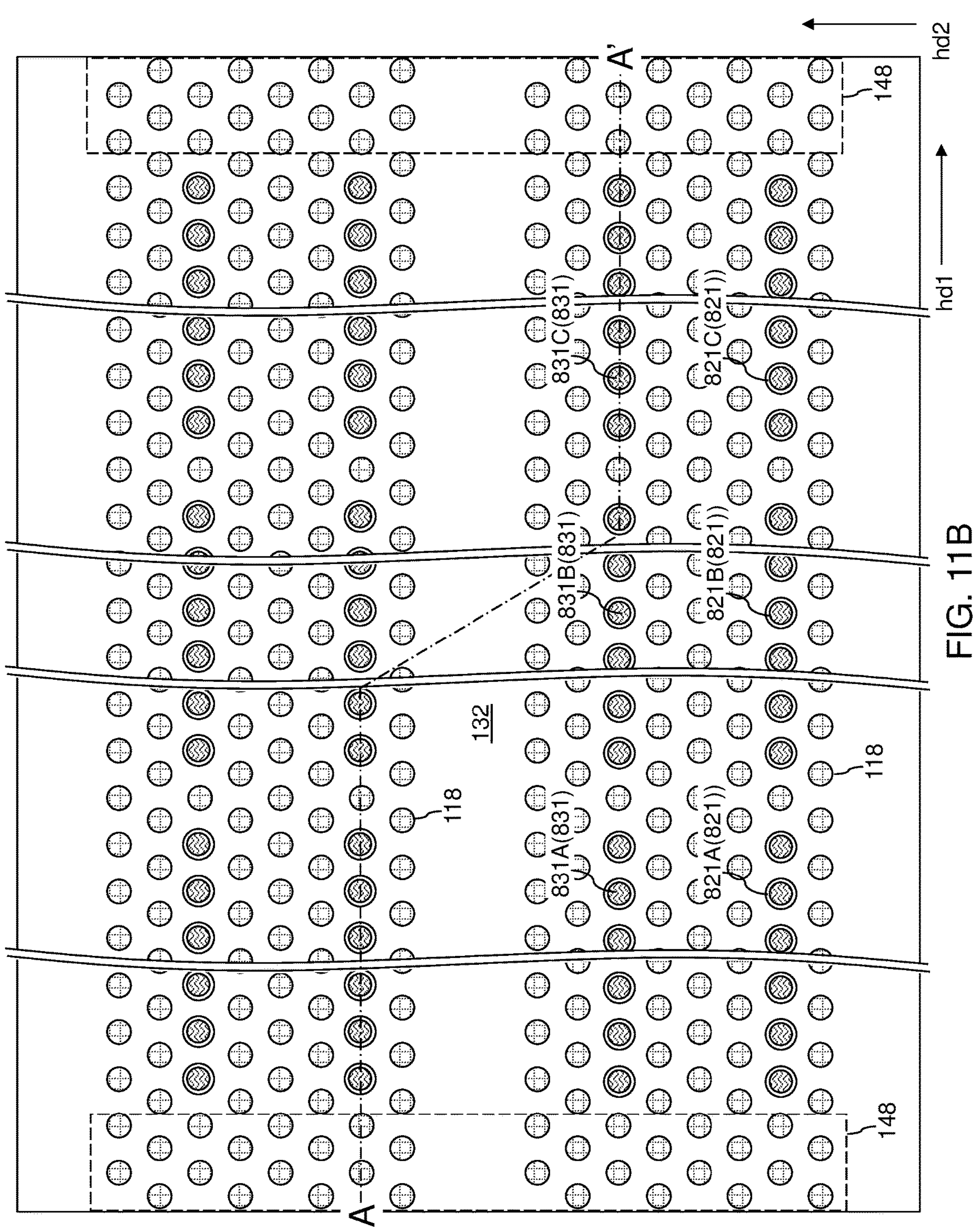
FIG. 11B is a top-down view of the exemplary structure of FIG. 11A. The vertical plane A-A' is the cut plane of the vertical cross-sectional view of FIG. 11A.

Referring to FIGS. 11A and 11B, a first sacrificial via fill material can be deposited in remaining volumes of the first-tier via cavities (891, 891D). The first sacrificial via fill material may comprise a semiconductor material (such as amorphous silicon, polysilicon, silicon-germanium, etc.), a carbon-based material including carbon atoms at an atomic percentage greater than 80% (such as amorphous carbon or diamond-like carbon), or a polymer material. The first sacrificial via fill material may be the same as or may be different from the first sacrificial fill material of the first-tier sacrificial opening fill structures (148, 118).

A planarization process can be performed to remove portions of the first sacrificial via fill material from above the horizontal plane including the top surface of the first-tier alternating stack (132, 142). The planarization process can be stopped such that each remaining portion of the first sacrificial fill material has a top surface at or about a horizontal plane including the top surface of the first-tier alternating stack (132, 142). The planarization process may comprise a recess etch process and/or chemical mechanical polishing process. Remaining portions of the first sacrificial via fill material that fill the first-tier via openings (891, 891D) constitute first-tier pillar structures 831. The first-tier pillar structures 831 comprise first-type first-tier pillar structures 831A that are formed in the first contact region 301, second-type first-tier pillar structures 831B that are formed in the second contact region 301, and third-type first-tier pillar structures 831C that are formed in the third contact region 303. The first-type first-tier pillar structures 831A do not extend through a bottommost first-tier sacrificial material layer 142 within the first-tier alternating stack (132, 142). The second-type first-tier pillar structures 831B and the third-type first-tier pillar structures 831C extend through each first-tier sacrificial material layer 142 within the first-tier alternating stack (132, 142). The second-type first-tier pillar structures 831B and the third-type first-tier pillar structures 831C comprise dummy first-tier pillar structures which will not be replaced with contact via structures at a subsequent process step and will remain in the final device.

In one embodiment, each of the second-type first-tier pillar structures 831B and the third-type first-tier pillar structures 831C comprises a respective bottom surface that contacts a top surface of the bottommost first-tier insulating layer 132 within the first-tier alternating stack (132, 142). In one embodiment, each of the first-tier pillar structures 831 comprises a respective top surface that is formed within a horizontal plane including the topmost surface of the first-tier alternating stack (132, 142). In one embodiment, each of the first-tier pillar structures 831 may be formed directly on and within a respective one of the first-tier tubular dielectric spacers 821. In one embodiment, an annular top surface of each first-tier tubular dielectric spacer 821 may be formed within a horizontal plane including the topmost surface of the first-tier alternating stack (132, 142). In one embodiment, a top surface of each first-tier pillar structure 831 may be formed within the horizontal plane including the topmost surface of the first-tier alternating stack (132, 142).

Figure 12:
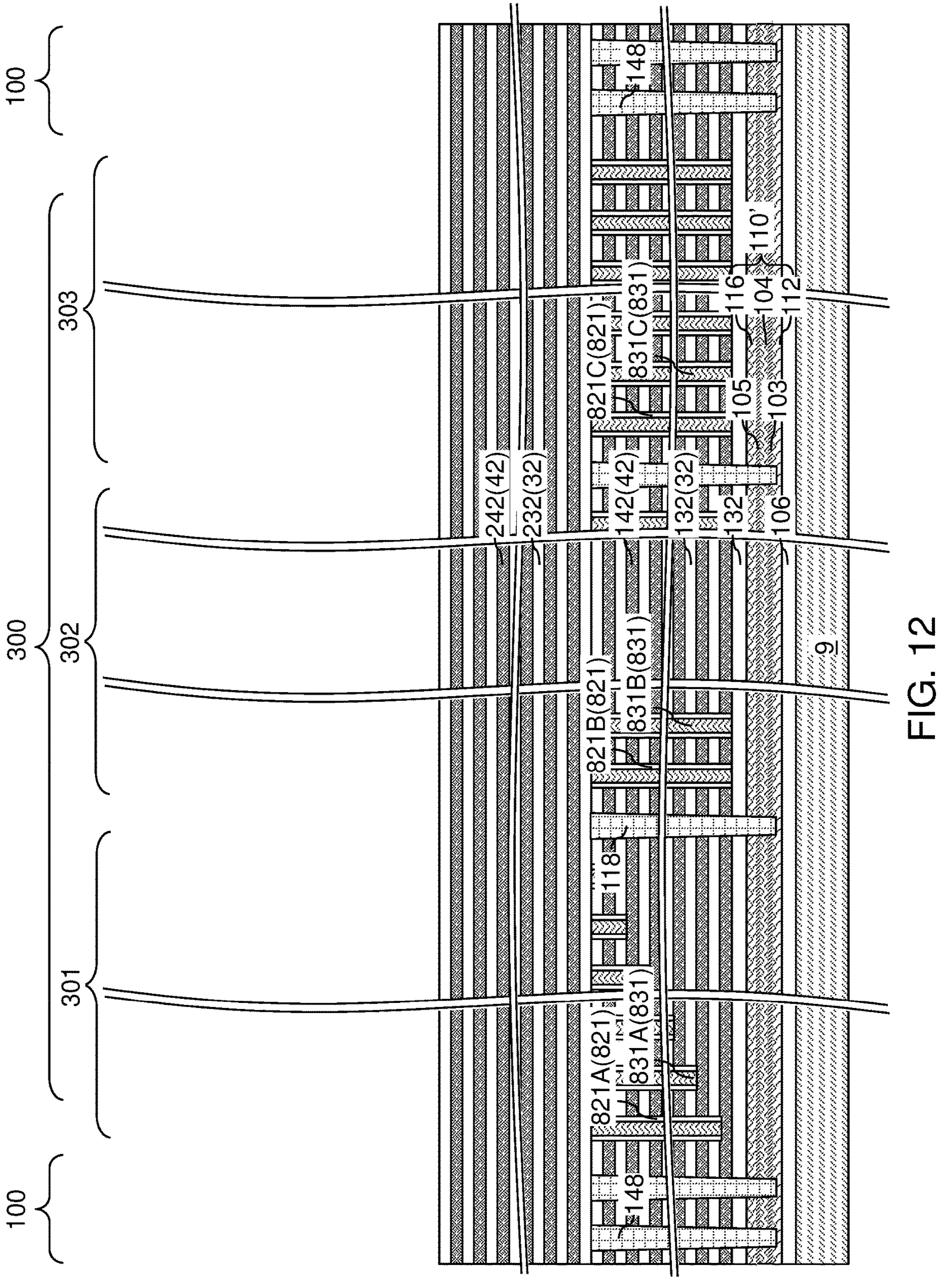
FIG. 12 is a schematic vertical cross-sectional view of the exemplary structure after formation of a second-tier alternating stack of second-tier insulating layers and second-tier sacrificial material layers according to an embodiment of the present disclosure.

Referring to FIG. 12, a second-tier alternating stack of second-tier insulating layers 232 and second spacer material layers can be formed over the first-tier alternating stack (132, 142). In one embodiment, the second spacer material layers may comprise second-tier sacrificial material layers 242. In this case, a second-tier alternating stack (232, 242) of second-tier insulating layers 232 and second-tier sacrificial material layers 242 can be formed over the first-tier alternating stack (132, 142). The second-tier insulating layers 232 are a second subset of the insulating layers 32, and the second-tier sacrificial material layers 242 are a second subset of the sacrificial material layers 42. In one embodiment, the second-tier insulating layers 232 may comprise silicon oxide layers, and the second-tier sacrificial material layers 242 may comprise silicon nitride layers. The second-tier alternating stack (232, 242) may comprise multiple repetitions of a unit layer stack including a second-tier insulating layer 232 and a second-tier sacrificial material layer 242. The total number of repetitions of the unit layer stack within the second-tier alternating stack (232, 242) may be, for example, in a range from 8 to 1,024, such as from 32 to 256, although lesser and greater number of repetitions may also be employed.

Figure 13:
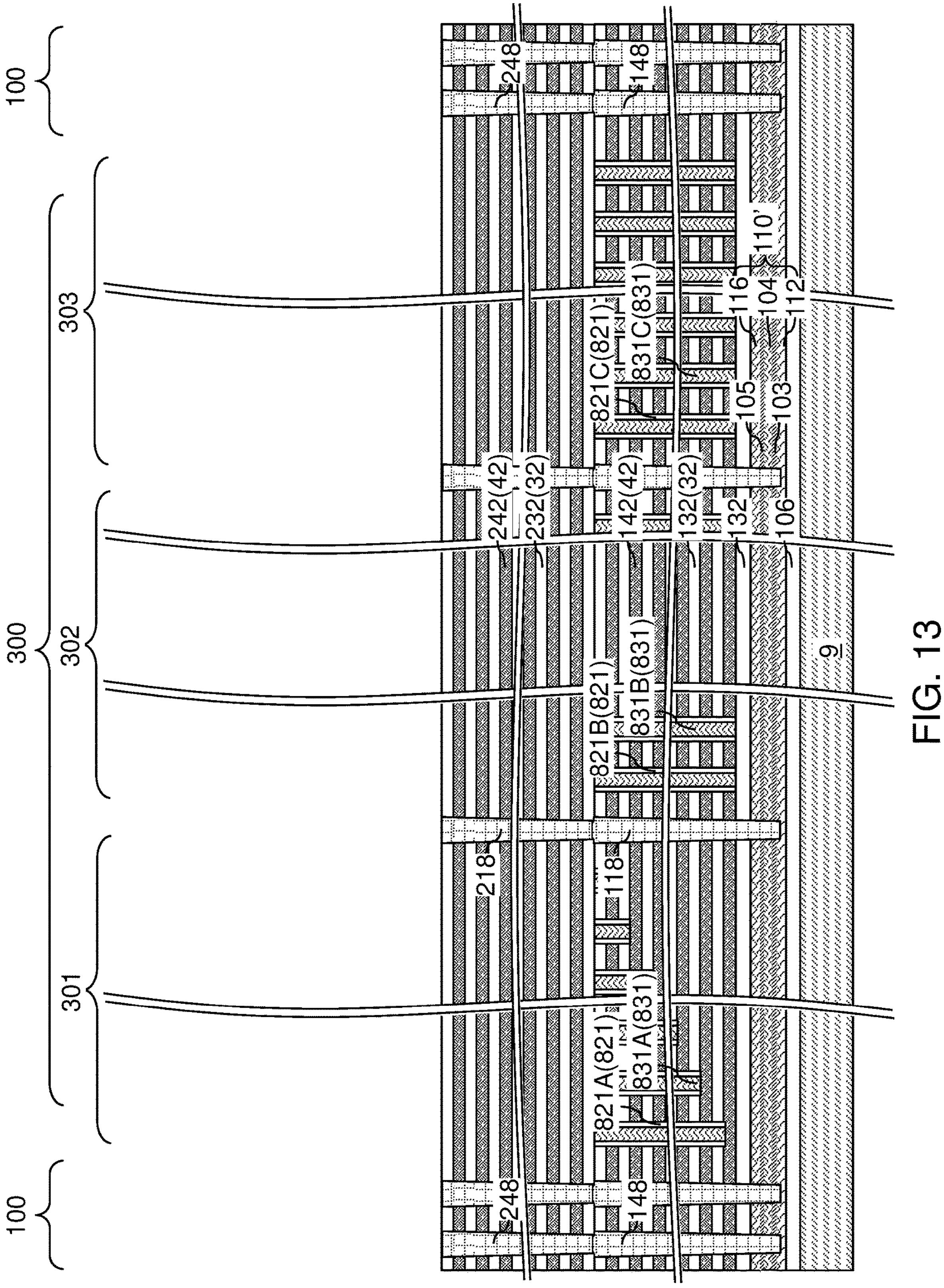
FIG. 13 is a schematic vertical cross-sectional view of the exemplary structure after formation of second-tier sacrificial opening fill structures according to an embodiment of the present disclosure.

Referring to FIG. 13, the processing steps described with reference to FIGS. 3A and 3B can be performed with any needed changes to form second-tier memory openings and second-tier support openings, and to form second-tier sacrificial memory opening fill structures 248 and second-tier sacrificial support opening fill structures 218. Generally, the pattern of the second-tier memory openings and the pattern of the second-tier sacrificial memory opening fill structures 248 may be the same as the pattern of the first-tier memory openings 149 and the pattern of the first-tier sacrificial memory opening fill structures 148. Further, the pattern of the second-tier support openings and the pattern of the second-tier sacrificial support opening fill structures 218 may be the same as the pattern of the first-tier support openings 119 and the pattern of the first-tier sacrificial support opening fill structures 118.

In one embodiment, each contiguous combination of a first-tier sacrificial memory opening fill structure 148 and a second-tier sacrificial memory opening fill structure 248 may have a stepped vertical cross-sectional profile including a first tapered surface that extends through the first-tier alternating stack (132, 142) (i.e., a tapered surface of the first-tier sacrificial memory opening fill structure 148), a second tapered surface that extends through the second-tier alternating stack (232, 242) (i.e., a tapered surface of the second-tier sacrificial memory opening fill structure 248), and a first horizontal connecting surface that connects the first tapered surface and the second tapered surface and located within a horizontal plane including the interface between the first-tier alternating stack (132, 142) and the second-tier alternating stack (232, 242), which includes the top surface of the first-tier pillar structures 831. The first horizontal connecting surface may be an annular horizontal top surface segment of the first-tier sacrificial memory opening fill structure 148.

Figure 14A:
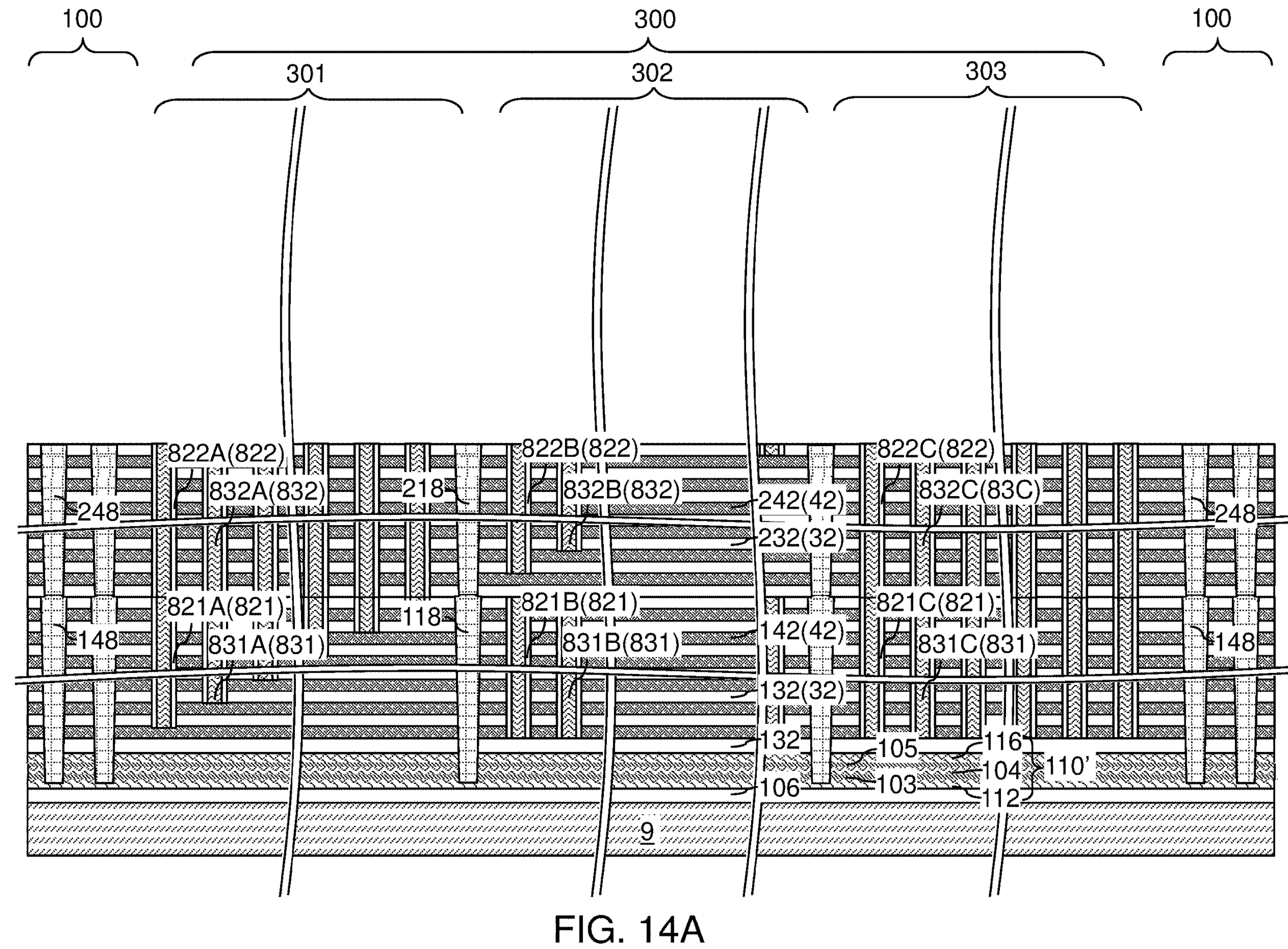
FIG. 14A is a schematic vertical cross-sectional view of the exemplary structure after formation of second-tier tubular dielectric spacers and second-tier pillar structures according to an embodiment of the present disclosure.
Figure 14B:
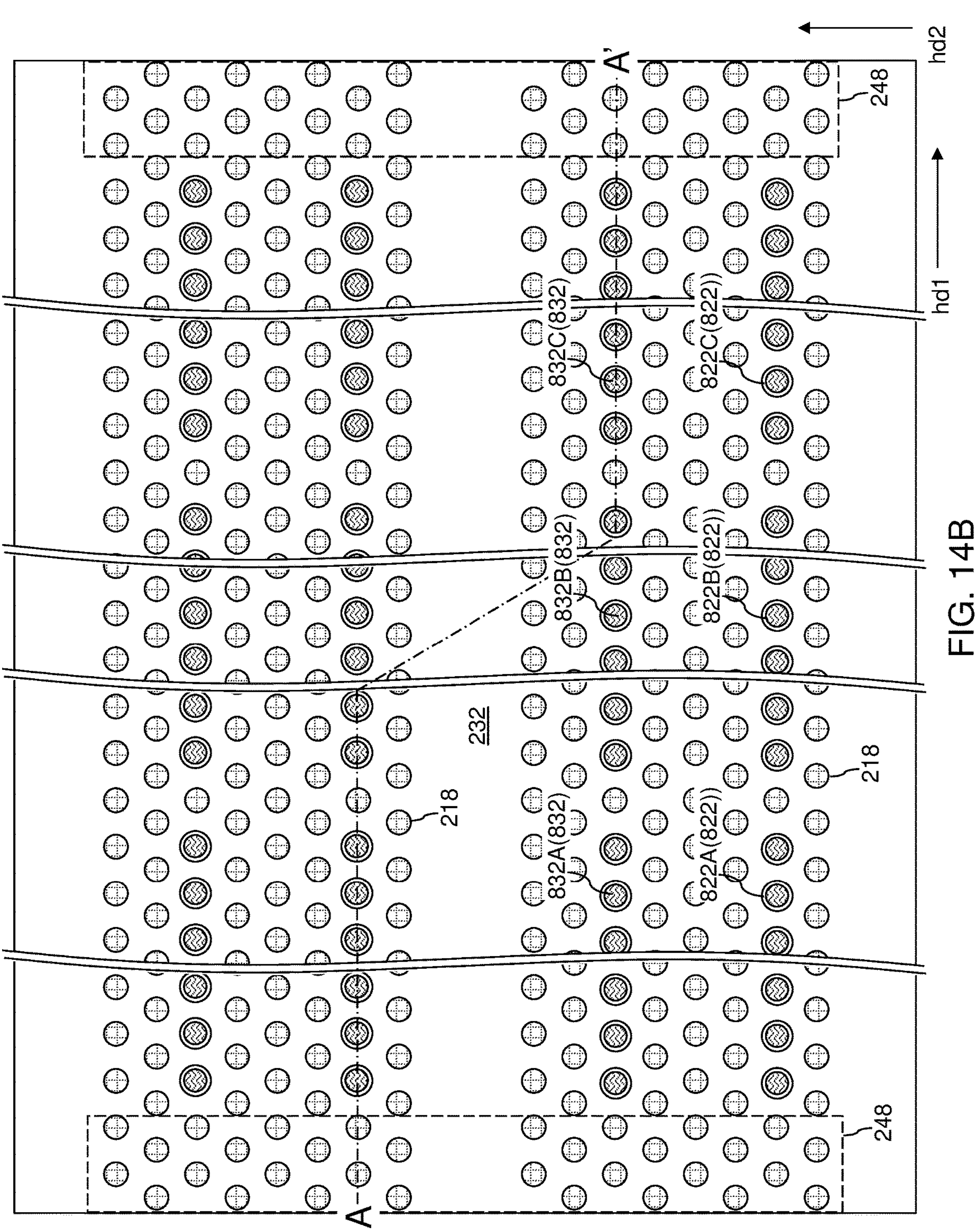
FIG. 14B is a top-down view of the exemplary structure of FIG. 14A. The vertical plane A-A' is the cut plane of the vertical cross-sectional view of FIG. 14A.

Referring to FIGS. 14A and 14B, the processing steps described with reference to FIGS. 4A-11B may be repeated with any needed changes to form second-tier via cavities through the second-tier alternating stack (232, 242). Each second-tier via cavity that are located in the first contact region 301 and in the third contact region 303 can be vertically extended during each anisotropic etch process that patterns the second-tier via cavities. The subset of the second-tier via cavities that are formed in the third contact region 303 is employed as dummy via cavities that increase the pattern factor during each anisotropic etch process to improve the end point detection of the etch process. Generally, the pattern of the second-tier via cavities in a plan view may be the same as the pattern of the first-tier via cavities in the plan view, although the distribution of depths of the second-tier via cavities is different relative to the distribution of depths of the first-tier via cavities. According to an aspect of the present disclosure, the depths of the second-tier via cavities can be selected such that each of the second-tier sacrificial material layers 242 comprises a respective physically exposed horizontal top surface underneath a respective second-tier via cavity that is formed within the second contact region 302. Further, each second-tier via cavity that is formed in the first contact region 301 and the third contact region 303 can be formed through each layer within the second-tier alternating stack (232, 242) such that a top surface of a respective first-tier pillar structure 831 and an annular top surface of a respective first-tier tubular dielectric spacer 821 is physically exposed underneath each second-tier via cavity in the first contact region 301 and the third contact region 303.

Each second-tier via cavity can be filled with a combination of a respective second-tier tubular dielectric spacer 822 and a respective second-tier pillar structure 832. The second-tier tubular dielectric spacers 822 comprise first-type second-tier tubular dielectric spacers 822A that are formed in the first contact region 301 and having a same height that equals the total thickness of the second-tier alternating stack (232, 242); second-type second-tier tubular dielectric spacers 822B that are formed in the second contact region 302 and having different heights and not contacting any underlying first-tier tubular dielectric spacer 821; and third-type second-tier tubular dielectric spacers 822C that are formed in the third contact region 303 and having the same height. The first-type second-tier tubular dielectric spacers 822A and the third-type second-tier tubular dielectric spacers 822C can have a greater vertical dimension (i.e., a height) than each of the second-type second-tier tubular dielectric spacers 822B.

The second-tier pillar structures 832 comprise first-type second-tier pillar structures 832A that are formed in the first contact region 301, second-type second-tier pillar structures 832B that are formed in the second contact region 301, and third-type second-tier pillar structures 832C that are formed in the third contact region 303. The second-type second-tier pillar structures 832B do not extend through a bottommost second-tier sacrificial material layer 242 within the second-tier alternating stack (232, 242). The first-type second-tier pillar structures 832A and the third-type second-tier pillar structures 832C extend through each second-tier sacrificial material layer 242 within the second-tier alternating stack (232, 242). The third-type second-tier pillar structures 832C comprise dummy pillar structures.

In one embodiment, each of the first-type second-tier pillar structures 832A comprises a respective bottom surface that contacts a top surface of a respective first-type first-tier pillar structure 831A, and each of the third-type second-tier pillar structures 832C comprises a respective bottom surface that contacts a top surface of a respective third-type first-tier pillar structure 831C. In one embodiment, each of the second-tier pillar structures 832 comprises a respective top surface that is formed within a horizontal plane including the topmost surface of the second-tier alternating stack (232, 242). In one embodiment, each of the second-tier pillar structures 832 may be formed directly on and within a respective one of the second-tier tubular dielectric spacers 822. In one embodiment, an annular top surface of each second-tier tubular dielectric spacer 822 may be formed within a horizontal plane including the topmost surface of the second-tier alternating stack (232, 242). In one embodiment, a top surface of each second-tier pillar structure 832 may be formed within the horizontal plane including the topmost surface of the second-tier alternating stack (232, 242).

Figure 15:
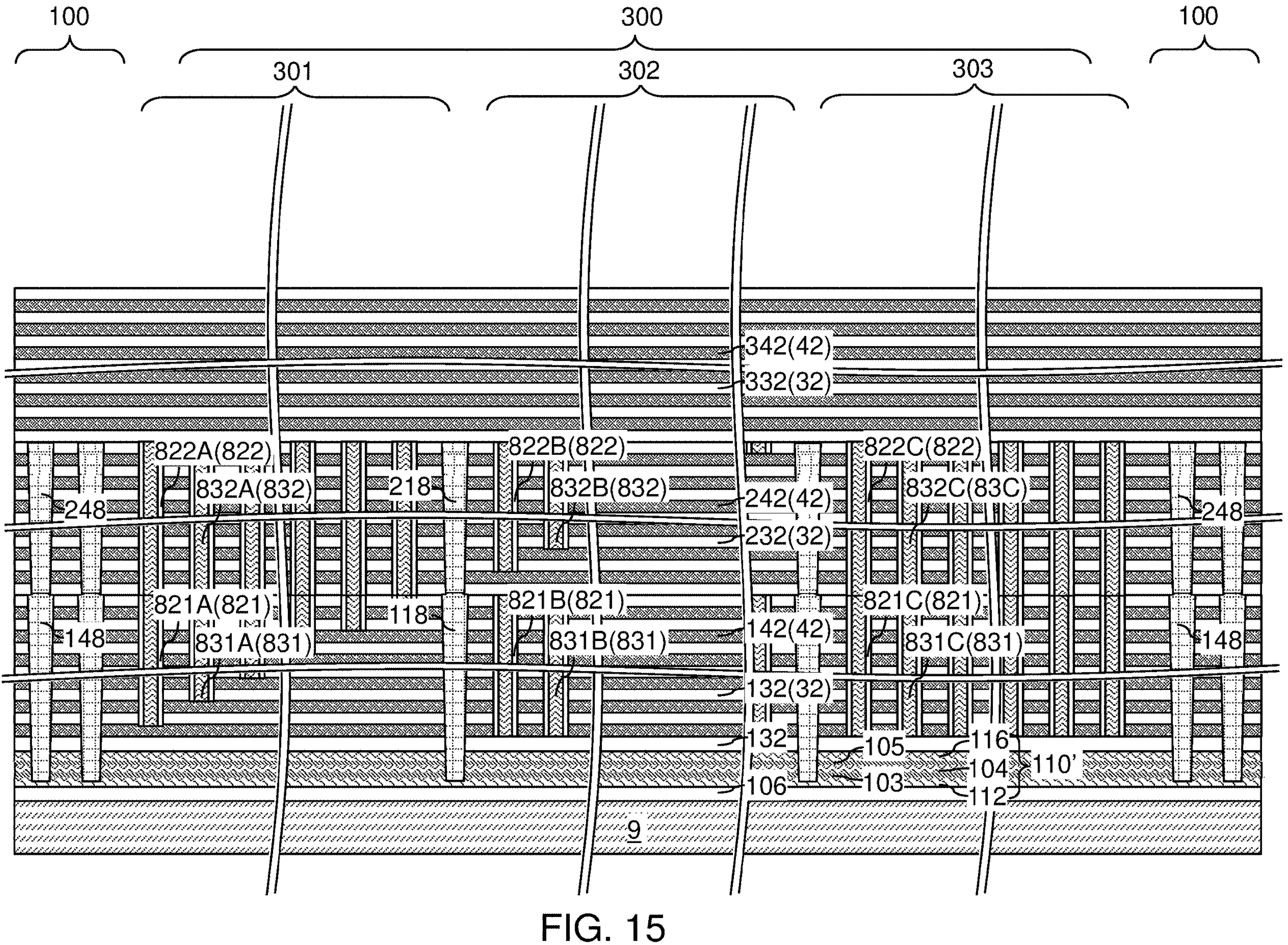
FIG. 15 is a schematic vertical cross-sectional view of the exemplary structure after formation of a third-tier alternating stack of third-tier insulating layers and third-tier sacrificial material layers according to an embodiment of the present disclosure.

Referring to FIG. 15, a third-tier alternating stack of third-tier insulating layers 332 and second spacer material layers can be formed over the second-tier alternating stack (232, 242). In one embodiment, the third spacer material layers may comprise third-tier sacrificial material layers 342. In this case, a third-tier alternating stack (332, 342) of third-tier insulating layers 332 and third-tier sacrificial material layers 342 can be formed over the second-tier alternating stack (232, 242). The third-tier insulating layers 332 are a third subset of the insulating layers 32, and the third-tier sacrificial material layers 342 are a third subset of the sacrificial material layers 42. In one embodiment, the third-tier insulating layers 332 may comprise silicon oxide layers, and the third-tier sacrificial material layers 342 may comprise silicon nitride layers. The third-tier alternating stack (332, 342) may comprise multiple repetitions of a unit layer stack including a third-tier insulating layer 332 and a third-tier sacrificial material layer 342. The total number of repetitions of the unit layer stack within the third-tier alternating stack (332, 342) may be, for example, in a range from 8 to 1,024, such as from 32 to 256, although lesser and greater number of repetitions may also be employed.

Figure 16:
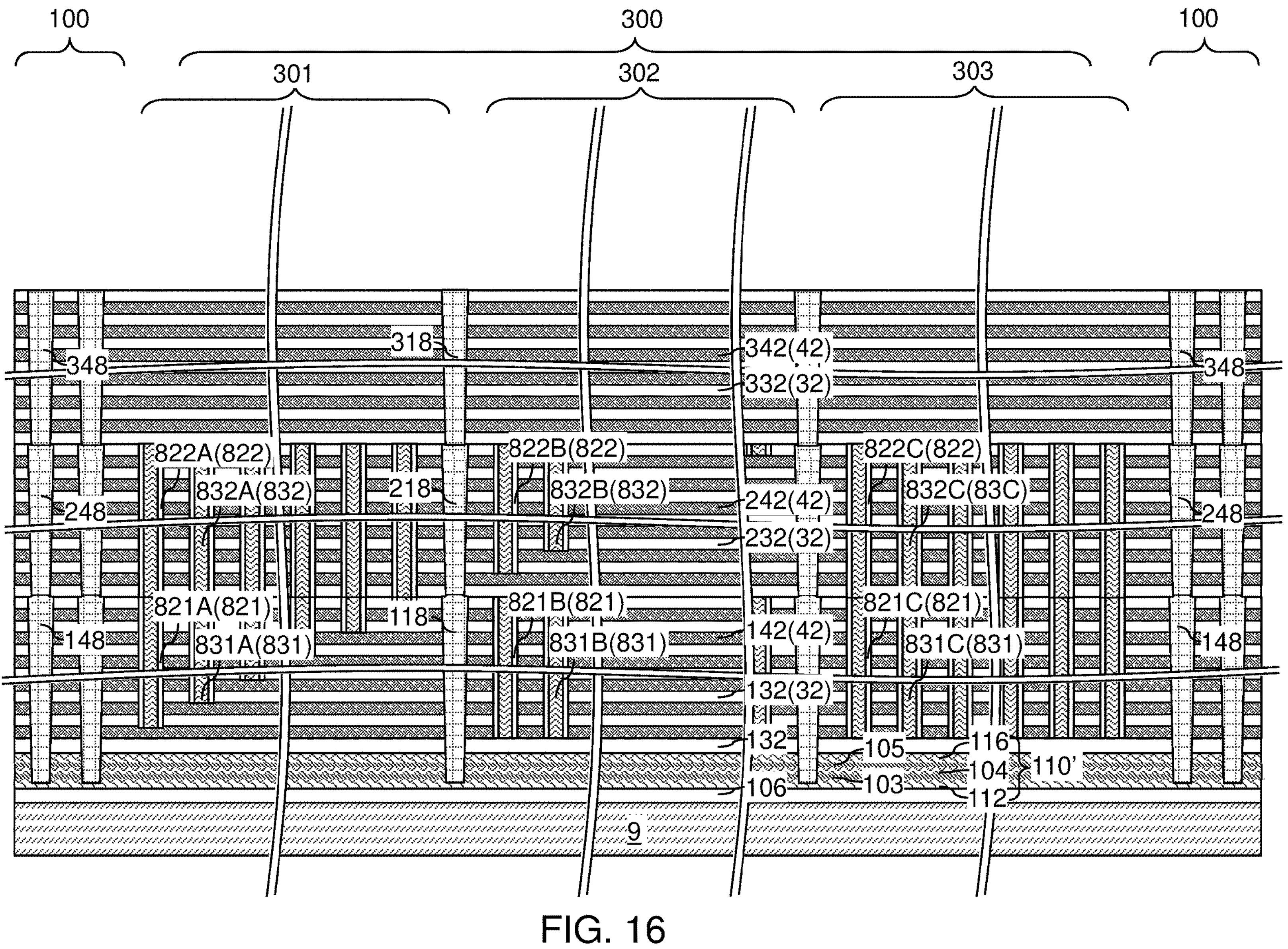
FIG. 16 is a schematic vertical cross-sectional view of the exemplary structure after formation of third-tier sacrificial opening fill structures according to an embodiment of the present disclosure.

Referring to FIG. 16, the processing steps described with reference to FIGS. 3A and 3B can be performed with any needed changes to form third-tier memory openings and third-tier support openings, and to form third-tier sacrificial memory opening fill structures 348 and third-tier sacrificial support opening fill structures 318. Generally, the pattern of the third-tier memory openings and the pattern of the third-tier sacrificial memory opening fill structures 348 may be the same as the pattern of the second-tier memory openings and the pattern of the second-tier sacrificial memory opening fill structures 248. Further, the pattern of the third-tier support openings and the pattern of the third-tier sacrificial support opening fill structures 318 may be the same as the pattern of the second-tier support openings and the pattern of the second-tier sacrificial support opening fill structures 218.

In one embodiment, each contiguous combination of a first-tier sacrificial memory opening fill structure 148, a second-tier sacrificial memory opening fill structure 248 and a third-tier sacrificial memory opening fill structure 348 may have a stepped vertical cross-sectional profile including a first tapered surface that extends through the first-tier alternating stack (132, 142) (i.e., a tapered surface of the first-tier sacrificial memory opening fill structure 148), a second tapered surface that extends through the second-tier alternating stack (232, 242) (i.e., a tapered surface of the second-tier sacrificial memory opening fill structure 248), a third tapered surface that extends through the third-tier alternating stack (332, 342) (i.e., a tapered surface of the third-tier sacrificial memory opening fill structure 348), a first horizontal connecting surface that connects the first tapered surface and the second tapered surface and located within a horizontal plane including the interface between the second-tier alternating stack (232, 242) and the third-tier alternating stack (332, 342), and a second horizontal connecting surface that connects the second tapered surface and the third tapered surface and located within a horizontal plane including the interface between the second-tier alternating stack (232, 242) and the third-tier alternating stack (332, 342). The first horizontal connecting surface may be an annular horizontal top surface segment of the first-tier sacrificial memory opening fill structure 148. The second horizontal connecting surface may be an annular horizontal top surface segment of the second-tier sacrificial memory opening fill structure 248.

Figure 17A:
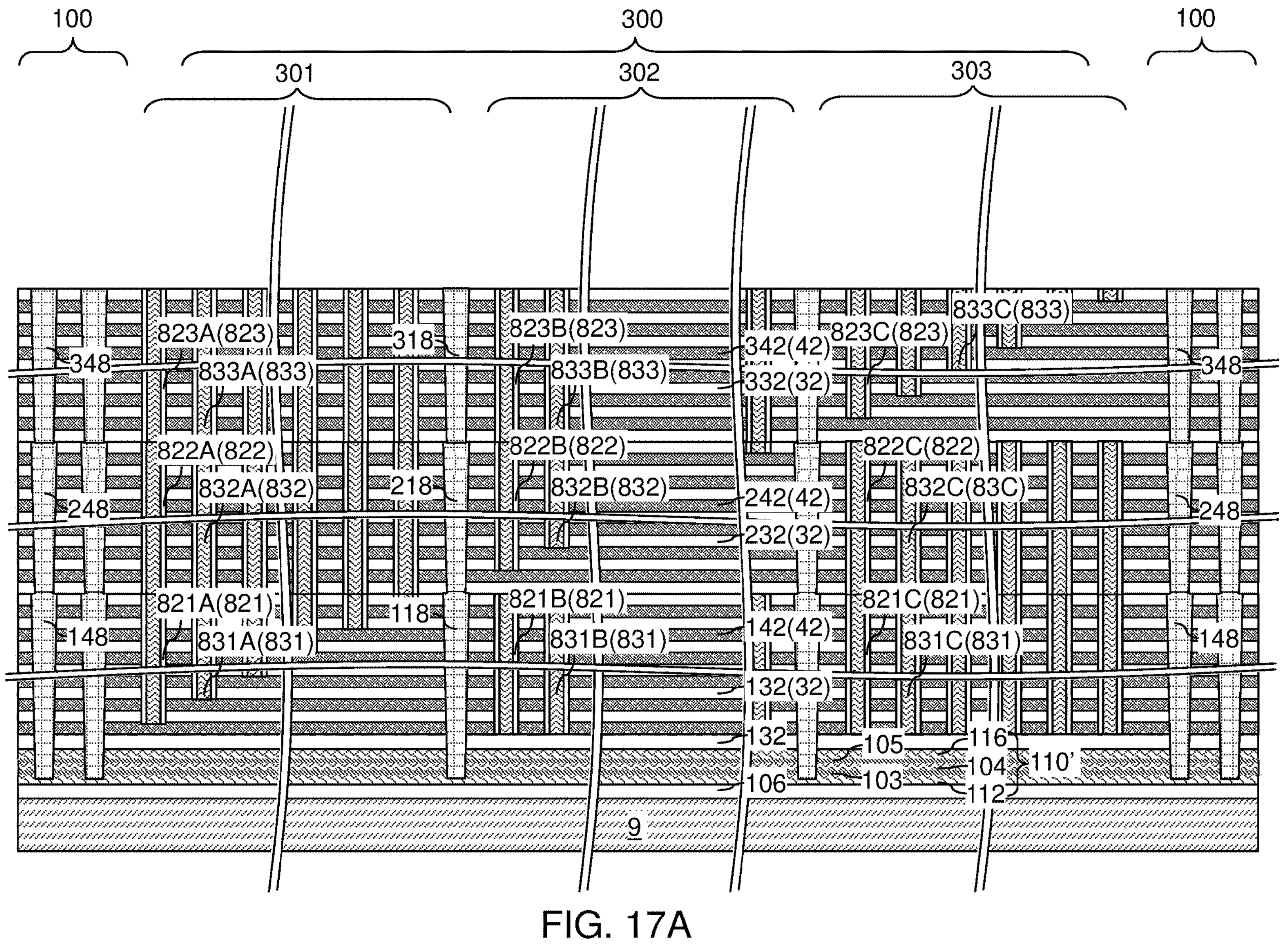
FIG. 17A is a schematic vertical cross-sectional view of the exemplary structure after formation of third-tier tubular dielectric spacers and third-tier pillar structures according to an embodiment of the present disclosure.
Figure 17B:
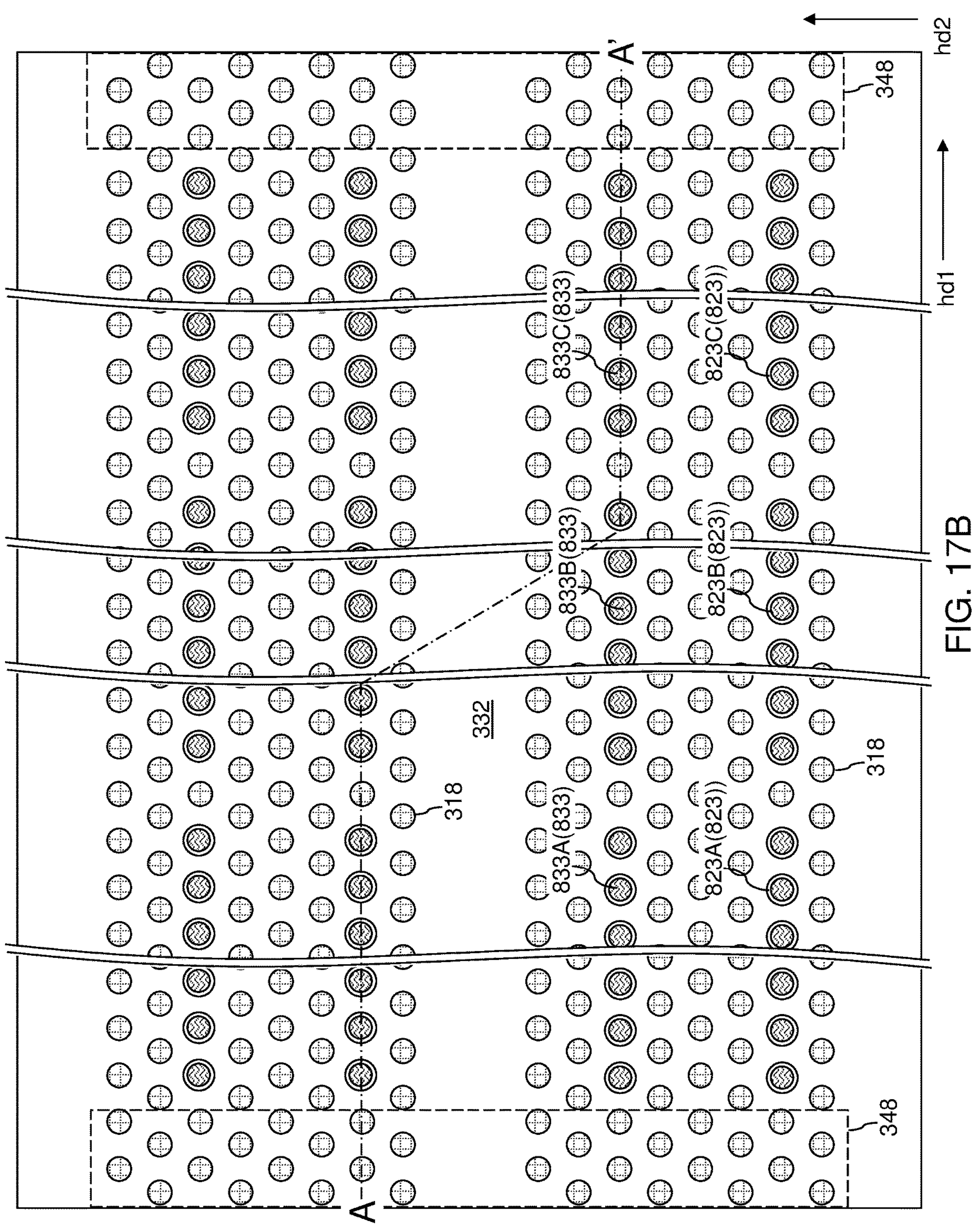
FIG. 17B is a top-down view of the exemplary structure of FIG. 17A. The vertical plane A-A' is the cut plane of the vertical cross-sectional view of FIG. 17A.

Referring to FIGS. 17A and 17B, the processing steps described with reference to FIGS. 4A-11B may be repeated with any needed changes to form third-tier via cavities through the third-tier alternating stack (332, 342). Generally, the pattern of the third-tier via cavities in a plan view may be the same as the pattern of the first-tier via cavities in the plan view, although the distribution of depths of the third-tier via cavities is different relative to the distribution of depths of the first-tier via cavities. According to an aspect of the present disclosure, the depths of the third-tier via cavities can be selected such that each of the third-tier sacrificial material layers 342 comprises a respective physically exposed horizontal top surface underneath a respective third-tier via cavity that is formed within the third contact region 303. Further, each third-tier via cavity that is formed in the first contact region 301 and the second contact region 302 can be formed through each layer within the third-tier alternating stack (332, 342) such that a top surface of a respective second-tier pillar structure 832 and an annular top surface of a respective second-tier tubular dielectric spacer 822 is physically exposed underneath each third-tier via cavity in the first contact region 301 and the second contact region 302.

Each third-tier via cavity can be filled with a combination of a respective third-tier tubular dielectric spacer 823 and a respective third-tier pillar structure 833. The third-tier tubular dielectric spacers 823 comprise first-type third-tier tubular dielectric spacers 823A that are formed in the first contact region 301 and having a same height that equals the total thickness of the third-tier alternating stack (332, 342); second-type third-tier tubular dielectric spacers 823B that are formed in the second contact region 302 and having the same height; and third-type third-tier tubular dielectric spacers 823C that are formed in the third contact region 303 and having different heights and not contacting any underlying second-tier tubular dielectric spacer 822. The first-type third-tier tubular dielectric spacers 823A and the second-type third-tier tubular dielectric spacers 823B can have a greater vertical dimension (i.e., a height) than each of the third-type third-tier tubular dielectric spacers 823C.

The third-tier pillar structures 833 comprise first-type third-tier pillar structures 833A that are formed in the first contact region 301, second-type third-tier pillar structures 833B that are formed in the second contact region 301, and third-type third-tier pillar structures 833C that are formed in the third contact region 303. The third-type third-tier pillar structures 833C do not extend through a bottommost third-tier sacrificial material layer 342 within the third-tier alternating stack (332, 342). The first-type third-tier pillar structures 833A and the second-type third-tier pillar structures 833B extend through each third-tier sacrificial material layer 342 within the third-tier alternating stack (332, 342).

In one embodiment, each of the first-type third-tier pillar structures 833A comprises a respective bottom surface that contacts a top surface of a respective first-type second-tier pillar structure 832A, and each of the second-type third-tier pillar structures 833B comprises a respective bottom surface that contacts a top surface of a respective second-type second-tier pillar structure 832B. In one embodiment, each of the third-tier pillar structures 833 comprises a respective top surface that is formed within a horizontal plane including the topmost surface of the third-tier alternating stack (332, 342). In one embodiment, each of the third-tier pillar structures 833 may be formed directly on and within a respective one of the third-tier tubular dielectric spacers 823. In one embodiment, an annular top surface of each third-tier tubular dielectric spacer 823 may be formed within a horizontal plane including the topmost surface of the third-tier alternating stack (332, 342). In one embodiment, a top surface of each third-tier pillar structure 833 may be formed within the horizontal plane including the topmost surface of the third-tier alternating stack (332, 342).

Subsequently, a mask layer (not illustrated) may be applied over the exemplary structure, and can be lithographically patterned to form openings over each of the third-tier sacrificial memory opening fill structures 348 and the third-tier sacrificial support opening fill structures 318. The mask layer may comprise a hardmask layer comprising a hardmask material (such as silicon oxide, silicon nitride, or a metallic material), or may comprise a photoresist material depending on the nature of a subsequent process that is performed to remove the sacrificial fill materials of the third-tier sacrificial opening fill structures (348, 318), the second-tier sacrificial opening fill structures (248, 218), and the first-tier sacrificial opening fill structures (148, 118). The third-tier sacrificial opening fill structures (348, 318), the second-tier sacrificial opening fill structures (248, 218), and the first-tier sacrificial opening fill structures (148, 118) can be subsequently removed selective to the materials of the insulating layers (132, 232, 332), the sacrificial material layers (142, 242, 342), and the in-process source-level material layers 110' by performing a selective removal process. The selective removal process may comprise an ashing process, or a selective etch process (such as a wet etch process or a reactive ion etch process). Memory openings are formed in each volume from which a combination of a third-tier sacrificial memory opening fill structure 348, the second-tier sacrificial memory opening fill structure 248, and the first-tier sacrificial memory opening fill structure 148 is removed. The memory openings extend through multiple tier structures, and thus, are herein referred to as multi-tier memory openings. Support openings are formed in each volume from which a combination of a third-tier sacrificial support opening fill structure 318, the second-tier sacrificial support opening fill structure 218, and the first-tier sacrificial support opening fill structure 118 is removed. The mask layer can be subsequently removed, for example, by ashing.

FIGS. 18A-18D are sequential vertical cross-sectional views of a region around an multi-tier memory opening 49 during formation of a memory opening fill structure 58 according to an embodiment of the present disclosure.

Figure 18B:
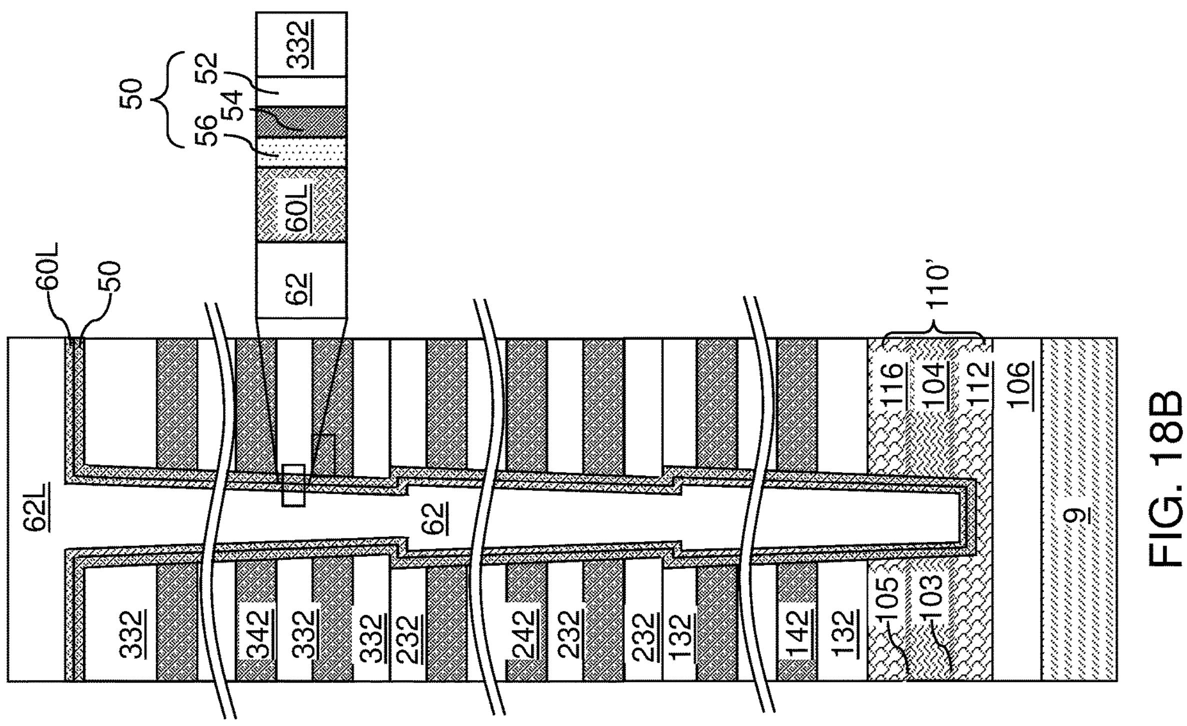
FIGS. 18A-18D are sequential vertical cross-sectional views of a region around an multi-tier memory opening during formation of a memory opening fill structure according to an embodiment of the present disclosure.
Figure 18A:
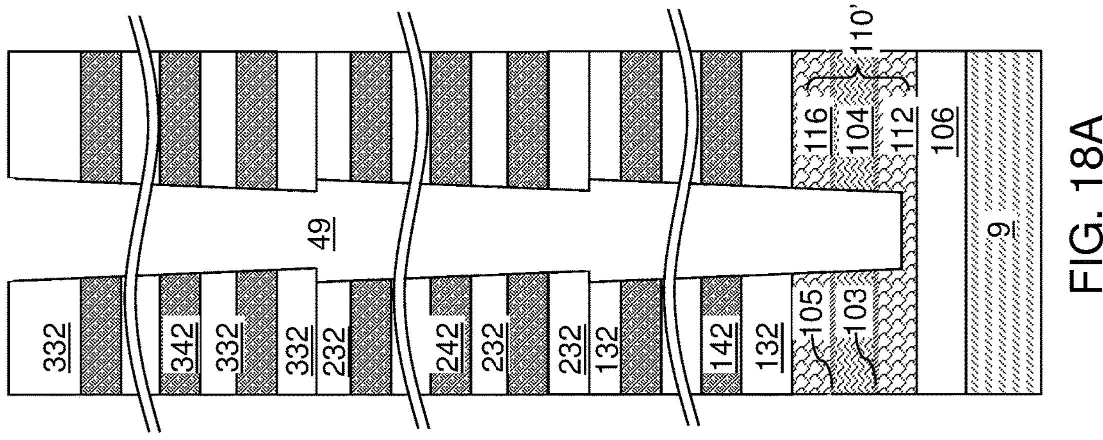

Referring to FIG. 18A, a memory opening 49 of the exemplary structure is illustrated.

Referring to FIG. 18B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0\times10^{13}/cm^3$ to $3.0\times10^{17}/cm^3$, such as $1.0\times10^{14}/cm^3$ to $3.0\times10^{16}/cm^3$, although lesser and greater atomic concentrations may also be employed. A dielectric core layer 62L comprising a dielectric fill material (e.g., silicon oxide) can be deposited in remaining volumes of the memory openings 49 and over the third-tier alternating stack (332, 342).

Figures 18C, 18D:
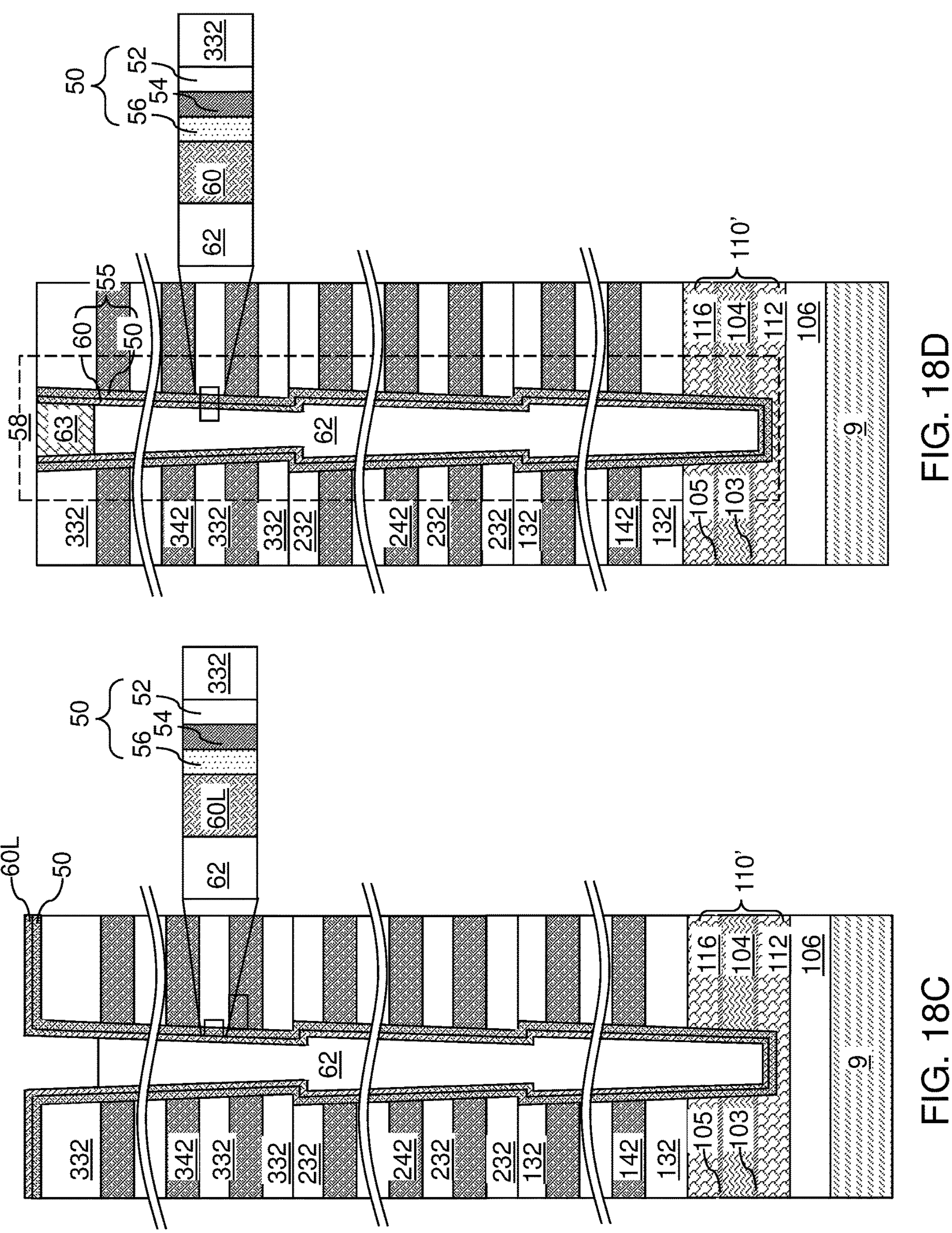

Referring to FIG. 18C, the dielectric core layer 62L can be vertically recessed such that each remaining portion of the dielectric core layer 62L has a top surface at, or about, the horizontal plane including the bottom surface of the topmost third-tier insulating layer 332. Each remaining portion of the dielectric core layer 62L constitutes a dielectric core 62.

Figure 19A:
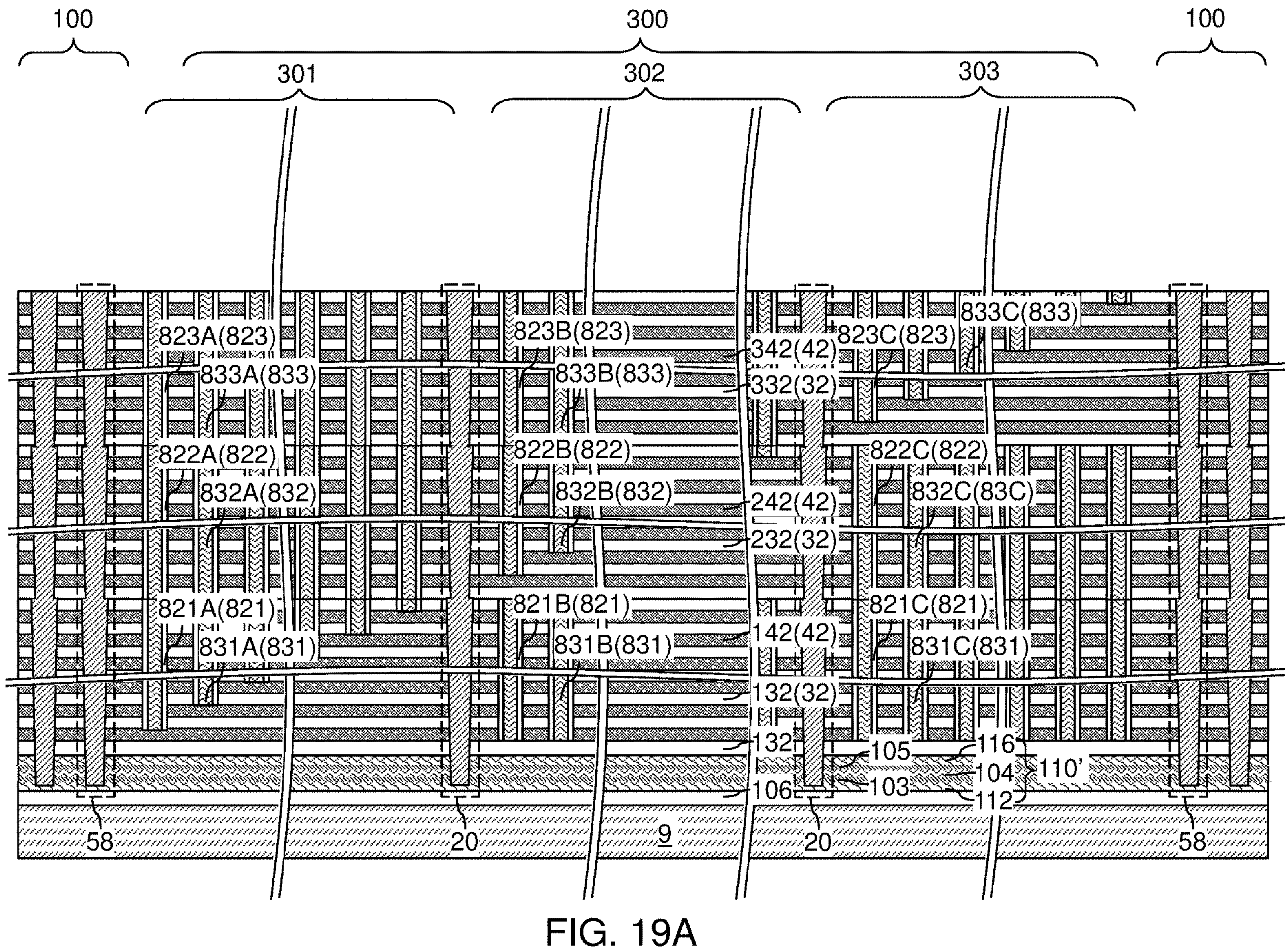
FIG. 19A is a vertical cross-sectional view of the exemplary structure after formation of memory opening fill structures and support pillar structures according to an embodiment of the present disclosure.
Figure 19B:
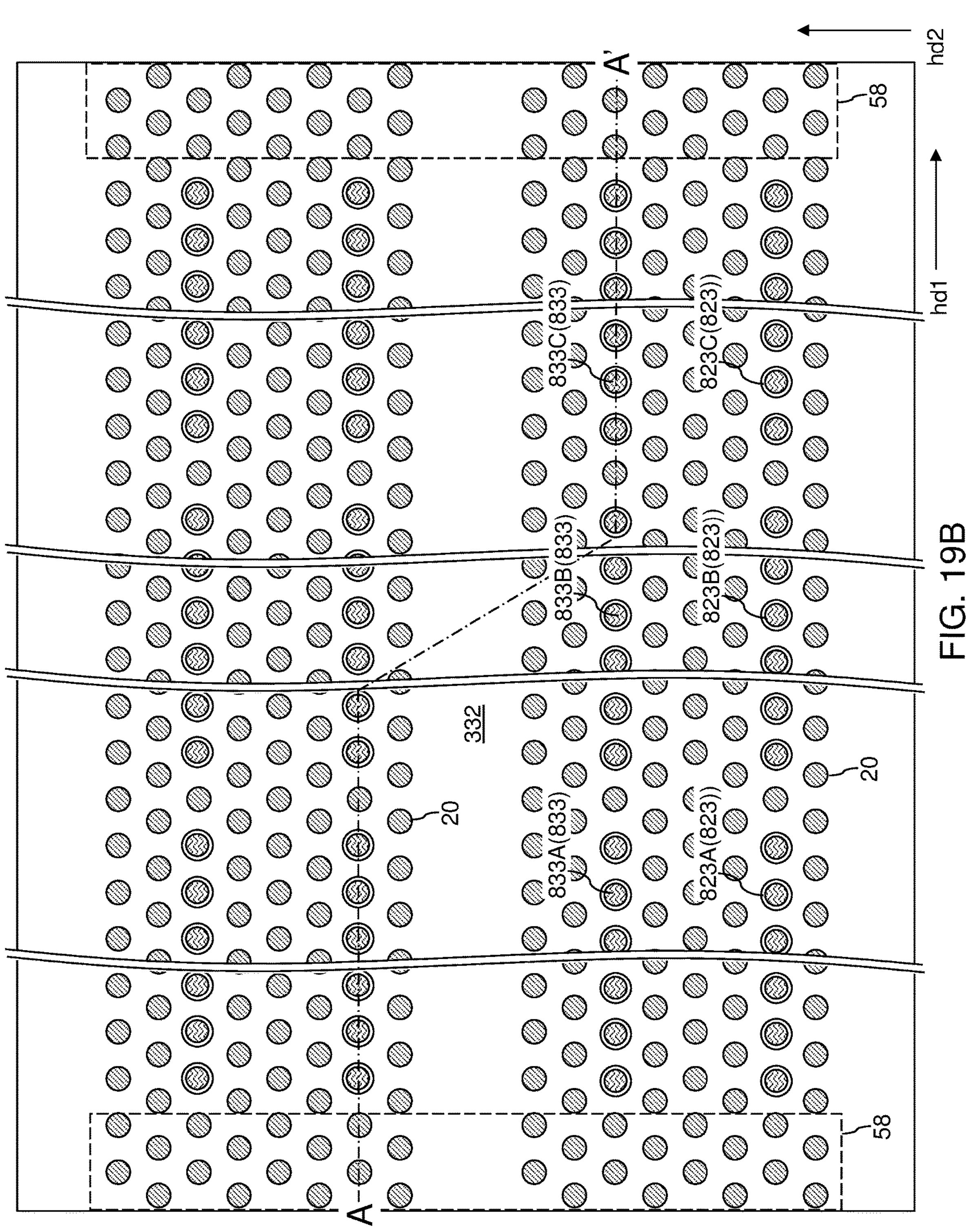
FIG. 19B is a top-down view of the exemplary structure of FIG. 19A. The hinged vertical plane A-A' is a cut plane of the vertical cross-sectional view of FIG. 19A.

Referring to FIGS. 18D, 19A, and 19B, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost third-tier insulating layer 332, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42. Generally, a memory opening fill structure 58 comprising a memory film 50 and a vertical semiconductor channel 60 can be formed in each memory opening 49.

In one embodiment, each support opening may be filled with a support pillar structure 20 having a same set of materials as a memory opening fill structure 58. In an alternative embodiment, sacrificial fill materials in the support openings may be removed prior to or after the processing steps described with reference to FIGS. 18A-18D, and each of the support openings may be filled with a dielectric fill material, such as silicon oxide. In this case, each support pillar structure 20 may consist essentially of at least one dielectric fill material, and thus, may include a different material than the materials of each memory opening fill structure 58.

While an embodiment is described in which three alternating stacks are formed, other embodiments are expressly contemplated herein, which may contain only two alternating stacks, or may contain K alternating stacks in which K is an integer greater than 3.

Figure 20A:
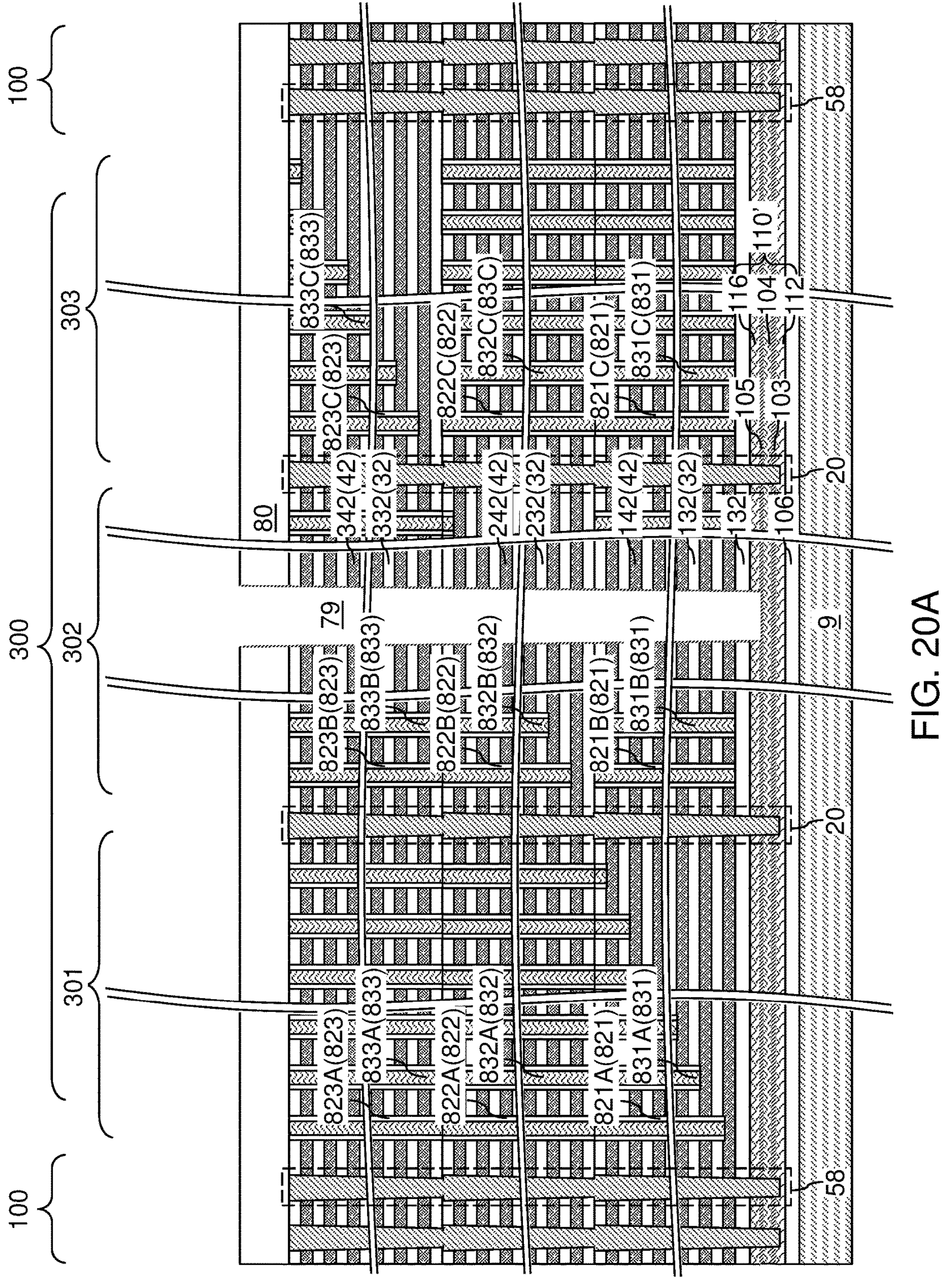
FIG. 20A is a vertical cross-sectional view of the exemplary structure after formation of a contact-level dielectric layer and lateral isolation trenches according to an embodiment of the present disclosure.
Figure 20B:
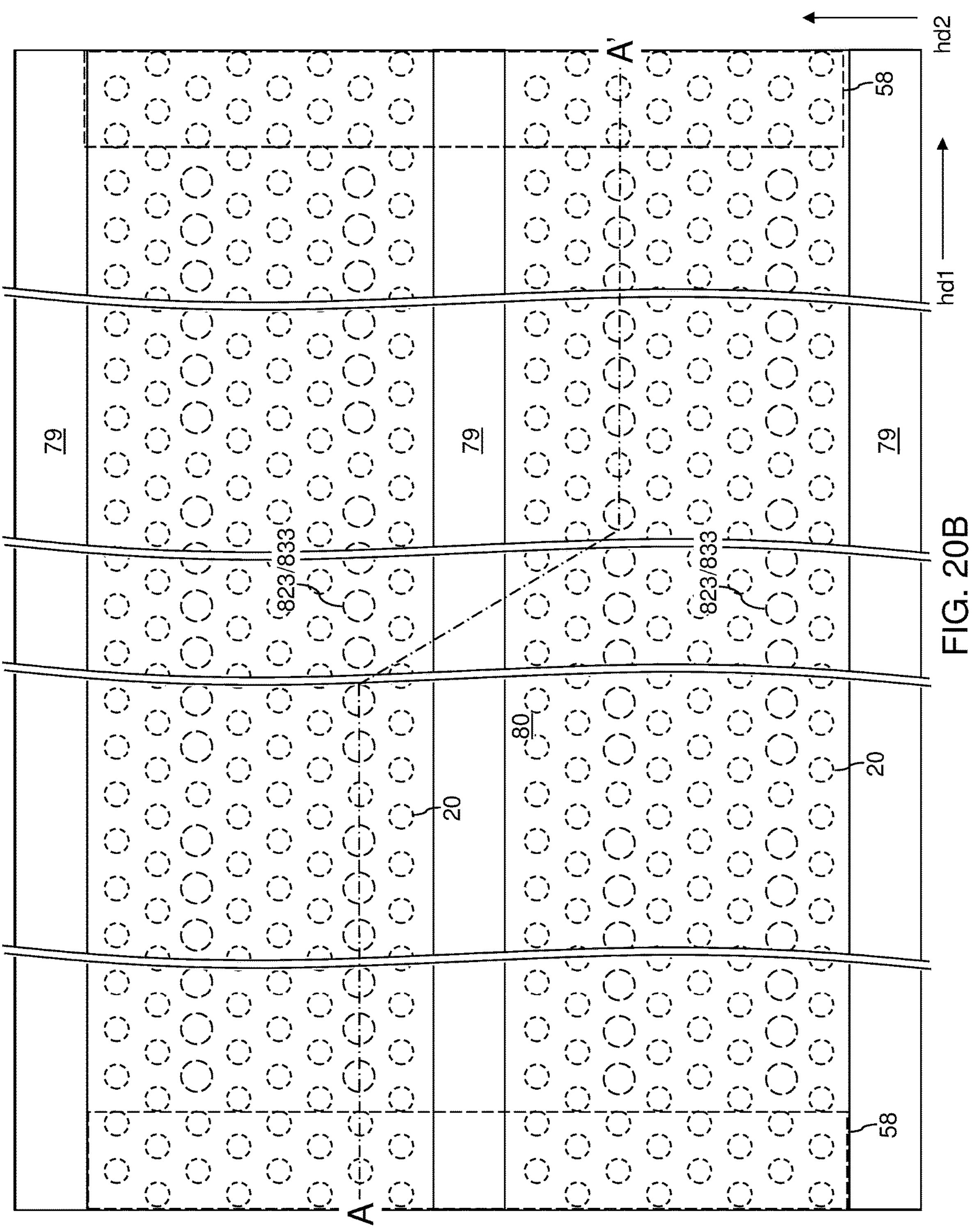
FIG. 20B is a top-down view of the exemplary structure of FIG. 20A. The hinged vertical plane A-A' is a cut plane of the vertical cross-sectional view of FIG. 20A.

Referring to FIGS. 20A and 20B, a dielectric material, such as undoped silicate glass or a doped silicate glass, can be deposited over third-tier alternating stack (332, 342) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stacks {(132, 142), (232, 242), (332, 342)}, and the in-process source-level material layers 110'. Lateral isolation trenches 79 laterally extending along the first horizontal direction hd1 (which may be a word line direction) can be formed through the contact-level dielectric layer 80, the alternating stacks {(132, 142), (232, 242), (332, 342)}, and the in-process source-level material layers 110'. Each of the lateral isolation trenches 79 may comprise a respective pair of lengthwise sidewalls that are parallel to the first horizontal direction hd1 and vertically extend from the stopper-tier insulating layer 106 to the top surface of the contact-level dielectric layer 80. A top surface of the stopper-tier insulating layer 106 can be physically exposed underneath each lateral isolation trench 79. The photoresist layer can be subsequently removed, for example, by ashing.

Figure 21A:
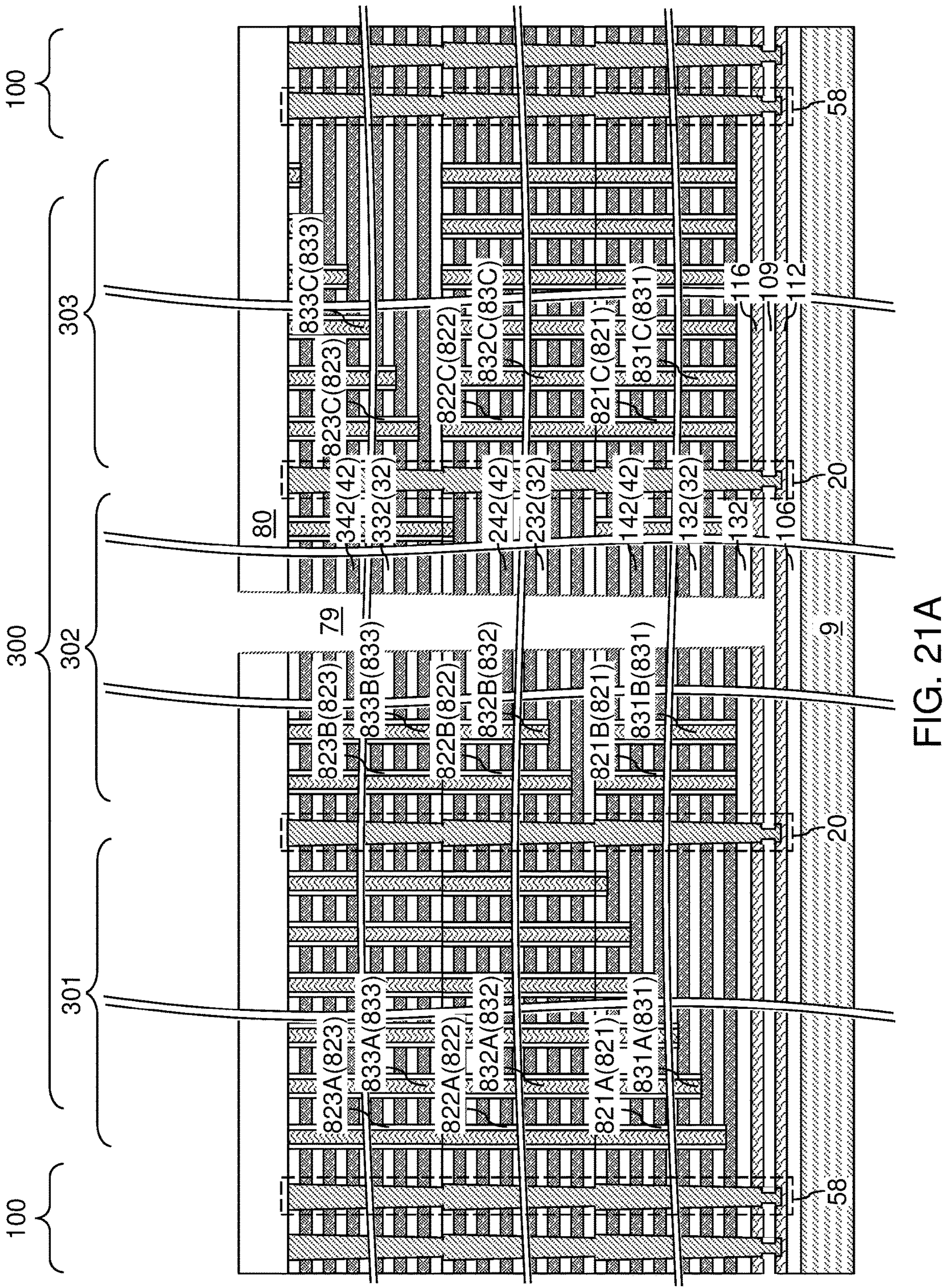
FIG. 21A is a vertical cross-sectional view of the exemplary structure after formation of a source cavity according to an embodiment of the present disclosure.
Figure 21B:
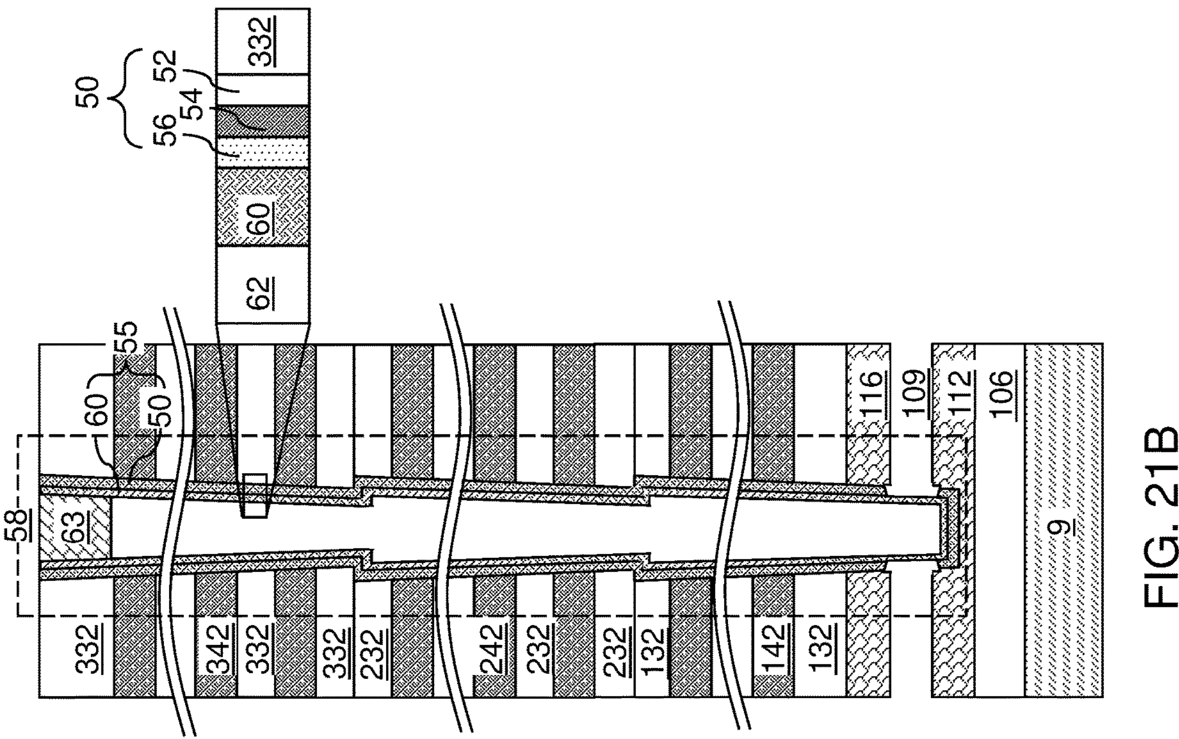
FIG. 21B is a magnified view of a region of the exemplary structure of FIG. 21A around a memory opening fill structure.

Referring to FIGS. 21A and 21B, an etchant that etches the material of the source-level sacrificial layer 104 selective to the materials of the alternating stacks {(132, 142), (232, 242), (332, 342)}, the contact-level dielectric layer 80, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stacks {(132, 142), (232, 242), (332, 342)}, the contact-level dielectric layer 80, the lower source-level semiconductor layer 112, and the upper source-level semiconductor layer 116. A source cavity 109 is formed in the volume from which the source-level sacrificial layer 104 is removed. Each of the memory opening fill structures 58 is physically exposed to the source cavity 109. Specifically, each of the memory opening fill structures 58 includes a sidewall that is physically exposed to the source cavity 109.

A sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 22A:
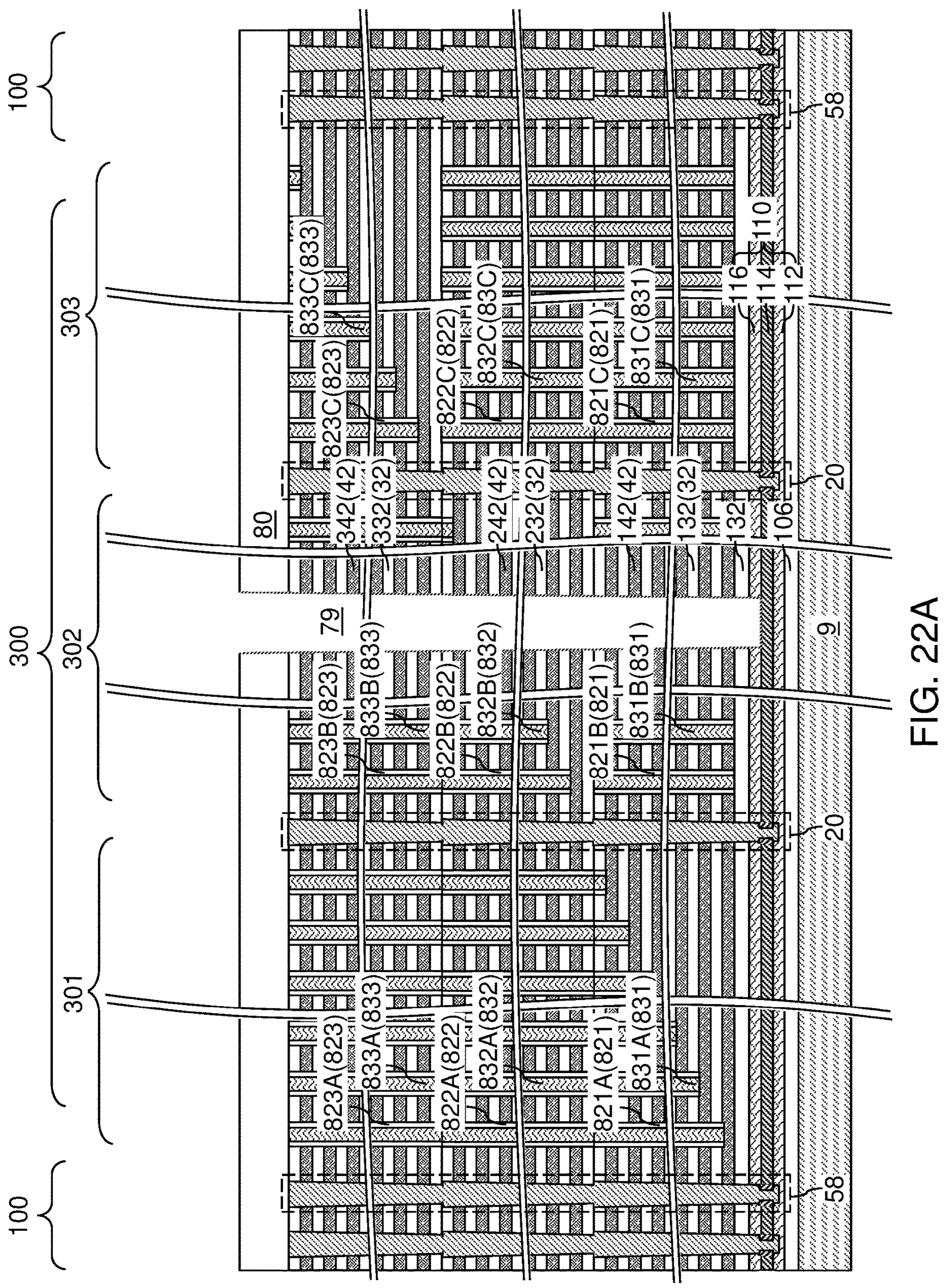
FIG. 22A is a vertical cross-sectional view of the exemplary structure after formation of a source contact layer according to an embodiment of the present disclosure.
Figure 22B:
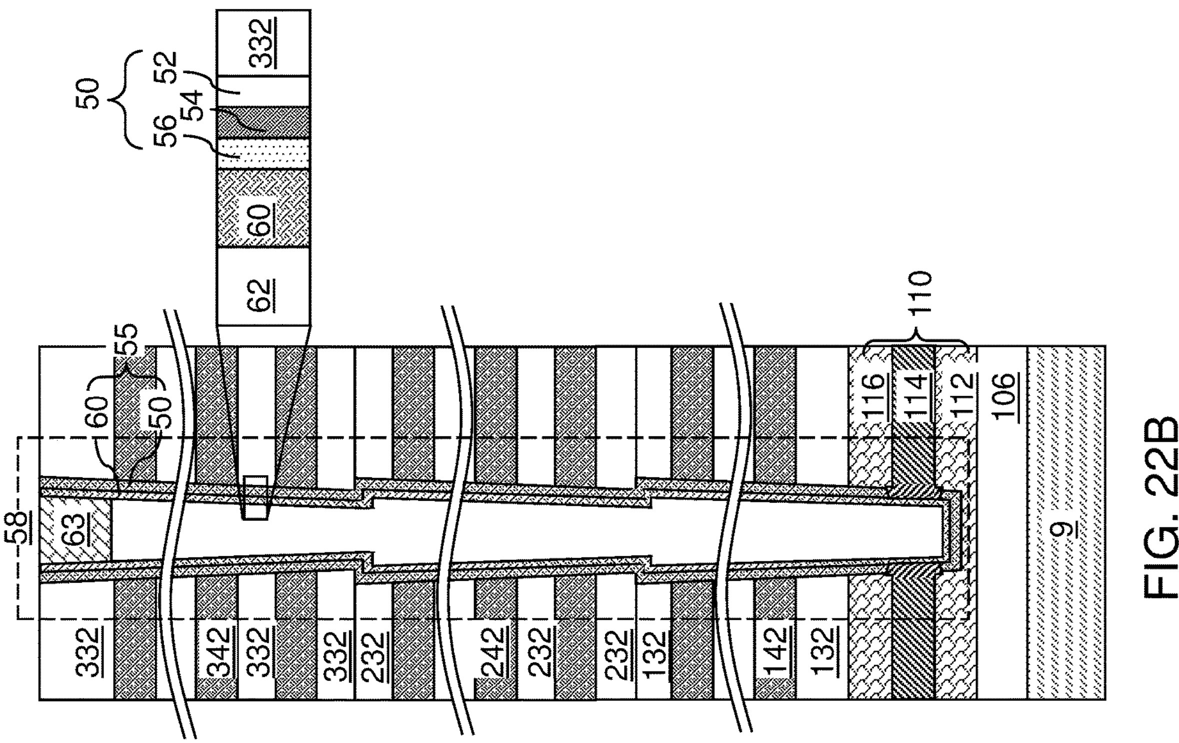
FIG. 22B is a magnified view of a region of the exemplary structure of FIG. 22A around a memory opening fill structure.

Referring to FIGS. 22A and 22B, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{19}/cm^3$ to $2.0\times10^{21}/cm^3$, such as from $1.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The layer stack including the lower source-level semiconductor layer 112, the source contact layer 114, and the upper source-level semiconductor layer 116 constitutes a source layer 110, which replaces the in-process source-level material layers 110'. The source layer 110 underlies the first-tier alternating stack (132, 146), and each the vertical semiconductor channel 60 contacts a respective surface of the source layer 110.

Figure 23:
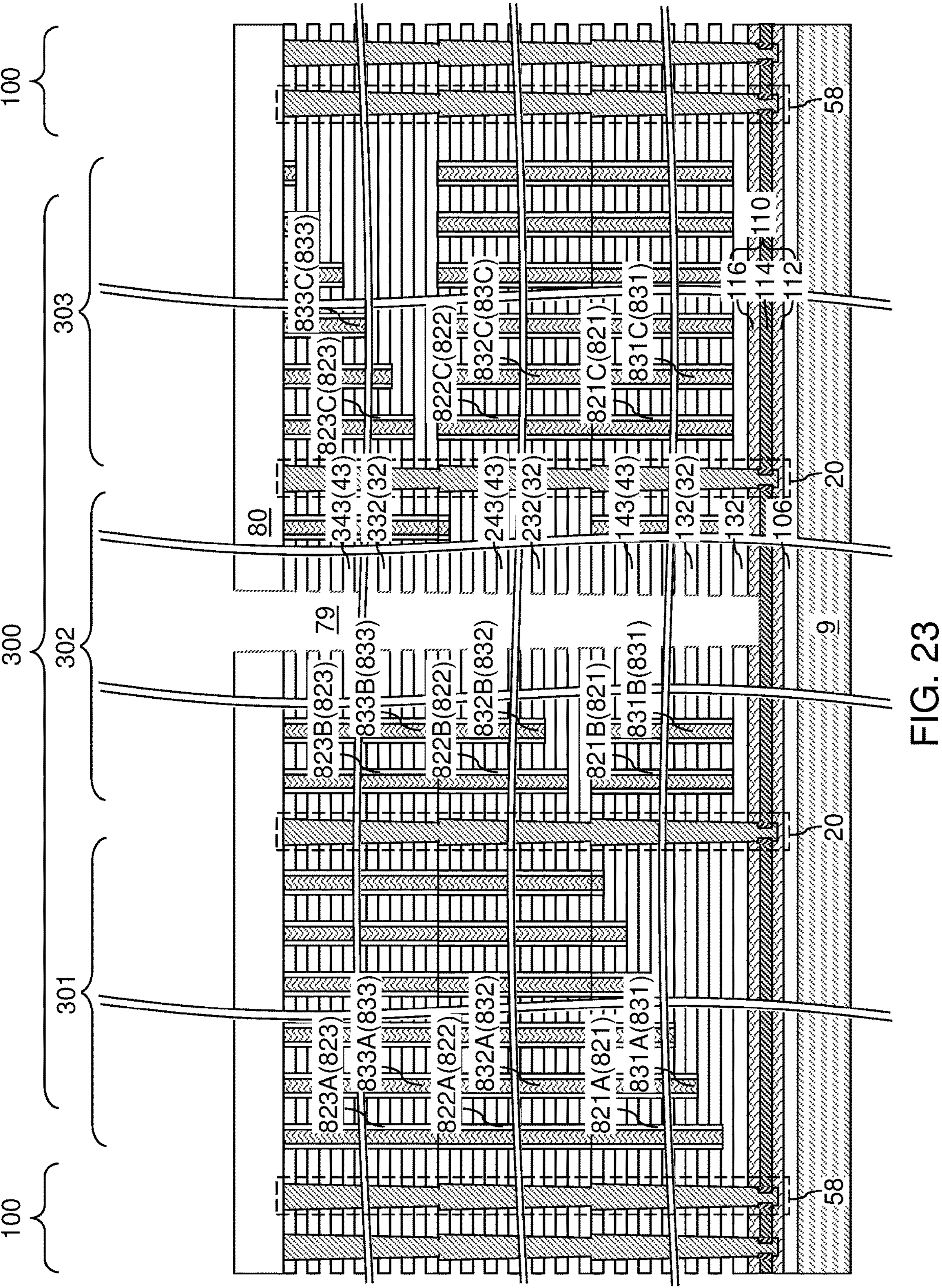
FIG. 23 is a vertical cross-sectional view of the exemplary structure after formation of laterally-extending cavities according to an embodiment of the present disclosure.

Referring to FIG. 23, an isotropic etch process can be performed to remove the sacrificial material layers (142, 242, 342) selective to the insulating layers (132, 232, 332), the stopper-tier insulating layer 106, the memory opening fill structures 58, and the source layer 110. In an illustrative example, the insulating layers (132, 232, 332) may comprise silicon oxide, the sacrificial material layers (142, 242, 342) may comprise silicon nitride. In this case, the isotropic etch process that removes the sacrificial material layers (142, 242, 342) may comprise a wet etch process employing hot phosphoric acid. Laterally-extending cavities 43 can be formed in volumes from which the sacrificial material layers (142, 242, 342) are removed. The laterally-extending cavities 43 may comprise first-tier laterally-extending cavities 143 that are formed in volumes from which first-tier sacrificial material layers 142 are removed; second-tier laterally-extending cavities 243 that are formed in volumes from which second-tier sacrificial material layers 242 are removed; and third-tier laterally-extending cavities 343 that are formed in volumes from which third-tier sacrificial material layers 342 are removed. Sidewall surface segments of the memory opening fill structures 58 can be physically exposed to the laterally-extending cavities 43.

Figure 24:
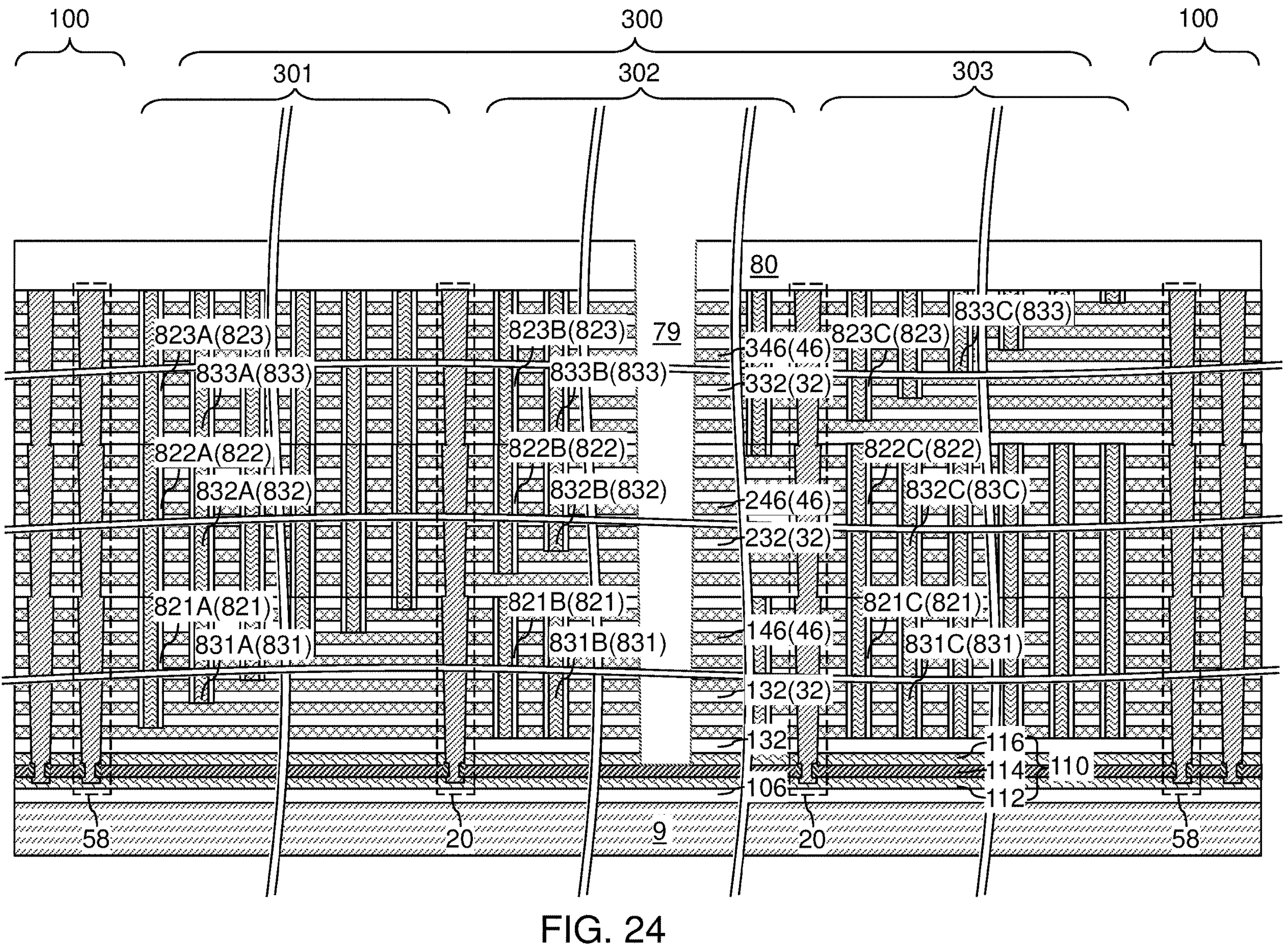
FIG. 24 is a vertical cross-sectional view of the exemplary structure after formation of-tier electrically conductive layers according to an embodiment of the present disclosure.

Referring to FIG. 24, an outer blocking dielectric layer (not shown), such as an aluminum oxide layer, can be optionally formed in the laterally-extending cavities 43 by a conformal deposition process. At least one conductive material, such as at least one metallic material, can be conformally deposited in the laterally-extending cavities 43. The at least one conductive material may comprise, for example, a combination of a metallic barrier material and a metallic fill material. The metallic barrier material may comprise, for example, TiN, TaN, WN, MON, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the lateral isolation trenches 79 or above the contact-level dielectric layer 80 can be removed by performing an etch-back process, which may comprise an isotropic etch process and/or an anisotropic etch process. Each remaining portion of the at least one conductive material filling a respective one of the laterally-extending cavities 43 constitutes an electrically conductive layer 46. Specifically, the electrically conductive layer 46 may comprise first-tier electrically conductive layers 146 that are formed in the first-tier laterally-extending cavities 143, second-tier electrically conductive layers 246 that are formed in the second-tier laterally-extending cavities 243, and third-tier electrically conductive layers 346 that are formed in the third-tier laterally-extending cavities 343. An alternating stack of insulating layers 32 and electrically conductive layers 46 can be formed between each neighboring pair of lateral isolation trenches 79 over the carrier substrate 9. A plurality of alternating stacks of insulating layers 32 and electrically conductive layers 46 can be laterally spaced apart among one another by the lateral isolation trenches 79.

Figure 25A:
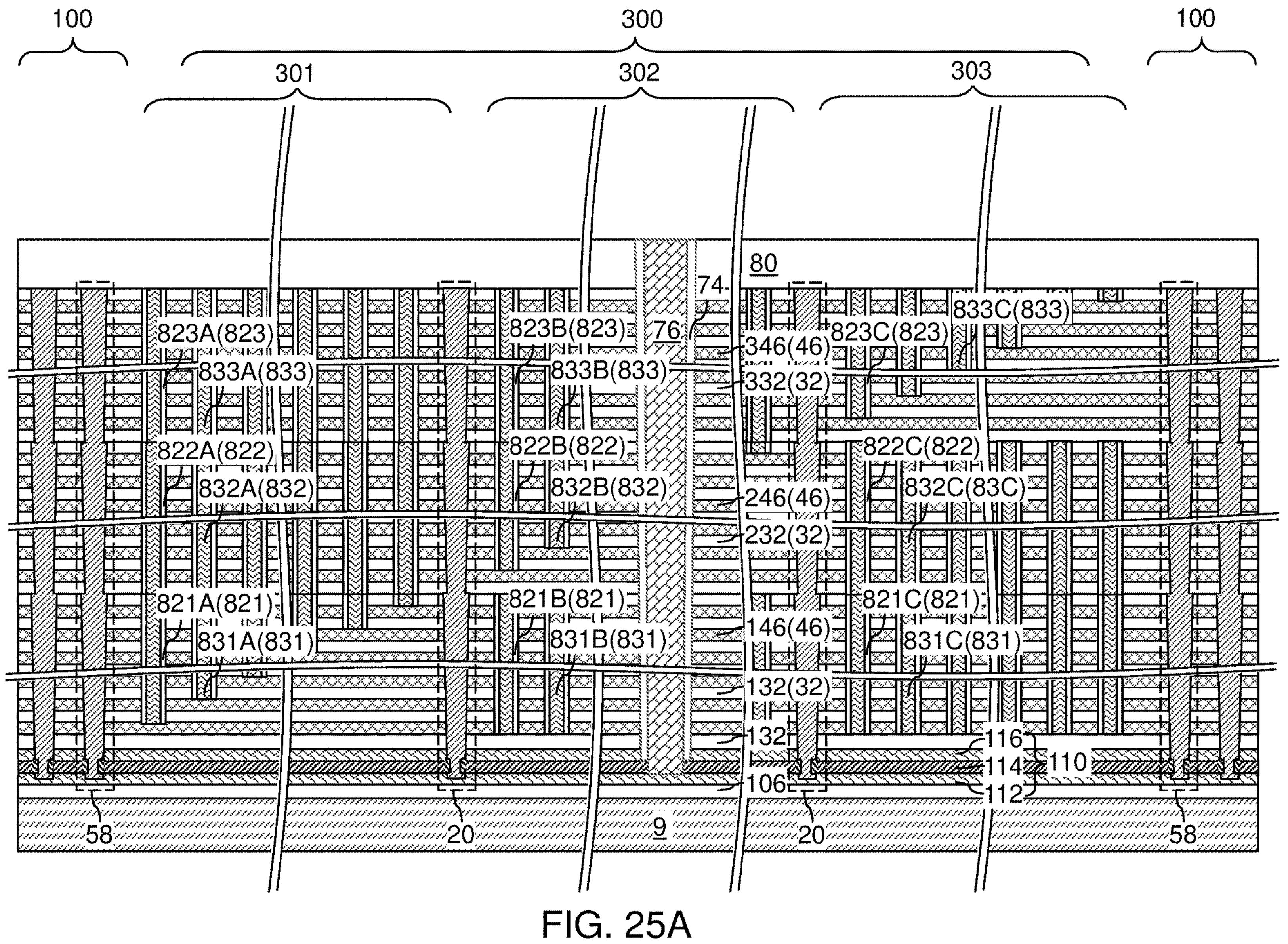
FIG. 25A is a vertical cross-sectional view of the exemplary structure after formation of isolation trench fill structures according to an embodiment of the present disclosure.
Figure 25B:
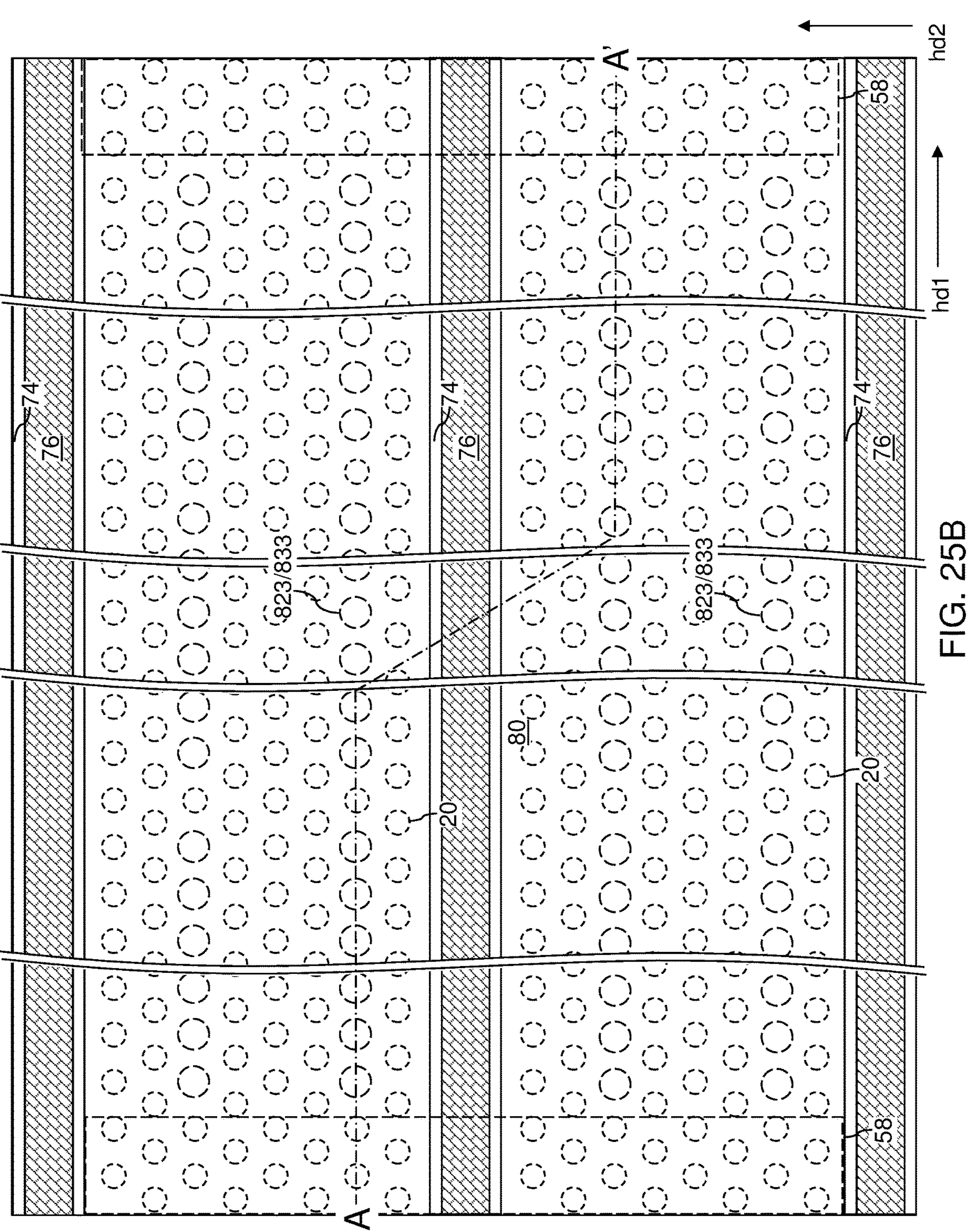
FIG. 25B is a top-down view of the exemplary structure of FIG. 25A. The hinged vertical plane A-A' is a cut plane of the vertical cross-sectional view of FIG. 25A.

Referring to FIGS. 25A and 25B, an insulating spacer material layer can be conformally deposited in the lateral isolation trenches 79 and over the contact-level dielectric layer 80. An optional anisotropic etch process may be performed to remove horizontally-extending portions of the insulating spacer material layer. Each remaining laterally-elongated tubular portion of the insulating spacer material layer in peripheral regions of the lateral isolation trenches 79 constitute an insulating spacer 74. At least one conductive fill material (such as at least one metallic fill material) may be optionally conformally deposited in remaining volumes of the lateral isolation trenches 79. Excess portions of the at least one conductive fill material may be removed from above the contact-level dielectric layer 80, for example, by a planarization process, which may employ a recess etch process and/or a chemical mechanical polishing process. Each remaining portion of the at least one conductive fill material that fills a respective lateral isolation trench 79 constitutes a conductive wall structure 76. Each contiguous combination of an insulating spacer 74 and a conductive wall structure 76 constitutes an isolation trench fill structure (74, 76) that fills a respective lateral isolation trench 79. Alternatively, each lateral isolation trench 79 may be filled only with at least one dielectric fill material to form isolation trench fill structures consisting essentially of at least one dielectric fill material.

Figure 26A:
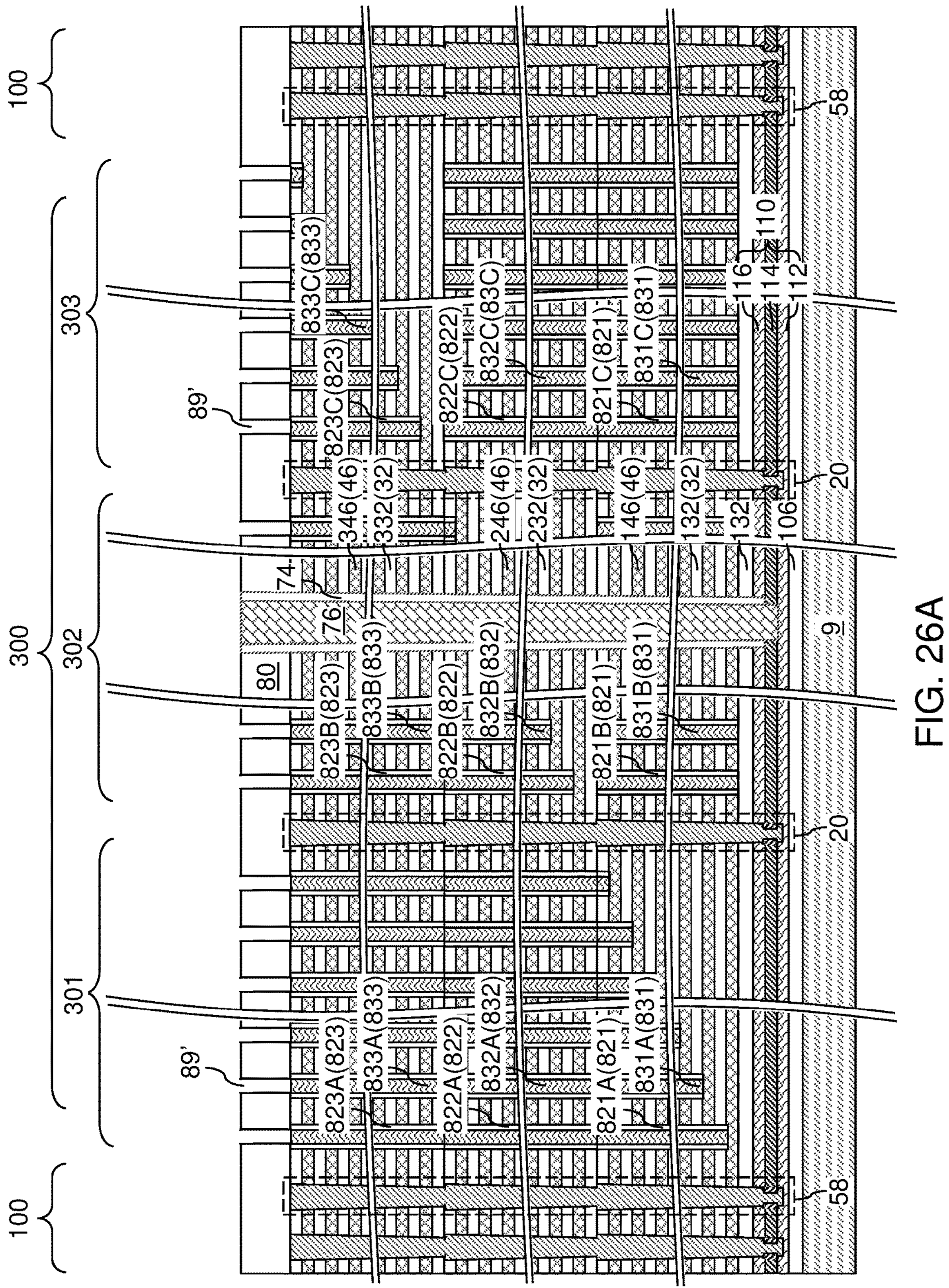
FIG. 26A is a vertical cross-sectional view of the exemplary structure after formation of connection via cavities according to an embodiment of the present disclosure.
Figure 26B:
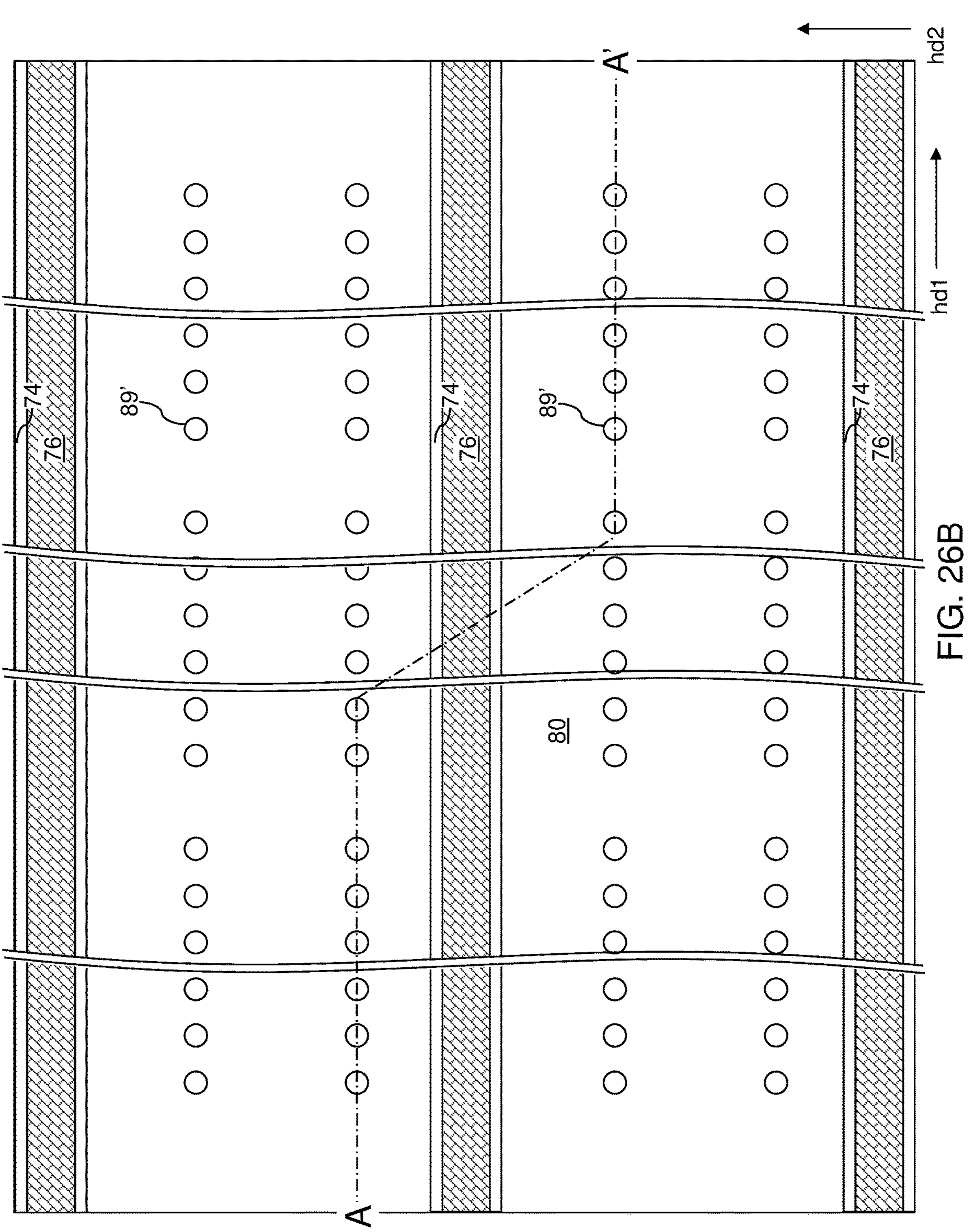
FIG. 26B is a top-down view of the exemplary structure of FIG. 26A. The hinged vertical plane A-A' is a cut plane of the vertical cross-sectional view of FIG. 26A.

Referring to FIGS. 26A and 26B, a photoresist layer (not shown) can be applied over the contact-level dielectric layer 80, and can be lithographically patterned to form openings in areas that overlie the third-tier pillar structures 833. In one embodiment, the pattern of the openings in the photoresist layer may be the same as the pattern of the third-tier pillar structures 833 in a plan view, i.e., a view along the vertical direction. An anisotropic etch process can be performed to form via cavities through the contact-level dielectric layer 80. The via cavities that are formed through the contact-level dielectric layer 80 are herein referred to as connection via cavities 89'. A top surface of a third-tier pillar structure 833 can be physically exposed at the bottom of each of the connection via cavities 89'. The photoresist layer can be subsequently removed, for example, by ashing.

Figure 27A:
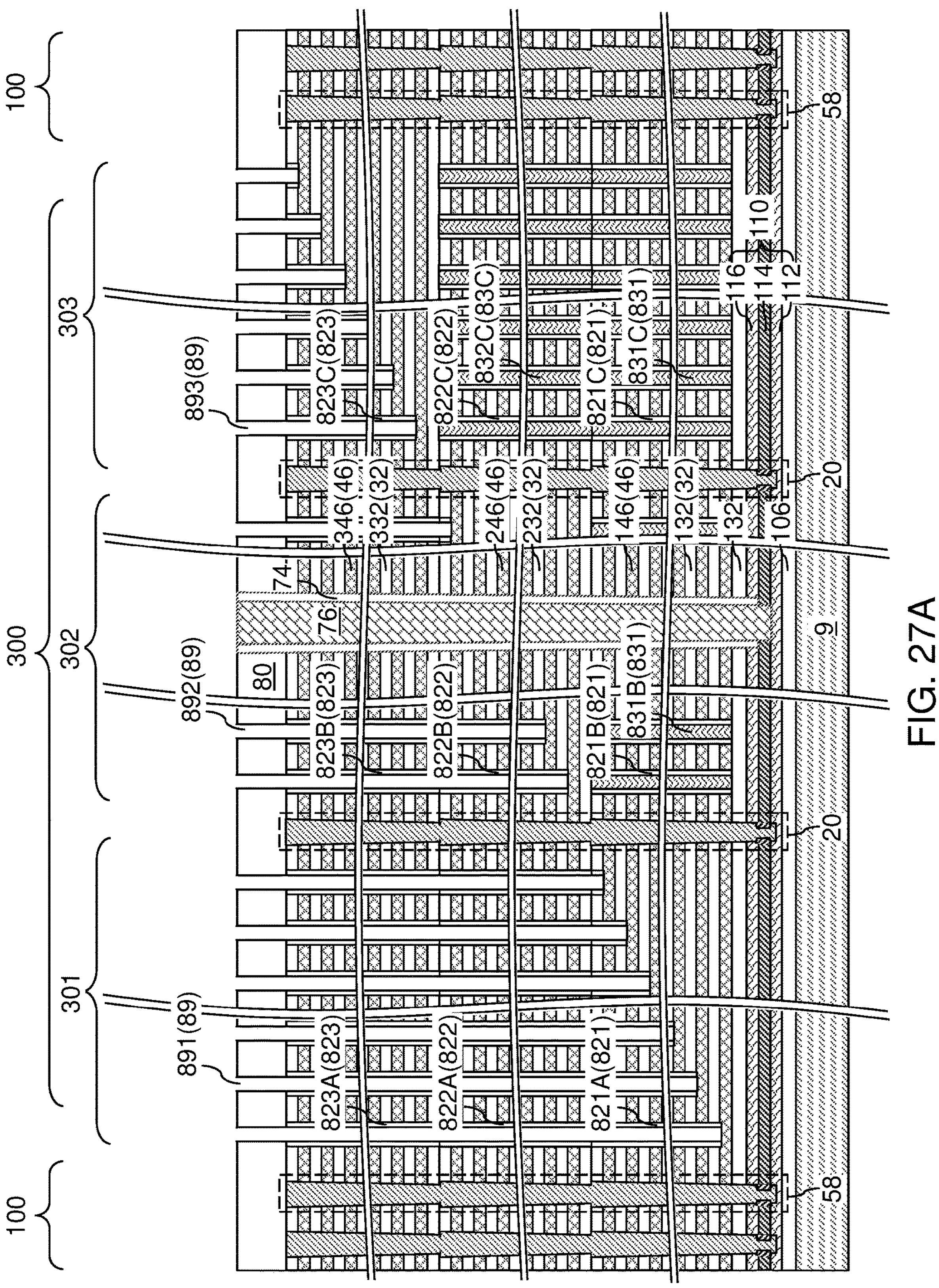
FIG. 27A is a vertical cross-sectional view of the exemplary structure after formation of layer contact via cavities according to an embodiment of the present disclosure.
Figure 27B:
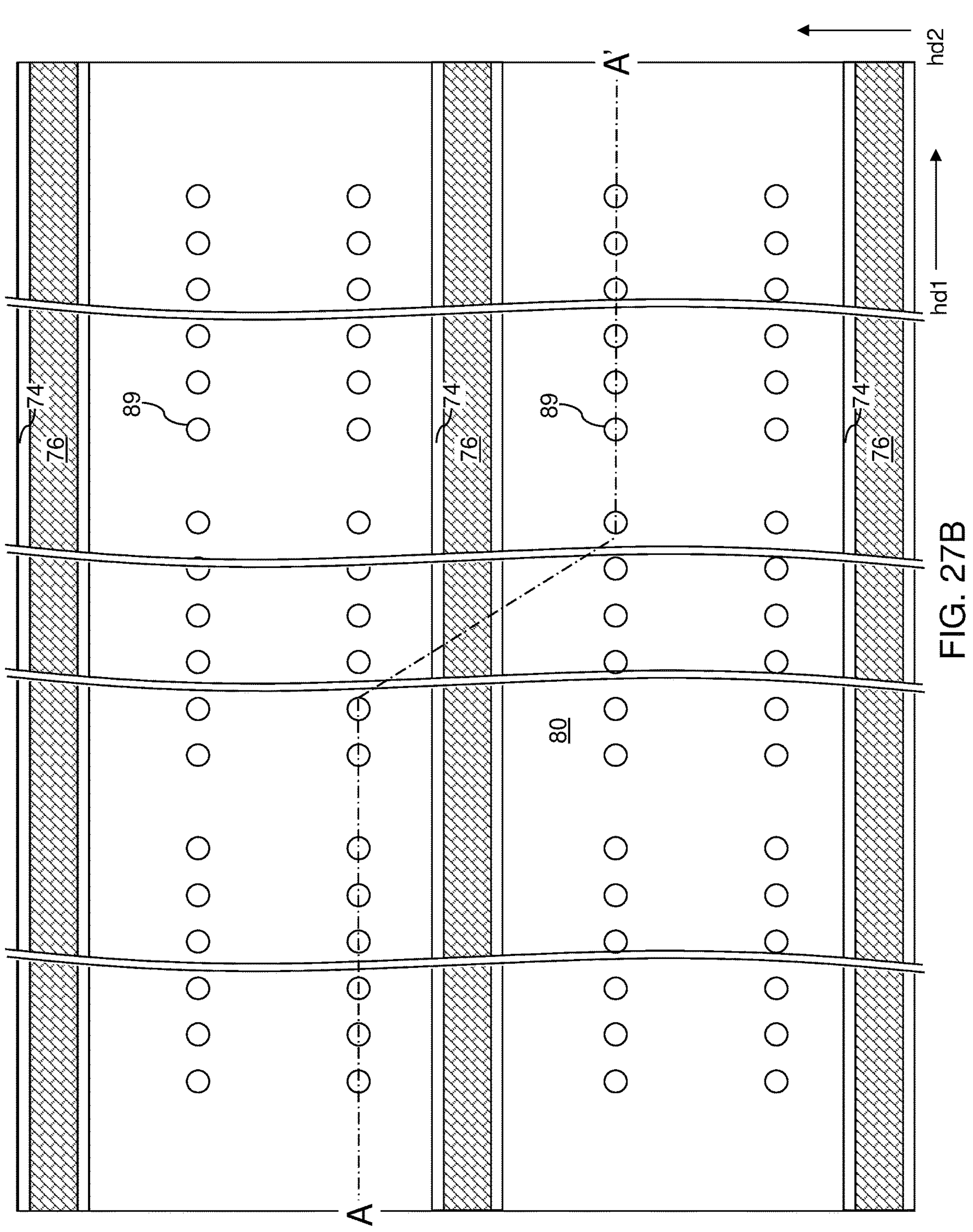
FIG. 27B is a top-down view of the exemplary structure of FIG. 27A. The hinged vertical plane A-A' is a cut plane of the vertical cross-sectional view of FIG. 27A.

Referring to FIGS. 27A and 27B, the sacrificial via fill materials of the pillar structures (833, 832, 831) that are exposed in the connection via cavities 89' can be removed by a selective removal process. The selective removal process may comprise a wet etch process, a reactive ion etch process, or an ashing process. The connection via cavities 89' function as conduits for transmission of an etchant or an oxidant during the selective removal process.

According to an aspect of the present disclosure, the entirety of the third-tier pillar structure 833, the first-type second-tier pillar structures 832A, the second-type second-tier pillar structures 832B, and the first-type first-tier pillar structures 831A can be removed by the selective removal process. However, the third-type second-tier pillar structures 832C and the third-type first-tier pillar structures 831C are vertically spaced from overlying third-type third-tier pillar structures 833C by at least the bottommost third-tier insulating layer 332, and therefore, are not removed during the selective removal process. Further, the second-type first-tier pillar structures 831B are vertically spaced from overlying second-type second-tier pillar structures 832B by at least the bottommost second-tier insulating layer 232, and therefore, are not removed during the selective removal process.

Layer contact via cavities 89 are formed in the combination of the volumes of the connection via cavities 89' and the volumes from which the third-tier pillar structure 833, the first-type second-tier pillar structures 832A, the second-type second-tier pillar structures 832B, and the first-type first-tier pillar structures 831A are removed. The layer contact via cavities 89 comprises first via cavities 991 that are formed in the first contact region 301, second via cavities 992 that are formed in the second contact region 302, and third via cavities 993 that are formed in the third contact region 303. Each first via cavity 991 comprises a volume of a connection via structure 89', a volume of a void from which a first-type third-tier pillar structure 833A is removed, a volume of a void from which a first-type second-tier pillar structure 832A is removed, and a volume of a void from which a first-type first-tier pillar structure 831A is removed. Each second via cavity 992 comprises a volume of a connection via structure 89', a volume of a void from which a second-type third-tier pillar structure 833B is removed, and a volume of a void from which a second-type second-tier pillar structure 832B is removed. Each third via cavity 993 comprises a volume of a connection via structure 89', and a volume of a void from which a third-type third-tier pillar structure 833C is removed.

Figure 28A:
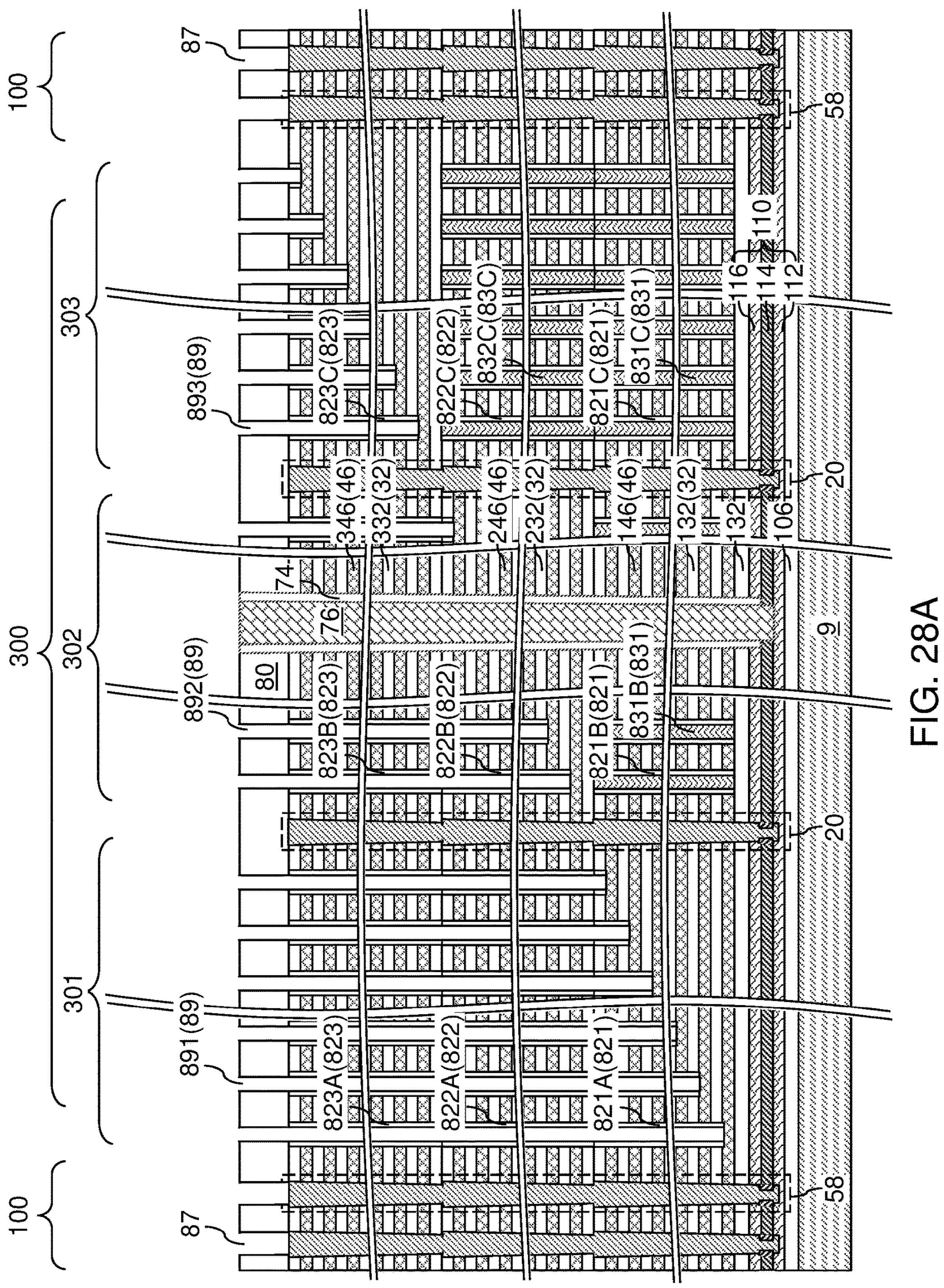
FIG. 28A is a vertical cross-sectional view of the exemplary structure after formation of drain contact via cavities according to an embodiment of the present disclosure.
Figure 28B:
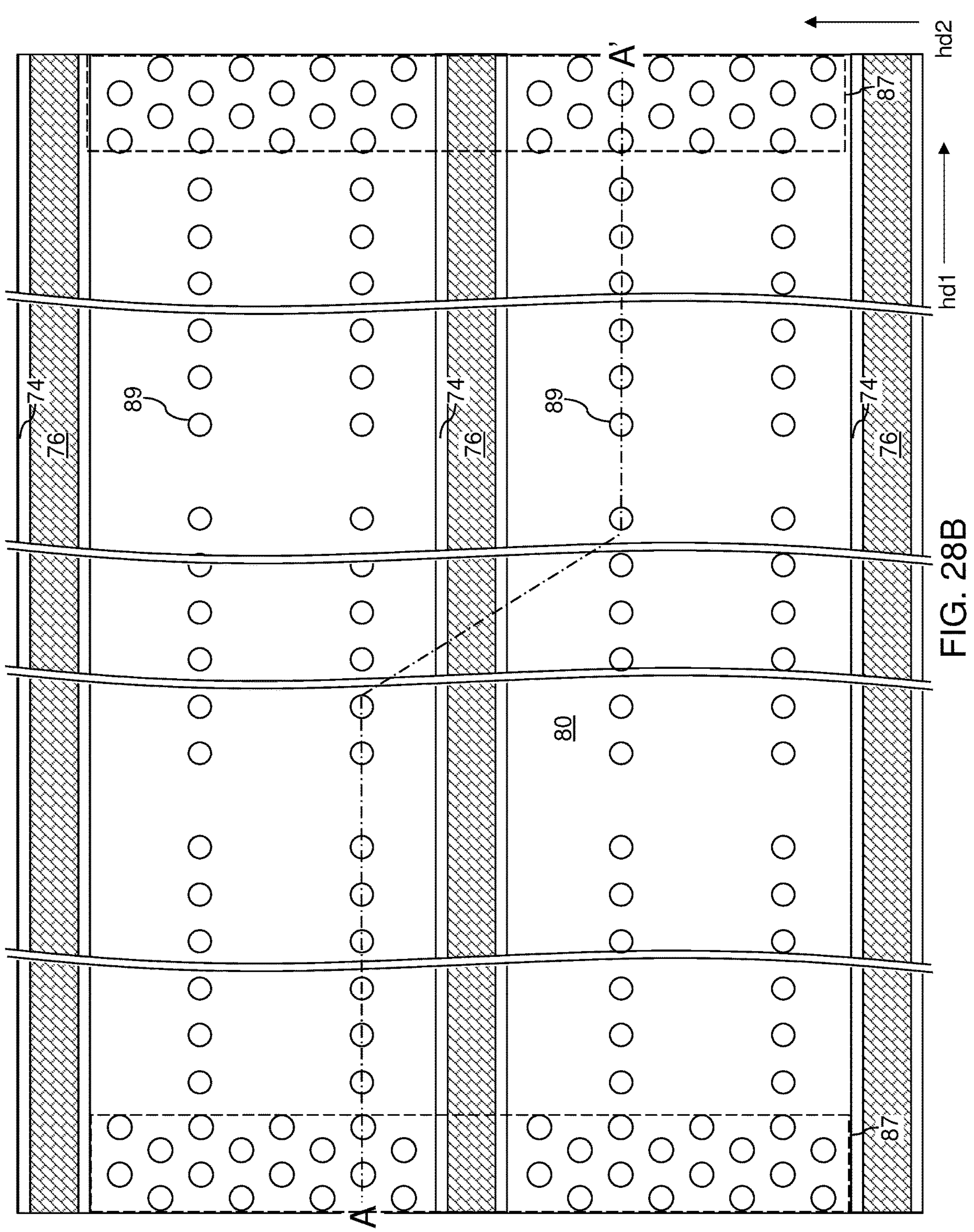
FIG. 28B is a top-down view of the exemplary structure of FIG. 28A. The hinged vertical plane A-A' is a cut plane of the vertical cross-sectional view of FIG. 28A.

Referring to FIGS. 28A and 28B, a photoresist layer (not shown) can be applied over the contact-level dielectric layer 80, and can be lithographically patterned to form openings in areas that overlie the memory opening fill structures 58. An anisotropic etch process can be performed to etch portions of the contact-level dielectric layer 80 that are not masked by the photoresist layer. Drain contact via cavities 87 can be formed through the contact-level dielectric layer 80. A top surface of a memory opening fill structure 58 (such as a top surface of a drain region 63) may be physically exposed at the bottom of each drain contact via cavity 87. The photoresist layer can be subsequently removed, for example, by ashing. Alternatively, the drain contact via cavities 87 may be formed during the same photolithography and etching steps as the connection via cavities 89'.

Figure 29A:
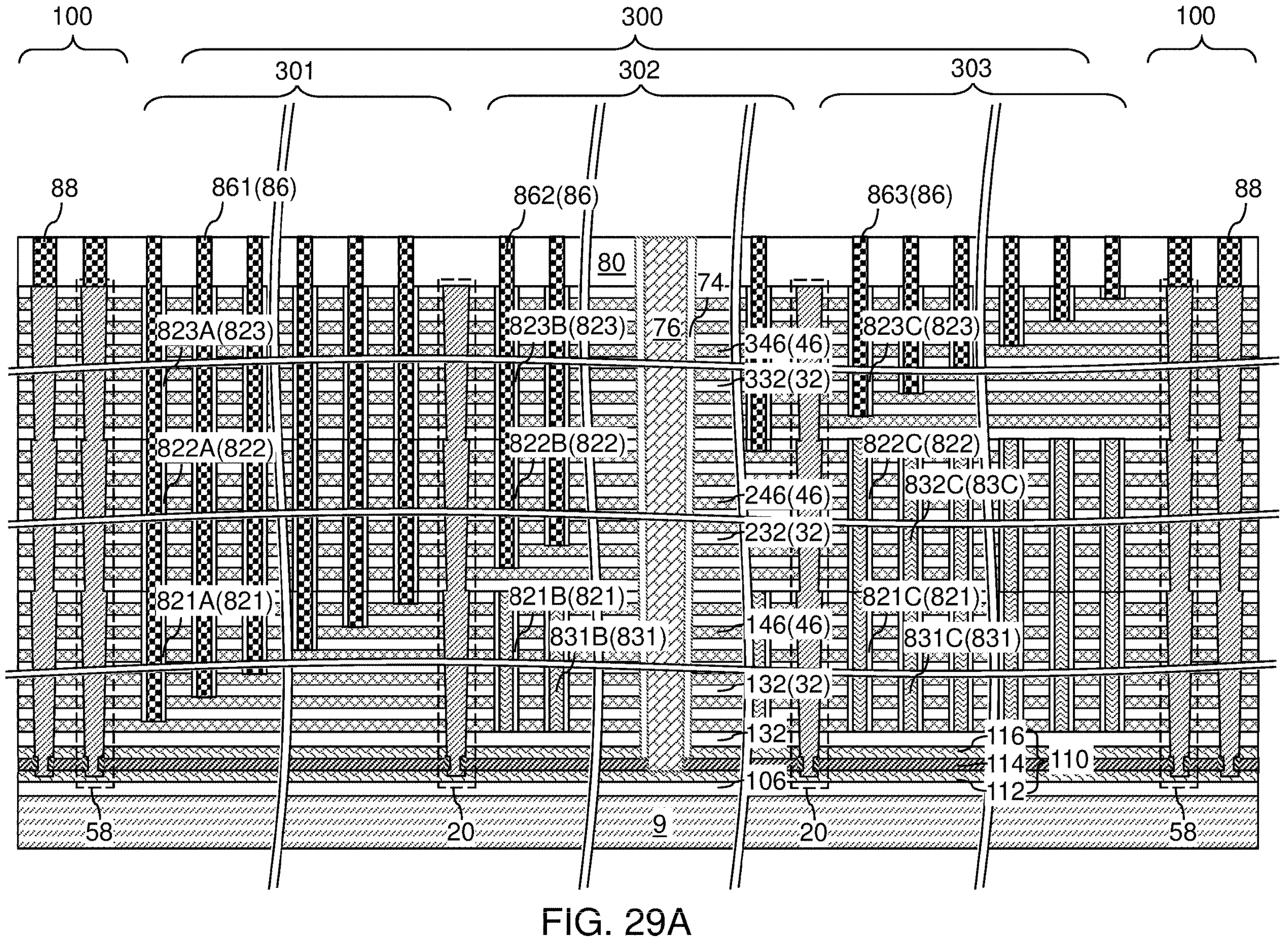
FIG. 29A is a vertical cross-sectional view of the exemplary structure after formation of layer contact via structures and drain contact via structures according to an embodiment of the present disclosure.
Figure 29B:
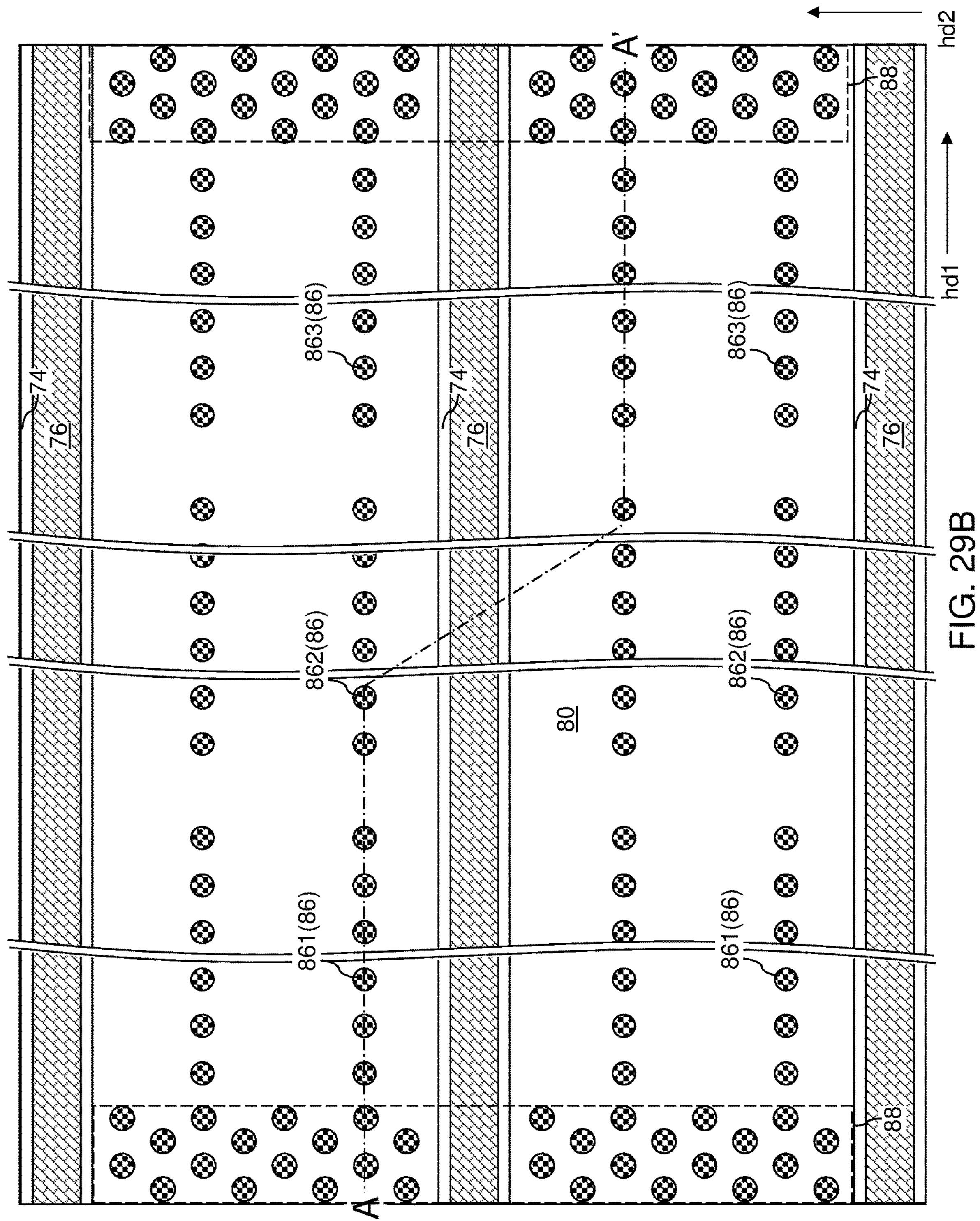
FIG. 29B is a top-down view of the exemplary structure of FIG. 28A. The hinged vertical plane A-A' is a cut plane of the vertical cross-sectional view of FIG. 28A.

Referring to FIGS. 29A and 29B, at least one electrically conductive material can be conformally deposited in each of the layer contact via cavities 89 and the drain contact via cavities 87. For example, a combination of an electrically conductive barrier material and an electrically conductive fill material can be deposited in the drain contact via cavities 87 and the layer contact via cavities 89. Excess portions of the at least one electrically conductive material can be removed from above the horizontal plane including the top surface of the contact-level dielectric layer 80 by a planarization process, which may employ a recess etch process and/or a chemical mechanical polishing process. Remaining portions of the at least one electrically conductive material that fill the drain contact via cavities 87 constitute drain contact via structures 88 contacting a top surface of a respective one of the drain regions 63. Remaining portions of at least one electrically conductive material that fill the layer contact via cavities 89 constitute layer contact via structures 86 contacting a top surface of a respective one of the electrically conductive layers 46.

The layer contact via structures 86 comprise first contact via structures 861 contacting a top surface of a respective one of the first-tier electrically conductive layers 146, second contact via structures 862 contacting a top surface of a respective one of the second-tier electrically conductive layers 246, and third contact via structures 863 contacting a top surface of a respective one of the third-tier electrically conductive layers 346. Generally, each contiguous combination of a first-type third-tier pillar structure 833A, a first-type second-tier pillar structure 832A, and the first-type first-tier pillar structure 831A can be replaced with a first contact via structure 861 that contacts a top surface of a respective one of the first-tier electrically conductive layers 146. Each contiguous combination of a second-type third-tier pillar structure 833B and a second-type second-tier pillar structure 832B can be replaced with a second contact via structure 862 that contacts a top surface of a respective one of the second-tier electrically conductive layers 246. Each third-type third-tier pillar structure 833C can be replaced with a third contact via structure 863 that contacts a top surface of a respective one of the third-tier electrically conductive layers 346. The second-type first-tier pillar structures 831B, the third-type first-tier pillar structures 831C, and the third-type second-tier pillar structures 832C do not change in structure or material composition during formation of the layer contact via structures 86.

Generally, each first-type first-tier tubular dielectric spacer 821A contacts a top surface segment of a respective one of the first-tier electrically conductive layers 146, and comprises a respective first inner sidewall contacting a first cylindrical surface segment of a respective first contact via structure 861, and further comprises a respective first outer sidewall contacting each first-tier electrically conductive layer 146 that overlies the respective one of the first-tier electrically conductive layers 146. Each first-type second-tier tubular dielectric spacer 822A comprises a respective second inner sidewall contacting a second cylindrical surface segment of a respective one of the first contact via structures 861, and comprises a respective second outer sidewall contacting each of the second-tier electrically conductive layers 246.

Each of the second-type first-tier pillar structures 831B and the third-type first-tier pillar structures 831C vertically extends through each first-tier electrically conductive layer 146 in the first-tier alternating stack (132, 146). Each of the second-type first-tier pillar structures 831B and the third-type first-tier pillar structures 831C may have a respective a top surface that is coplanar with a topmost surface of the first-tier alternating stack (132, 146). Each of the second-type first-tier tubular dielectric spacers 821B laterally surrounds a respective one of the second-type first-tier pillar structures 831B. Each of the third-type first-tier tubular dielectric spacers 821C laterally surrounds a respective one of the third-type first-tier pillar structures 831C. Each of the first-tier tubular dielectric spacers 821 may have the same material composition and the same lateral thickness (as measured between an inner cylindrical sidewall and an outer cylindrical sidewall).

In one embodiment, each top surface of the layer contact via structures 86 may be formed within a horizontal plane including the top surface of the contact-level dielectric layer 80. Each portion of the layer contact via structures 86 that is embedded in the contact-level dielectric layer 80 may be in direct contact with the contact-level dielectric layer 80.

Each second contact via structure 862 contacts a respective one of the second-tier electrically conductive layers 246. Each second-type second-tier tubular dielectric spacer 822B laterally surrounds and contacts a respective one of the second contact via structures 862, and contacts a top surface of a respective one of the second-tier electrically conductive layers 246. Each second-type second-tier tubular dielectric spacer 822B contacts each second-tier electrically conductive layer 246 that overlies the respective one of the second-tier electrically conductive layers 246. Each second-type first-tier pillar structure 831B underlies, is vertically spaced from and has an areal overlap in a plan view with a respective overlying second contact via structure 862.

Each first-type third-tier tubular dielectric spacer 823A comprises a respective third inner sidewall contacting a third cylindrical surface segment of a respective one of the first contact via structures 861, and comprises a third outer sidewall contacting each of the third-tier electrically conductive layers 346.

Each third-type second-tier pillar structure 832C vertically extends through the second-tier alternating stack (232, 246), has a top surface that is coplanar with a topmost surface of the second-tier alternating stack (232, 246), and has a bottom surface that contacts the top surface of a respective third-type first-tier pillar structure 831C. Each third-type second-tier tubular dielectric spacer 822C laterally surrounds a respective third-type second-tier pillar structure 832C.

All first-tier tubular dielectric spacers 821 may have the same material composition and the same lateral thickness. All second-tier tubular dielectric spacers 822 may have the same material composition and the same lateral thickness. All third-tier tubular dielectric spacers 823 may have the same material composition and the same lateral thickness.

Each first-type third-tier tubular dielectric spacer 823A may have an annular bottom surface that is in contact with an annular top surface of a respective underlying first-type second-tier tubular dielectric spacer 822A. Each first-type second-tier tubular dielectric spacer 822A may have an annular bottom surface that is contact with an annular top surface of a respective underlying first-type first-tier tubular dielectric spacer 821A. Each second-type third-tier tubular dielectric spacer 823B may have an annular bottom surface that is in contact with an annular top surface of a respective underlying second-type second-tier tubular dielectric spacer 822B. Each third-type second-tier tubular dielectric spacer 822C may have an annular bottom surface that is in contact with an annular top surface of a respective underlying third-type first-tier tubular dielectric spacer 821C.

Each of the second-type first-tier pillar structures 831B and the third-type first-tier pillar structures 831C comprises a material that is selected from a semiconductor material, a carbon-based material including carbon atoms at an atomic percentage greater than 80%, or a polymer material. Each of the third-type second-tier pillar structures 832C comprises a material that is selected from a semiconductor material, a carbon-based material including carbon atoms at an atomic percentage greater than 80%, or a polymer material.

In one embodiment, each of the second-type first-tier pillar structures 831B and the third-type first-tier pillar structures 831C may comprise a respective bottom surface that contacts a top surface of a bottommost first-tier insulating layer 132 within the first-tier alternating stack (132, 146). In one embodiment, each of the second-type first-tier pillar structures 831B may comprise a respective top surface that contacts a bottom surface of a bottommost second-tier insulating layer 232 within the second-tier alternating stack (232, 246). In one embodiment, each of the third-type first-tier pillar structures 831C may comprise a respective top surface that contacts a bottom surface of a respective one of the third-type second-tier pillar structure 832C. In one embodiment, each of the third-type second-tier pillar structures 832C may comprise a respective top surface that contacts a bottom surface of a bottommost third-tier insulating layer 332 within the third-tier alternating stack (332, 346).

In one embodiment, each of the second-type first-tier tubular dielectric spacers 821B and the third-type first-tier tubular dielectric spacers 821C may comprise a respective annular bottom surface that contacts a top surface of a bottommost first-tier insulating layer 132 within the first-tier alternating stack (132, 146). In one embodiment, each of the second-type first-tier tubular dielectric spacers 821B may comprise a respective annular top surface that contacts a bottom surface of a bottommost second-tier insulating layer 232 within the second-tier alternating stack (232, 246). In one embodiment, each of the third-type first-tier tubular dielectric spacers 821C may comprise a respective annular top surface that contacts an annular bottom surface of a respective one of the third-type second-tier tubular dielectric spacer 822C. In one embodiment, each of the third-type second-tier tubular dielectric spacers 822C may comprise a respective annular top surface that contacts a bottom surface of a bottommost third-tier insulating layer 332 within the third-tier alternating stack (332, 346).

Figure 30:
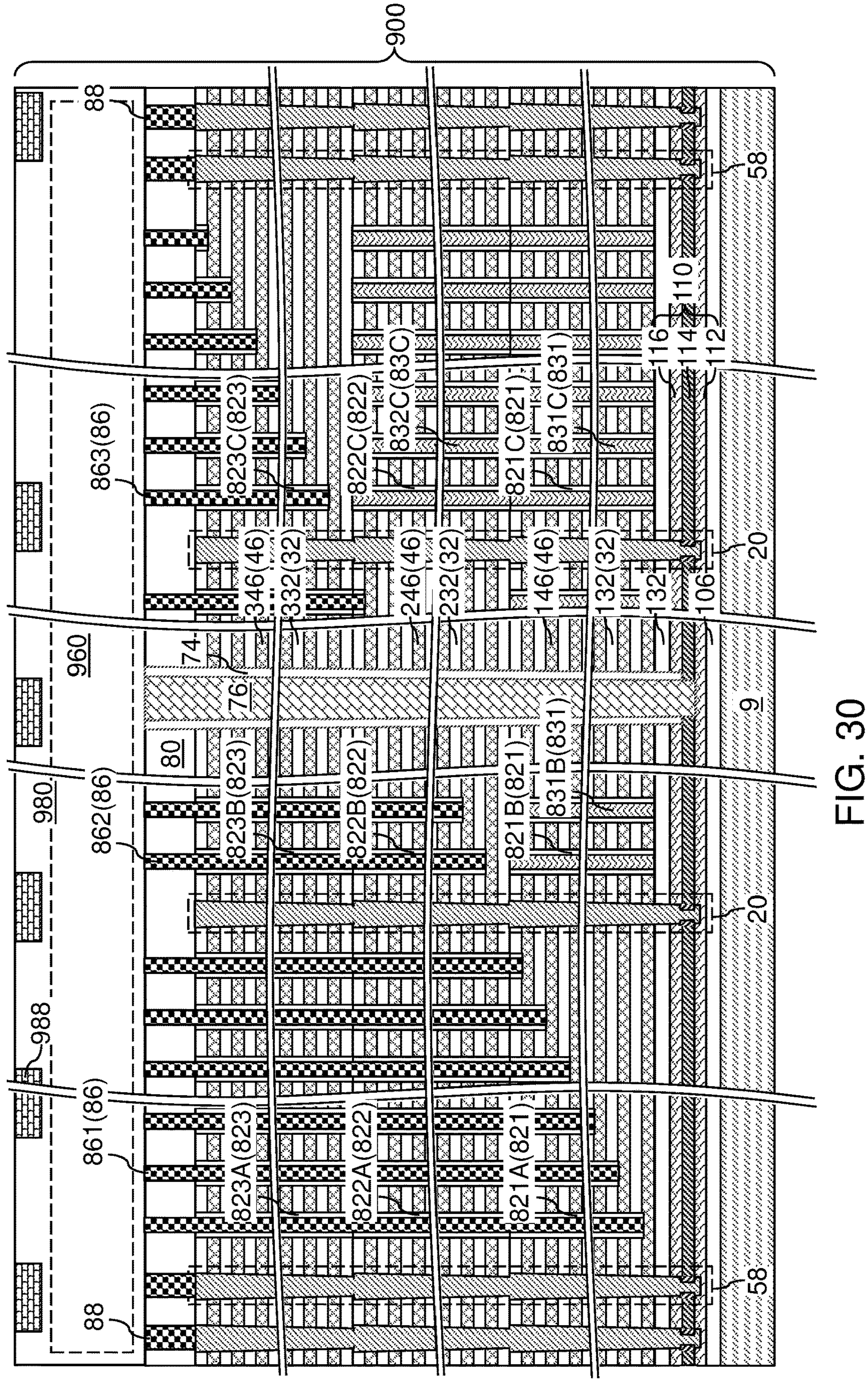
FIG. 30 is a vertical cross-sectional view of the exemplary structure after formation of memory-side dielectric material layers and memory-side metal interconnect structures according to an embodiment of the present disclosure.

Referring to FIG. 30, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

Metal bonding pads, which are herein referred to as memory-side bonding pads 988, may be formed at the topmost level of the memory-side dielectric material layers 960. The memory-side bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 is formed by the above steps.

In one embodiment, the memory die 900 may comprise: a three-dimensional memory array underlying the first dielectric material layer 110 and comprising an alternating stack of insulating layers 32 and electrically conductive layers 46, a two-dimensional array of memory openings 49 vertically extending through the alternating stack, and a two-dimensional array of memory opening fill structures 58 located in the two-dimensional array of memory openings 49 and comprising a respective vertical stack of memory elements and a respective vertical semiconductor channel 60, a two-dimensional array of drain contact via structures 88 electrically connected to a respective one of the vertical semiconductor channels 60 via respective drain regions 63; and a two-dimensional array of layer contact via structures 86 electrically connected to a respective one of the electrically conductive layers 46, a subset of which functions as word lines for the three-dimensional memory array.

Figure 31:
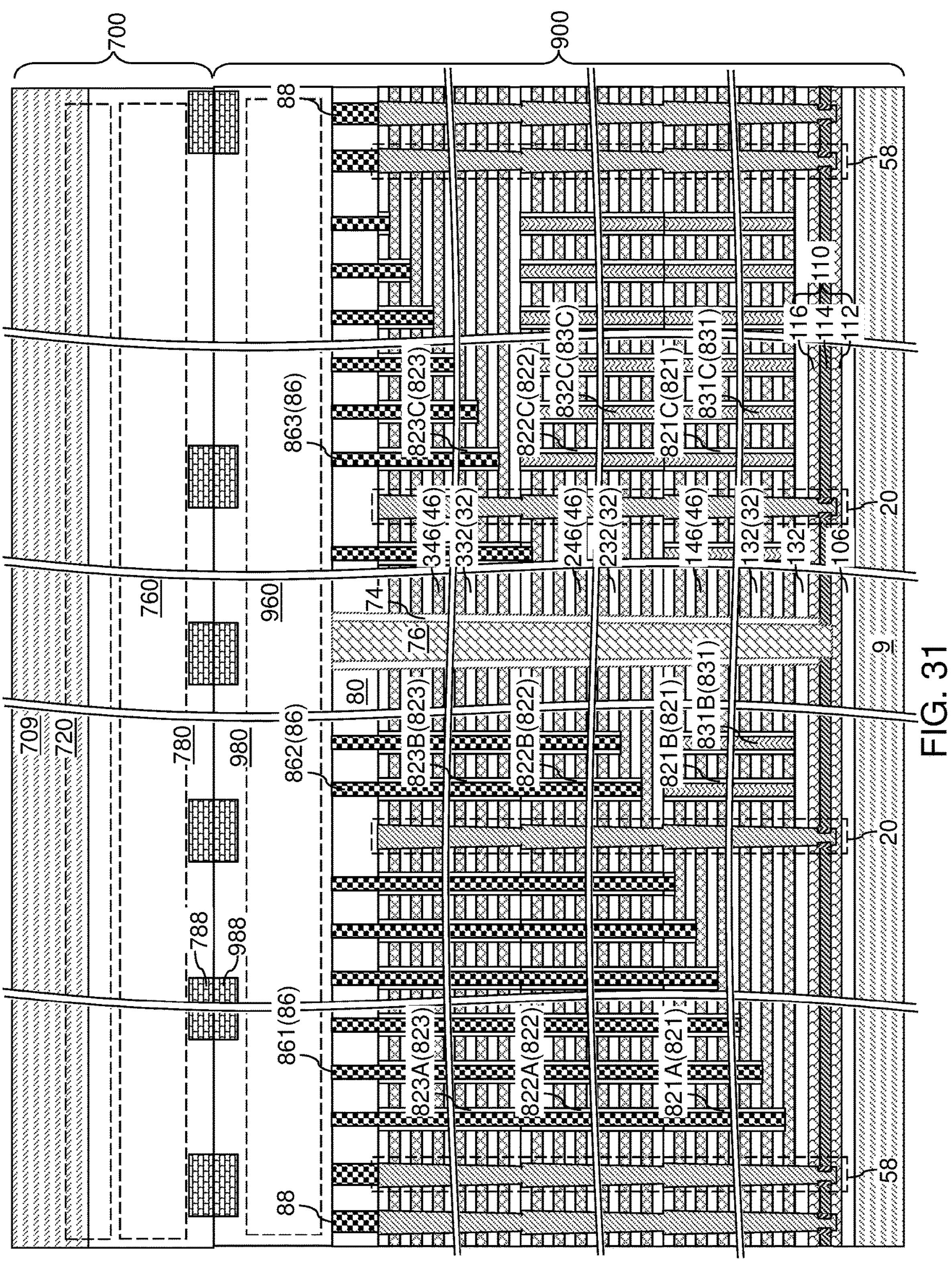
FIG. 31 is a vertical cross-sectional view of the exemplary structure after attaching a logic die to a memory die according to an embodiment of the present disclosure.

Referring to FIG. 31, a logic die 700 may be provided. In this case, a peripheral circuit 720 can be formed on a logic-side substrate 709, which can be a semiconductor substrate. The peripheral circuit 720 can be configured to control operation of the memory array within the memory die 900. Logic-side metal interconnect structures 780 embedded within logic-side dielectric material layers 760 can be formed over the logic-side substrate 709 (which may comprise a semiconductor substrate) to form the logic die 700. The logic die 700 also comprises logic-side bonding pads 788 embedded within logic-side dielectric material layers 760.

A bonded assembly can be formed by bonding the logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900. In an alternative embodiment, if the peripheral circuit 720 is formed on the substrate 9 of the memory die 900, then the logic die 700 may be omitted.

Figure 32:
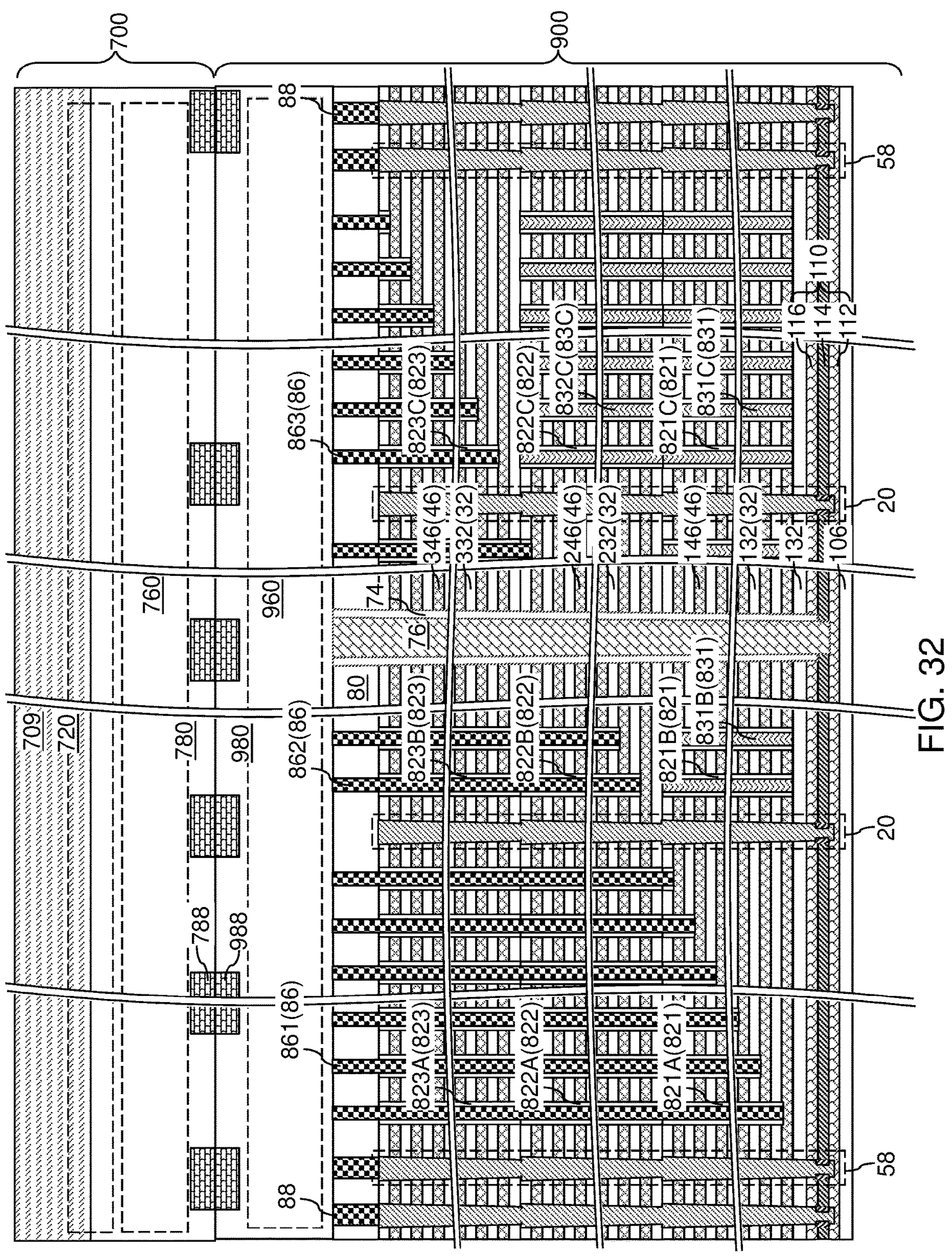
FIG. 32 is a vertical cross-sectional view of the exemplary structure after removal of a carrier substrate according to an embodiment of the present disclosure.

Referring to FIG. 32, the carrier substrate 9 can optionally be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process, such as a wet etch process, is employed to remove the carrier substrate 9, the stopper insulating layer 106 may be subsequently employed as an etch stop material layer. If the source layer 110 formation described above is omitted, then the stopper insulating layer 106 and underlying bottom portions of the memory film 50 may also be removed and a top source contact layer may be formed in contact with the exposed bottom portions of the vertical semiconductor channels 60.

Referring to all drawings and according to various embodiments of the present disclosure, a semiconductor structure is provided, which comprises: a first-tier alternating stack (132, 146) of first-tier insulating layers 132 and first-tier electrically conductive layers 146; a second-tier alternating stack (232, 246) of second-tier insulating layers 232 and second-tier electrically conductive layers 246 that overlies the first-tier alternating stack (132, 146); a memory opening 49 vertically extending through the first-tier alternating stack (132, 146) and the second-tier alternating stack (232, 246); a memory opening fill structure 58 located in the memory opening 49 and comprising a memory film 50 and a vertical semiconductor channel 60; a first contact via structure 861 contacting one of the first-tier electrically conductive layers 146; a first-tier tubular dielectric spacer 821 comprising a first inner sidewall contacting a first cylindrical surface segment of the first contact via structure 861 and comprising a first outer sidewall contacting each first-tier electrically conductive layer 146 that overlies said one of the first-tier electrically conductive layers 146; a second-tier tubular dielectric spacer 822 comprising a second inner sidewall contacting a second cylindrical surface segment of the first contact via structure 861 and comprising a second outer sidewall contacting each of the second-tier electrically conductive layers 246; a first-tier pillar structure (such as a second-type first-tier pillar structure 831B or a third-type first-tier pillar structure 831C) vertically extending through each first-tier electrically conductive layer 146 in the first-tier alternating stack (132, 146) and having a top surface that is coplanar with a topmost surface of the first-tier alternating stack (132, 146); and an additional first-tier tubular dielectric spacer 821 that laterally surrounds the first-tier pillar structure (such as a second-type first-tier pillar structure 831B or a third-type first-tier pillar structure 831C) and having a same material composition and a same lateral thickness as the first-tier tubular dielectric spacer 821.

In one embodiment, the semiconductor structure further comprises a peripheral circuit 720, wherein the first contact via structure 861 is electrically connected to the peripheral circuit 720, and the first-tier pillar structure (831B or 831C) comprises a dummy pillar which is not electrically connected to the peripheral circuit 720.

In one embodiment, the memory opening fill structure 58 has a stepped vertical cross-sectional profile including a first tapered surface that extends through the first-tier alternating stack (132, 146), a second tapered surface that extends through the second-tier alternating stack (232, 246), and a first horizontal connecting surface that connects the first tapered surface and the second tapered surface and located within a horizontal plane including the top surface of the first-tier pillar structure (such as a second-type first-tier pillar structure 831B or a third-type first-tier pillar structure 831C).

In one embodiment, the semiconductor structure comprises a contact-level dielectric layer 80 that overlies the second-tier alternating stack (232, 246). A top surface of the first contact via structure 861 is located within a horizontal plane including a top surface of the contact-level dielectric layer 80; and a portion of the first contact via structure 861 that is embedded in the contact-level dielectric layer 80 is in direct contact with the contact-level dielectric layer 80.

In one embodiment, an annular top surface of the first-tier tubular dielectric spacer 821 is located within a horizontal plane including the topmost surface of the first-tier alternating stack (132, 146); and an annular top surface of the second-tier tubular dielectric spacer 822 is located within a horizontal plane including a topmost surface of the second-tier alternating stack (232, 246). In one embodiment, an annular bottom surface of the second-tier tubular dielectric spacer 822 is in contact with the annular top surface of the first-tier tubular dielectric spacer 821.

In one embodiment, the semiconductor structure comprises: a second contact via structure 862 contacting one of the second-tier electrically conductive layers 246; and an additional second-tier tubular dielectric spacer (such as a second-type second-tier tubular dielectric spacer 822B) laterally surrounding and contacting the second contact via structure 862 and contacting each second-tier electrically conductive layer 246 that overlies said one of the second-tier electrically conductive layers 246. In one embodiment, the first-tier pillar structure (such as a second-type first-tier pillar structure 831B) underlies, is vertically spaced from, and has an areal overlap in a plan view with, the second contact via structure 862.

In one embodiment, the semiconductor structure comprises: a third-tier alternating stack (332, 236) of third-tier insulating layers 332 332 and third-tier electrically conductive layers 346 that overlies the second-tier alternating stack (232, 246), wherein the memory opening fill structure 58 and the first contact via structure 861 vertically extends through the third-tier alternating stack (332, 236); and a third-tier tubular dielectric spacer (such as a first-type third-tier tubular dielectric spacer 823A) comprising a third inner sidewall contacting a third cylindrical surface segment of the first contact via structure 861 and comprising a third outer sidewall contacting each of the third-tier electrically conductive layers 346.

In one embodiment, the semiconductor structure comprises: a second-tier pillar structure (such as a third-type second-tier pillar structure 832C) vertically extending through the second-tier alternating stack (232, 246) and having a top surface that is coplanar with a topmost surface of the second-tier alternating stack (232, 246) and having a bottom surface that contacts the top surface of the first-tier pillar structure (such as a third-type first-tier pillar structure 831C); and an additional second-tier tubular dielectric spacer (such as a third-type second-tier tubular dielectric spacer 822C) that laterally surrounds the second-tier pillar structure (such as a third-type second-tier pillar structure 832C) and having a same material composition and a same lateral thickness as the second-tier tubular dielectric spacer (such as a the first-type second-tier tubular dielectric spacer 822A). In one embodiment, an annular bottom surface of the additional second-tier tubular dielectric spacer (such as a third-type second-tier tubular dielectric spacer 822C) is in contact with an annular top surface of the additional first-tier tubular dielectric spacer (such as a third-type first-tier tubular dielectric spacer 821C).

In one embodiment, the semiconductor structure comprises a source layer 110 underlying the first-tier alternating stack (132, 146), wherein the vertical semiconductor channel 60 contacts a surface of the source layer 110. In one embodiment, the first-tier pillar structure (such as a second-type first-tier pillar structure 831B or a third-type first-tier pillar structure 831C) comprises a material that is selected from a semiconductor material, a carbon-based material including carbon atoms at an atomic percentage greater than 80%, or a polymer material.

In one embodiment, the first-tier pillar structure (such as a second-type first-tier pillar structure 831B) comprises a bottom surface that contacts a top surface of a bottommost first-tier insulating layer 132 within the first-tier alternating stack (132, 146), and comprises a top surface that contacts a bottom surface of a bottommost second-tier insulating layer 232 within the second-tier alternating stack (232, 246). In one embodiment, the first-tier tubular dielectric spacer 821 comprises an annular bottom surface that contacts a top surface of a bottommost first-tier insulating layer 132 within the first-tier alternating stack (132, 146), and comprises an annular top surface that contacts a bottom surface of a bottommost second-tier insulating layer 232 within the second-tier alternating stack (232, 246).

In one embodiment, the semiconductor structure further comprises support pillar structures 20 which extend through the first and the second alternating stacks, wherein the support pillar structures 20 have a different material composition than the first-tier pillar structure (831B or 831C).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph or in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor structure, comprising:

a first-tier alternating stack of first-tier insulating layers and first-tier electrically conductive layers;

a second-tier alternating stack of second-tier insulating layers and second-tier electrically conductive layers that overlies the first-tier alternating stack;

a memory opening vertically extending through the first-tier alternating stack and the second-tier alternating stack;

a memory opening fill structure located in the memory opening and comprising a memory film and a vertical semiconductor channel;

a first contact via structure contacting one of the first-tier electrically conductive layers;

a first-tier tubular dielectric spacer comprising a first inner sidewall contacting a first cylindrical surface segment of the first contact via structure and comprising a first outer sidewall contacting each first-tier electrically conductive layer that overlies said one of the first-tier electrically conductive layers;

a second-tier tubular dielectric spacer comprising a second inner sidewall contacting a second cylindrical surface segment of the first contact via structure and comprising a second outer sidewall contacting each of the second-tier electrically conductive layers;

a first-tier pillar structure vertically extending through each first-tier electrically conductive layer in the first-tier alternating stack and having a top surface that is coplanar with a topmost surface of the first-tier alternating stack; and an additional first-tier tubular dielectric spacer that laterally surrounds the first-tier pillar structure and having a same material composition and a same lateral thickness as the first-tier tubular dielectric spacer.

2. The semiconductor structure of claim 1, further comprising a peripheral circuit, wherein the first contact via structure is electrically connected to the peripheral circuit, and the first-tier pillar structure comprises a dummy pillar which is not electrically connected to the peripheral circuit.

3. The semiconductor structure of claim 1, further comprising a contact-level dielectric layer that overlies the second-tier alternating stack, wherein:

a top surface of the first contact via structure is located within a horizontal plane including a top surface of the contact-level dielectric layer; and a portion of the first contact via structure that is embedded in the contact-level dielectric layer is in direct contact with the contact-level dielectric layer.

4. The semiconductor structure of claim 1, wherein:

an annular top surface of the first-tier tubular dielectric spacer is located within a horizontal plane including the topmost surface of the first-tier alternating stack; and an annular top surface of the second-tier tubular dielectric spacer is located within a horizontal plane including a topmost surface of the second-tier alternating stack.

5. The semiconductor structure of claim 4, wherein an annular bottom surface of the second-tier tubular dielectric spacer is in contact with the annular top surface of the first-tier tubular dielectric spacer.

6. The semiconductor structure of claim 1, further comprising:

a second contact via structure contacting one of the second-tier electrically conductive layers; and an additional second-tier tubular dielectric spacer laterally surrounding and contacting the second contact via structure and contacting each second-tier electrically conductive layer that overlies said one of the second-tier electrically conductive layers.

7. The semiconductor structure of claim 6, wherein the first-tier pillar structure underlies, is vertically spaced from and has an areal overlap in a plan view with the second contact via structure.

8. The semiconductor structure of claim 1, further comprising:

a third-tier alternating stack of third-tier insulating layers and third-tier electrically conductive layers that overlies the second-tier alternating stack, wherein the memory opening fill structure and the first contact via structure vertically extends through the third-tier alternating stack; and a third-tier tubular dielectric spacer comprising a third inner sidewall contacting a third cylindrical surface segment of the first contact via structure and comprising a third outer sidewall contacting each of the third-tier electrically conductive layers.

9. The semiconductor structure of claim 8, further comprising:

a second-tier pillar structure vertically extending through the second-tier alternating stack and having a top surface that is coplanar with a topmost surface of the second-tier alternating stack and having a bottom surface that contacts the top surface of the first-tier pillar structure; and an additional second-tier tubular dielectric spacer that laterally surrounds the second-tier pillar structure and having a same material composition and a same lateral thickness as the second-tier tubular dielectric spacer.

10. The semiconductor structure of claim 9, wherein an annular bottom surface of the additional second-tier tubular dielectric spacer is in contact with an annular top surface of the additional first-tier tubular dielectric spacer.

11. The semiconductor structure of claim 1, wherein the memory opening fill structure has a stepped vertical cross-sectional profile including a first tapered surface that extends through the first-tier alternating stack, a second tapered surface that extends through the second-tier alternating stack, and a first horizontal connecting surface that connects the first tapered surface and the second tapered surface and located within a horizontal plane including the top surface of the first-tier pillar structure.

12. The semiconductor structure of claim 1, wherein the first-tier pillar structure comprises a material that is selected from a semiconductor material, a carbon-based material including carbon atoms at an atomic percentage greater than 80%, or a polymer material.

13. The semiconductor structure of claim 1, wherein:

the first-tier pillar structure comprises a bottom surface that contacts a top surface of a bottommost first-tier insulating layer within the first-tier alternating stack, and comprises a top surface that contacts a bottom surface of a bottommost second-tier insulating layer within the second-tier alternating stack; and the first-tier tubular dielectric spacer comprises an annular bottom surface that contacts a top surface of a bottommost first-tier insulating layer within the first-tier alternating stack, and comprises an annular top surface that contacts a bottom surface of a bottommost second-tier insulating layer within the second-tier alternating stack.

14. The semiconductor structure of claim 1, further comprising support pillar structures which extend through the first and the second alternating stacks, wherein the support pillar structures have a different material composition than the first-tier pillar structure.

* * * * *